(12) United States Patent
Fukumoto et al.

(10) Patent No.: US 7,221,961 B1
(45) Date of Patent: May 22, 2007

(54) WIRELESS TELECOMMUNICATIONS UNIT ATTACHABLE TO AND DETACHABLE FROM AN EXTERNAL UNIT

(75) Inventors: Masaaki Fukumoto, Yokohama (JP); Shoichiro Ishigaki, Tokyo (JP); Toshiaki Sugimura, Yokohama (JP); Hirotaka Nakano, Yokosuka (JP)

(73) Assignee: NTT Docomo, Inc., Tokyo (JP)

( * ) Notice: Subject to any disclaimer, the term of this patent is extended or adjusted under 35 U.S.C. 154(b) by 839 days.

(21) Appl. No.: 09/744,426

(22) PCT Filed: Jun. 14, 2000

(86) PCT No.: PCT/JP00/03838

§ 371 (c)(1),
(2), (4) Date: Jan. 22, 2001

(87) PCT Pub. No.: WO00/78082

PCT Pub. Date: Dec. 21, 2000

(30) Foreign Application Priority Data

| Jun. 14, 1999 | (JP) | ................................ 11/167488 |
| Jul. 12, 1999 | (JP) | ................................ 11/198185 |
| Feb. 25, 2000 | (JP) | ................................ 2000/049950 |
| Feb. 29, 2000 | (JP) | ................................ 2000/053582 |
| Mar. 3, 2000 | (JP) | ................................ 2000/059369 |
| Mar. 13, 2000 | (JP) | ................................ 2000/068851 |
| Apr. 12, 2000 | (JP) | ................................ 2000/111252 |
| May 23, 2000 | (JP) | ................................ 2000/151879 |

(51) Int. Cl.
*H04B 1/38* (2006.01)
*H04M 1/00* (2006.01)

(52) U.S. Cl. .................... 455/557; 455/558; 455/552.1; 455/41.2; 455/418; 455/420; 455/90.1; 455/90.2; 710/8; 710/12

(58) Field of Classification Search ........ 455/418–420, 455/550.1, 552.1, 88, 556.1–556.2, 557–558, 455/90.1–90.3, 41.1–41.2; 710/8–23
See application file for complete search history.

(56) References Cited

U.S. PATENT DOCUMENTS

| 5,343,530 | A | | 8/1994 | Viricel |
| 5,625,673 | A | | 4/1997 | Grewe et al. |
| 5,689,654 | A | * | 11/1997 | Kikinis et al. ............... 710/303 |
| 5,724,285 | A | | 3/1998 | Shinohara |
| 5,848,298 | A | | 12/1998 | Steere, Jr. et al. |
| 5,870,615 | A | | 2/1999 | Bar-On et al. |
| 5,907,540 | A | | 5/1999 | Hayashi |
| 5,924,044 | A | | 7/1999 | Vannatta et al. |
| 5,970,405 | A | * | 10/1999 | Kaplan et al. ............... 455/410 |
| 6,131,040 | A | | 10/2000 | Knuutila et al. |
| 6,268,879 | B1 | | 7/2001 | Sato |
| 6,278,706 | B1 | * | 8/2001 | Gibbs et al. ................. 370/352 |
| 6,427,078 | B1 | * | 7/2002 | Wilska et al. ............. 455/550.1 |
| 6,725,061 | B1 | * | 4/2004 | Hutchison et al. .......... 455/557 |
| 6,845,249 | B1 | * | 1/2005 | Miller et al. ............. 455/556.1 |
| 2004/0224719 | A1 | | 11/2004 | Nounin et al. |

FOREIGN PATENT DOCUMENTS

| EP | 0 488 720 A1 | 6/1992 |
| EP | 0 599 244 A2 | 6/1994 |
| EP | 0 783 236 A1 | 7/1997 |
| EP | 0 813 325 A2 | 12/1997 |
| EP | 833294 A1 | 4/1998 |
| EP | 864996 A2 | 9/1998 |
| EP | 869420 A2 | 10/1998 |
| EP | 886409 A2 | 12/1998 |
| EP | 0 889 620 A2 | 1/1999 |
| EP | 0 918 399 A1 | 5/1999 |
| JP | 63-53099 | 3/1988 |
| JP | 63-163589 | 7/1988 |
| JP | 63-135471 | 9/1988 |
| JP | 63-280693 | 11/1988 |
| JP | S64-038295 | 2/1989 |
| JP | 2-5195 | 1/1990 |
| JP | 2-118790 | 5/1990 |
| JP | 2-155319 | 6/1990 |
| JP | H03-007434 A | 1/1991 |
| JP | 4-315326 | 11/1992 |
| JP | 4-347955 A | 12/1992 |

| | | |
|---|---|---|
| JP | H05-136722 A | 6/1993 |
| JP | 5-183502 | 7/1993 |
| JP | H5-217033 | 8/1993 |
| JP | 5-346894 A | 12/1993 |
| JP | 5-347574 | 12/1993 |
| JP | H06-097881 A | 4/1994 |
| JP | H07-143550 A | 6/1995 |
| JP | H07-154323 A | 6/1995 |
| JP | H07-154496 A | 6/1995 |
| JP | H7-160582 | 6/1995 |
| JP | H07-200756 | 8/1995 |
| JP | H07-245581 A | 9/1995 |
| JP | H07-249399 A | 9/1995 |
| JP | H08-097821 A | 4/1996 |
| JP | H08-129530 A | 5/1996 |
| JP | H08-149035 A | 6/1996 |
| JP | H08-505507 A | 6/1996 |
| JP | H08-172655 A | 7/1996 |
| JP | H08-195710 A | 7/1996 |
| JP | H08-265856 A | 10/1996 |
| JP | H08-278835 A | 10/1996 |
| JP | 9-84101 A | 3/1997 |
| JP | H9-073416 | 3/1997 |
| JP | 9-139972 | 5/1997 |
| JP | H9-114597 | 5/1997 |
| JP | 9-147072 | 6/1997 |
| JP | 9-171547 | 6/1997 |
| JP | H09-191486 A | 7/1997 |
| JP | H09-200841 A | 7/1997 |
| JP | H09-205394 A | 8/1997 |
| JP | H9-237228 | 9/1997 |
| JP | H9-274584 | 10/1997 |
| JP | H09-275433 | 10/1997 |
| JP | 9-288696 | 11/1997 |
| JP | 9-307542 | 11/1997 |
| JP | 10-49583 | 2/1998 |
| JP | H10-136116 A | 5/1998 |
| JP | 10-173799 | 6/1998 |
| JP | H10-173802 A | 6/1998 |
| JP | H10-200455 A | 7/1998 |
| JP | H10-200519 A | 7/1998 |
| JP | H10-207576 A | 8/1998 |
| JP | H10-210165 A | 8/1998 |
| JP | H10-243441 A | 9/1998 |
| JP | H10-243463 A | 9/1998 |
| JP | H10-257557 A | 9/1998 |
| JP | 10-283066 | 10/1998 |
| JP | 10-303880 | 11/1998 |
| JP | 10-312459 | 11/1998 |
| JP | H10-512378 A | 11/1998 |
| JP | 11-25246 | 1/1999 |
| JP | H11-018158 A | 1/1999 |
| JP | H11-027426 A | 1/1999 |
| JP | 11-65725 | 3/1999 |
| JP | 11-68730 | 3/1999 |
| JP | H11-075266 A | 3/1999 |
| JP | 11-134302 | 5/1999 |
| JP | H11-136653 A | 5/1999 |
| JP | 11-163984 A | 6/1999 |
| JP | 11-184992 | 7/1999 |
| JP | 11-195102 | 7/1999 |
| JP | 11-205376 | 7/1999 |
| JP | 11-265432 | 9/1999 |
| JP | 11-266319 | 9/1999 |
| JP | 11-312225 | 11/1999 |
| JP | H11-308653 A | 11/1999 |
| JP | 2000-36027 | 2/2000 |
| JP | 2000-076336 A | 3/2000 |
| WO | WO 95/08222 | 3/1995 |
| WO | WO 95/12251 A | 5/1995 |
| WO | WO 96/21900 | 7/1996 |
| WO | WO 98/12674 A2 | 3/1998 |
| WO | WO 98/15106 A2 | 4/1998 |

OTHER PUBLICATIONS

English Translation of Japanese Patent Application Laid-Open Publication No. H5-346894 (Dec. 27, 1993).

Office Action in European Patent Application No. 00 939 048.5, issued Sep. 25, 2006, 5 pages.

Jaap Haartsen, "Bluetooth—The universal radio interface for *ad hoc*, wireless connectivity," Ericsson Review, 1998, vol. 75, No. 3, pp. 110-117.

* cited by examiner

*Primary Examiner*—Matthew D. Anderson
*Assistant Examiner*—Tuan Tran
(74) *Attorney, Agent, or Firm*—Brinks Hofer Gilson & Lione

(57) ABSTRACT

A wireless telecommunications unit is attachable to and detachable from an external unit such as a personal computer, and has a wireless telecommunications apparatus, a microcontroller, and a memory mechanism. The wireless telecommunications apparatus has an identification number for wireless telecommunications, and is for carrying out wireless telecommunications with the outside. The microcontroller is for controlling the wireless telecommunications apparatus and the memory mechanism, it has control functions for the external unit to carry out telecommunications with the outside in accordance with the wireless telecommunications apparatus, to use the memory mechanism as a file system of a designated operating system, when the wireless telecommunications unit is connected to the external unit, and a control function for the wireless telecommunications apparatus to carry out telecommunications using the memory mechanism in accordance with instructions from the external unit or generated in the microcontroller.

24 Claims, 49 Drawing Sheets

FIG. 24

| No. | Date | Time | Type | From | Subject |
|-----|------|------|------|------|---------|
| (a) 01 | 1999/08/03 | 12:00 | T | FUKUMOTO ○○ (0412-34-5678) | YOU HAVE VOICE MAIL |
| 02 | 1999/08/03 | 12:01 | T | (0213-45-6789) | YOU HAVE STILL IMAGE MAIL |
| 03 | 1999/08/03 | 12:02 | T | NO NOTIFICATION | YOU HAVE STILL IMAGE MAIL |
| 04 | 1999/08/03 | 12:03 | T | OUTSIDE OF DISPLAY AREA : DISPLAY OF TEXT MAIL | YOU HAVE MOVIE MAIL |
| (b) 05 | 1999/08/04 | 13:00 | T | FUKUMOTO ○○ : DISPLAY OF TEXT MAIL | HELLO |
| (c) 06 | 1999/08/04 | 13:01 | V | FUKUMOTO ○○ (0412-34-5678) : DISPLAY OF VOICE MAIL | VOICE MAIL |

FIG. 25

(a) 06  1999/08/04  13:01  S   FUKUMOTO ○○ (0412-34-5678)   STILL IMAGE MAIL
                                :STILL MAIL DISPLAY (b) 06  1999/08/04  13:01  M   FUKUMOTO ○○ (0412-34-5678)   MOVIE MAIL
                                :MOVIE MAIL DISPLAY (c) 07  1999/08/05  14:01  Tv  FUKUMOTO ○○ (0412-34-5678)   HELLO
                                :VOICE-TEXT CONVERSION COMPLETED 08  1999/08/05  14:02  Vt  FUKUMOTO ○○ (0412-34-5678)   HELLO
                                :TEXT-VOICE CONVERSION COMPLETED

| KEY (SESSION KEY) | SECRET KEYS |
|---|---|
| POkey1 | PSkey1 |
| POkey2 | PSkey2 |
| ⋮ | ⋮ |
| POkeyn | PSkeyn |

(b)

| KEY (SESSION KEY) | SECRET KEYS |
|---|---|
| SOkey1 | SSkey1 |
| SOkey2 | SSkey2 |
| ⋮ | ⋮ |
| SOkeyn | SSkeyn |

WIRELESS TELECOMMUNICATIONS UNIT ATTACHABLE TO AND DETACHABLE FROM AN EXTERNAL UNIT

FIELD OF THE INVENTION

The present invention relates to a wireless telecommunications unit that is attachable to and detachable from various external units such as personal computers and the bodies of mobile terminals.

BACKGROUND ART

In recent years, with the profusion of wireless telephony systems such as cellular phones and the "Personal Handyphone System" (referred to below as "PHS"), mobile data terminals have been developed that are smaller in size and lighter in weight than data terminals such as conventional notebook personal computers. Various types of such mobile data terminals have been developed, and are often used as what are known as personal digital assistants (PDA).

Given this state of affairs, information providers (IP) are offering a variety of services, such as various online services, viewing of electronic mail, Internet access, and the like, in addition to ordinary voice and fax/data communications. Along with this diversity of telecommunications services, various types of integrated composite equipment are being offered to accommodate the many different types of telecommunications services available.

Incidentally, the operations of vote communication and electronic mail, or the accessing of image with a Web browser, can vary widely in style, depending on the type of telecommunications service used. However, it is extremely difficult to come up with an integrated composite system that enables all operating styles to accommodate all telecommunications services. Accordingly, integrated composite equipment must be configured such that the operating style favors one telecommunications service over another. However, integrated composite equipment that favors one particular operating style will necessarily exhibit poor operability when used with another style. On the other hand, it is also conceivable that a user might have a plurality of equipment that will be suited to the various operating styles. However, since conventional wireless telecommunications devices, foremost among them being cellular phones and PHS, are provided with a telephone number (identification number for wireless communication) for each piece of equipment, that telephone number becomes fixed for each operating style.

Accordingly, in Japanese Patent Application Laid-Open Publication No. Heisei 10-173799, Japanese Patent Application Laid-Open Publication No. Heisei 11-65725, and Japanese Patent Application Laid-Open Publication No. Heisei 5-347574 is disclosed technologies for rendering wireless communications devices containing a telephone number (ID) attachable to and detachable from mobile terminals.

However, the devices disclosed in these patent gazettes are either such that the part with telecommunications capability basically operating as a wide area wireless modem is attachable to and detachable from the main body, or functions as a pager, so that it only functions as a wireless device of a connected terminal. Therefore, when, for example, a wireless device connected to a terminal uses another terminal to access and process mail, data must be sent and received using a cable between the two terminals, and it was substantially difficult to have the various types of data commonly shared among a plurality of pieces of equipment.

DISCLOSURE OF THE INVENTION

The present invention was designed to solve such problems, and has as its object to provide a wireless telecommunications unit that easily makes data such as mail logs and telephone directories mutually accessible among a plurality of pieces of equipment, in the form of a general-use file, as well as to enhance operability through selectability of operated equipment according to the use, while maintaining a single identification number (ID).

In order to achieve these objects, the present invention provides a wireless telecommunications unit possessing a wireless telecommunications means for wireless telecommunication with the outside using an identification number, a memory means, and a microcontroller to control said wireless telecommunications means and said memory means, said microcontroller being equipped with a means for performing a control so that said external unit implements wireless telecommunication with the outside using said wireless telecommunications means, when said microcontroller is connected to an external unit, and a means for performing a control so that said external unit to uses said memory means as a file system of a specified operating system, and a means for performing a control so that said wireless telecommunications means carries out telecommunications using said memory means in accordance with instructions from said external unit or said microcontroller. This is the basic embodiment of the wireless telecommunications unit relating to the present invention.

Here, said microcontroller can also be provided with a processing means for executing data processing, utilizing data recorded in said memory means, and a delegation request means that requests at least a partial delegation of said data processing to the specified operating system of said external unit connected to said microcontroller. This is the second embodiment of the wireless telecommunications unit relating to the present invention.

Furthermore, a received data replay control means can also be provided to control the data receiving operation and the replay operation in response to the type of received data and the status of connection with said external unit. This is the third embodiment of the wireless telecommunications unit relating to the present invention.

Furthermore, a short distance wireless telecommunications means can also be provided to implement short distance wireless intercommunication with other wireless telecommunications units, and a relay control device can also be provided to control the relay of data intercommunication with other wireless telecommunications units and remote stations on the wide area telecommunications network side.

Furthermore, said memory device can be provided with a writable and readable general-use memory unit in ordinary file access mode from said external unit side, and a writable write-only area in said ordinary file access mode from said external unit side, and a registration area containing registered data that is the basis for identification of the user and which is inaccessible from said external unit side, and said microcontroller can be provided with an authentication control means so that when a user's input data is written to said write-only area from said external control unit side, said input data and said registered data undergo authentication processing to determine whether or not they satisfy the predetermined relationship, and only in cases where they are determined to satisfy the predetermined relationship, is the status of the device such that access is allowed to said general-use memory unit from said external unit side. This is the fifth embodiment of the wireless telecommunications unit relating to the present invention.

Furthermore, said cradle part can be provided with a receiver that the user holds and a biodata detection means that detects the user's biological data when the user holds the receiver, and an authentication processing means for verifying whether or not a person is a specified user on the basis of biological data detected by said biodata detection means. This is the sixth embodiment of the wireless telecommunications unit relating to the present invention.

Furthermore, said memory means can be provided with a memory area for recording the identification numbers of servers connected to one or more telecommunications networks not including the Internet, and a channel connection means for establishing channels connecting a wireless telecommunications unit and said server via one or more telecommunications networks not including the Internet, in accordance with said wireless telecommunications means, by using said identification number in said microcontroller, and a control means for transmitting data that must be kept confidential, using said channels. This is the seventh embodiment of the wireless telecommunications unit relating to the present invention.

Furthermore, this invention provides the following as a method of wireless telecommunication suitable for wireless telecommunications units of the third embodiment above. That is to say, a wireless telecommunications method characterized in that when data is received, and an external unit capable of replaying the received data is not connected, a wireless telecommunications unit transmits a channel support request signal that requests that a wireless telecommunications channel be supported for a specified time period to the telecommunications network, and after the channel support request signal is received from said wireless telecommunications unit, channel control, which supports said wireless telecommunications channel, is executed for a specified period of time, and said wireless telecommunications unit carries out automatic reception for the specified period of time, in cases where an external unit is connected that has the function of replaying said received data, and said received data is received from said telecommunications network side and supplied to said external unit.

Furthermore, this invention provides the following as a method of wireless telecommunication suitable for wireless telecommunications units of the fourth embodiment above. That is to say, a wireless telecommunications method in a wireless telecommunications system provided with a plurality of wireless telecommunications terminals, said plurality of wireless telecommunications terminals being provided with a short distance wireless telecommunications means to carry out short distance telecommunications with each of the other wireless telecommunications terminals, and at least some of the wireless telecommunications terminals in said plurality of wireless telecommunications terminals being provided with said short distance wireless telecommunications means, as well as a wide area wireless telecommunications means for carrying out telecommunications with a remote station via a wide area telecommunications network that includes the wireless territory, said method characterized in that the wireless telecommunications terminal provided with both said short distance wireless telecommunications means and said wide area wireless telecommunications means carries out relay intercommunication with another wireless telecommunications terminal and a remote station connected to said wide area telecommunications network using said distance wireless telecommunications means and said wide area wireless telecommunications means.

Another embodiment of this wireless telecommunications method is a wireless telecommunications method in a wireless telecommunications system provided with a plurality of wireless telecommunications terminals, said plurality of telecommunications terminals being provided with a short distance wireless telecommunications means to carry out short distance wireless telecommunications with each of the other wireless telecommunications terminals, and at least some of the wireless telecommunications terminals in said plurality wireless telecommunications terminals are provided with said short distance wireless telecommunications means, as well as a wide area wireless telecommunications means for carrying out telecommunications with a remote station via a wide area telecommunications network that includes the wireless territory, said method characterized in that the wireless telecommunications terminals provided with both said short distance wireless telecommunications means and said wide area wireless telecommunications means communicates with remote station connected to said wide area wireless telecommunications network using said wide area wireless telecommunications means and request a portion of the relay of said telecommunications with respect to other wireless terminals provided with both said short distance wireless telecommunications means and said wide area telecommunications means using said short distance wireless telecommunications means, along with telecommunications with said remote stations connected to said wide area telecommunications network, using said wide area telecommunications means, and the other wireless telecommunications terminal that is the destination of this request carries out a portion of the relay of telecommunications with the wireless telecommunications terminal that is the source, and said remote station, using the short distance wireless telecommunications means and the wide area telecommunications means.

Furthermore, yet another embodiment is a wireless telecommunications method in a wireless telecommunications system provided with a plurality of wireless telecommunications terminals, said plurality of telecommunications terminals being provided with a short distance wireless telecommunications means to carry out short distance wireless telecommunications with each of the other wireless telecommunications terminals, and at least some of the wireless telecommunications terminals in said plurality wireless telecommunications terminals are provided with said short distance wireless telecommunications means, as well as a wide area wireless telecommunications means for carrying out telecommunications with a remote station via a wide area telecommunications network that includes the wireless territory, said method characterized in that a wireless telecommunications terminal provided with both said short distance wireless telecommunications means and said wide area wireless telecommunications means requests telecommunications with a remote station connected to said wide area telecommunications network, with respect to another wireless telecommunications terminal provided with both said short distance wireless telecommunications means and said wide area wireless telecommunications means, by using said short distance wireless telecommunications means, and this other wireless telecommunications terminal which is the destination of the request, carries out telecommunications with said remote station by using the wide area wireless telecommunications means.

Yet another embodiment is a wireless telecommunications method in a wireless telecommunications system provided with a plurality of wireless telecommunications terminals, said plurality of telecommunications terminals being provided with a short distance wireless telecommunications means to carry out short distance wireless telecommunications with each of the other wireless telecommunications terminals, and at least some of the wireless telecommunications terminals in said plurality wireless telecommunications terminals are provided with said short distance wireless telecommunications means, as well as a wide area wireless telecommunications means for carrying out telecommunications with a remote station via a wide area telecommunications network that includes the wireless territory, said method characterized in that a wireless telecommunications terminal provided with both said short distance wireless telecommunications means and said wide area wireless telecommunications means requests relay with a remote station connected to said wide area telecommunications network, with respect to another wireless telecommunications terminal provided with both said short distance wireless telecommunications means and said wide area wireless telecommunications means, by using said short distance wireless telecommunications means, and this other wireless telecommunications terminal which is the destination of the request, carries out intercommunication with said wireless telecommunications terminal which is the source of the request and said remote station, by using the wide area wireless telecommunications means and the short distance wireless telecommunications means.

Furthermore, this invention provides the following as a method of wireless telecommunications suitable for wireless telecommunications units of the seventh embodiment above. That is to say, a telecommunications system characterized in being provided with a process whereby a telecommunications terminal carries out the communication of data that requires secrecy, between servers via one or more telecommunications networks that do not include the Internet, using a first telecommunications means, and a process whereby said telecommunications terminal carries out the communication of data that does not require secrecy, between servers via one or more telecommunications networks that include the Internet, using a second telecommunications means separate from the first telecommunications means.

Furthermore, this invention provides the following as a method of wireless telecommunications suitable for wireless telecommunications units of the seventh embodiment above. That is to say, a telecommunications system characterized in being provided with a telecommunications terminal and a server, said telecommunications terminal provided with a first and second terminal side telecommunications means, said server provided with a first and second server side telecommunications means, and a first terminal side telecommunications means of said telecommunications terminal and a first server side telecommunications means of said server carry out the communication of data that require secrecy, via one or more telecommunications networks that do not include the Internet, a second terminal side telecommunications means of said telecommunications terminal and a second server side telecommunications means of said server carries out the communication of data that does not require secrecy, via one or more telecommunications networks that include the Internet Furthermore, this invention provides a battery unit suitable for the wireless telecommunications unit already discussed. That is to say, a battery unit characterized in being provided with a battery that provides power to a wireless telecommunications unit and a main body containing said battery and capable of being attached to said wireless telecommunications unit and to said external unit, said main body being constructed such that when mounted in both said wireless telecommunications unit and said external unit, said wireless telecommunications unit and said external unit are connected.

Furthermore, another embodiment provides a battery unit characterized in being provided with a battery that supplies power to a wireless telecommunications unit, a main body containing said battery and capable of being mounted to said wireless telecommunications unit and an external unit, and a PC card-type microcontroller for data exchange between said external unit, wherein said microcontroller executes the control of said wireless telecommunications unit for said external unit, and operates as a multifunction PC card or a PC card with specified operating mode in cases where said external unit and said wireless telecommunications unit are attached.

Moreover, another embodiment provides a card adapter-type battery unit characterized in being provided with an adapter main body with a card-type module that is fixed, said adapter main body capable of inserted into the card slot of the external unit together with said card-type module, a battery contained within said adapter unit, and a card power supply means for supplying power from said battery to said card-type module.

In addition, this invention provides a charging device suitable for such a battery unit, said charging device characterized in being provided with a battery charging means for the battery unit and a housing for holding said charging device, and when said housing contains both said battery unit and an external unit, a pathway is formed for transmitting data between said battery unit and said external unit.

BRIEF DESCRIPTION OF THE DRAWING

FIG. 24 is a diagram illustrating a screen display executed in said embodiment.

FIG. 25 is a diagram illustrating a screen display executed in said embodiment.

FIG. 50 is a diagram illustrating the memory content of an external unit and a server in said telecommunications system.

BEST MODE FOR CARRYING OUT THE INVENTION

A. The First Embodiment

A-1 Wireless Telecommunications Unit Relating to this Embodiment

Figure 1:
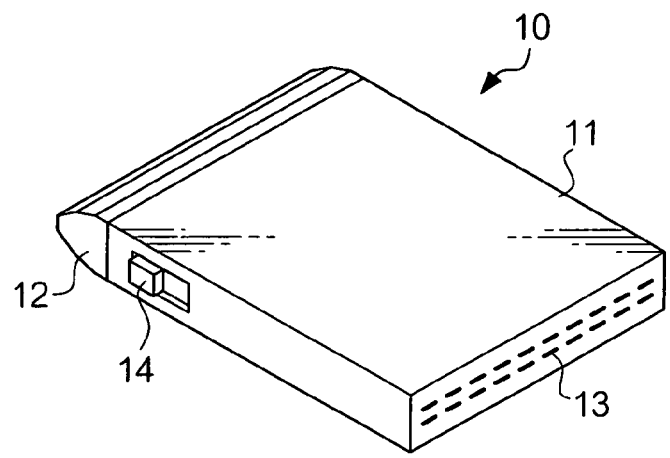
FIG. 1 is a drawing illustrating the external appearance of a wireless telecommunications unit that is the first embodiment of this invention.

First, FIG. 1 is an oblique view illustrating the external appearance of a wireless telecommunications unit 10 relating to the first embodiment of the present invention. As shown in the figure, the wireless telecommunications unit 10 is provided with an almost rectangular parallelepiped-shaped housing 11, an antenna 12 and a connector 13 provided to the housing 11, and a mode selection switch 14 provided on the side of the housing 11.

The wireless telecommunications unit 10 can be used by attaching it to an external unit. The external connector 13 is a connector for attaching the wireless telecommunications unit 10 to an external unit. An external unit is able to perform the processing of wireless telecommunications jointly with the wireless telecommunications unit 10 and the reading/writing of memory data in the wireless telecommunications unit. The external unit can be can be the main unit (terminal unit) of a mobile terminal. Or, the external unit can also be the wireless telecommunications unit 10 and a variety of external data equipment, including non-mobile stations capable of sending and receiving data.

A mobile terminal can, for example, be a terminal as described below.

a. A mobile phone or Personal Handy-phone System PHS) that can be connected to an ordinary telephone line network via wireless telecommunications.
b. A mobile telecommunications terminal capable of wide area or local wireless transmission and reception, or other mobile telecommunications terminals.
c. A mobile terminal without telecommunications functions but which is capable of data input or output or both input and output by connecting with the wireless telecommunications unit 10.

Furthermore, the main unit of a mobile terminal is a functional module formed from a mobile terminal by connecting with the wireless telecommunications unit 10. And is a part that is able to perform the processing of wireless telecommunications jointly with the wireless telecommunications unit 10 and the reading/writing of memory data in the wireless telecommunications unit. This main unit is such that the wireless telecommunications unit 10 contains other functional modules. It should be noted that detailed examples of mobile terminals and external data equipment are discussed below.

The antenna 12 can, for example, be a PHS antenna. This antenna 12 is provided in the front end of the housing 11.

The external connector 13 can be a general-use connector such as the Compact Flash Type II. This external connector 13 forms an external interface for sending and receiving data between external units such as the above-mentioned mobile terminals and external data equipment. It should be noted that the external interface of the wireless telecommunications unit 10 is of course not limited to the Compact Flash Type II, and it can be one based on the PC Card Standard. The PC Card Standard is a standard established jointly by the Japan Electronics Industry Development Association (JEIDA) and the Personal Computer Memory Card International Association (PCMCIA) in the United States. According to this PC Card Standard, the thickness of the cards differs there being Type I, Type II, Type III, Type IV, and the like. The Compact Flash Type connectors are considerably smaller than connectors for the PC Card Standard, and Type II is 42.8 mm length, 36.4 mm in width, and 5.0 mm thick. The device can be made smaller by using this Type II connector as the external connector 13.

Incidentally, analog voice cannot be transmitted in the case of a general-use Compact Flash or PC Card interface.

Therefore, when transmitting voice signals between the wireless telecommunications unit 10 and external units, once the voice signals are encoded on the transmission side, the encoded voice signals are transmitted from the wireless telecommunications unit 10 to external units, or from external units to wireless telecommunications units, via Compact Flash and PC Card Standard interfaces. After that, the voice signals can be obtained by decoding the encoded voice signals on the receiving side. In this case, the encoding method can be PCM or ADPCM (Adaptive Differential Pulse Code Modulation) used in standard voice modems, or GSM or PDC, or various systems used mobile phones such as PHS. Moreover, the encoding and decoding process can be simplified by having the encoding method be the same as the encoding method of the wireless part of the wireless telecommunications unit 10 (e.g. 4 bit-ADPCM in the case of PHS). This is advantageous from the standpoint of reducing the size of the equipment. It should be noted that besides the external connector 13, a connector for voice signal transmission can be provided in the housing 11. In this case, the voice signal can be transmitted and received between the wireless telecommunications unit 10 and external units in another signal format including analog voice.

Figure 2:
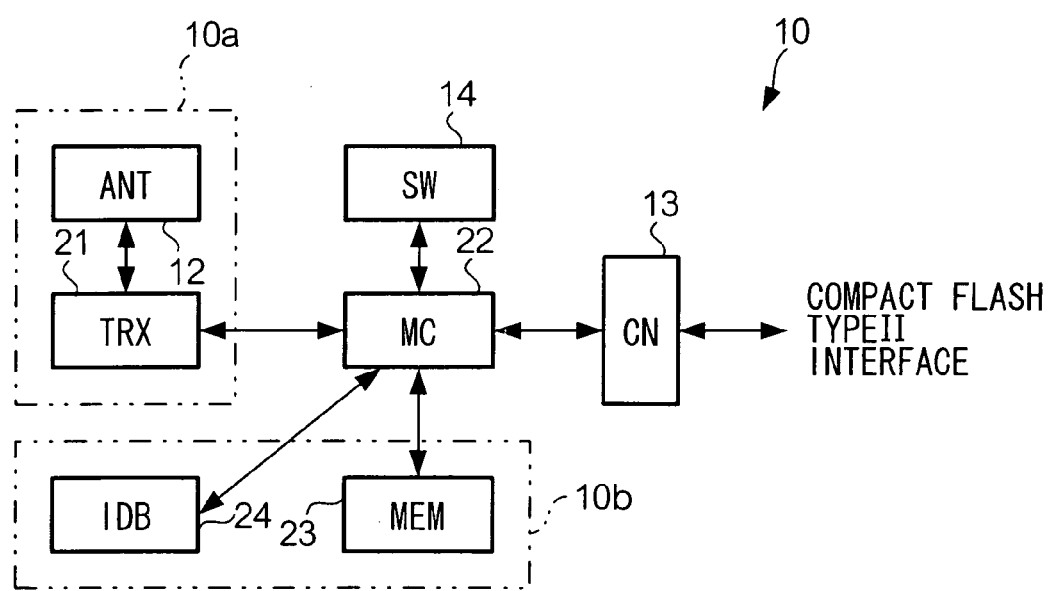
FIG. 2 is a block diagram illustrating the configuration of the wireless telecommunications unit relating to said embodiment.

Next, FIG. 2 is a block diagram illustrating the configuration of the wireless telecommunications unit 10. As shown in the diagram, a wireless transceiver (TRX) 21, a microcontroller (MC) 21, a memory (MEM) 21, And an ID database (IDB) 24 are loaded into the housing 11 of the wireless telecommunications unit 10.

The antenna (AT) 12 and the wireless transceiver 21 form a wireless telecommunications mechanism (wireless telecommunications means) 10a capable of wide area or local wireless telecommunications, for example, sending and receiving by PHS. This wireless telecommunications mechanism 10a has an identification number for wireless telecommunications, and is a wireless telecommunications means for performing wireless telecommunications with the outside.

A microcontroller 22 forms the central control of the wireless telecommunications unit 10, and primarily has the following functions.

a. Controlling the external unit so that it performs wireless telecommunication with the outside using the wireless telecommunications mechanism 10a, when connected to an external unit.
b. Controlling the external unit so that it uses a memory 23 and an ID database 24 as a file system of the specified operating system.
c. Controlling the wireless telecommunications mechanism 10a so that it performs telecommunications using the memory 23 and the ID database 24 by a request from an external unit or by a request generated in the microcontroller 11.

As a result of the above-mentioned mechanism a being controlled by the microcontroller 22, the wireless telecommunications mechanism 10a is recognized as an ordinary standard AT modem by an external unit connected via the external connector (CN) 13 and the microcontroller 22. Therefore, the external unit to which the wireless telecommunications unit 10 is connected can perform the same operation as the data equipment containing a standard AT modem.

Regarding the memory 23 and the ID database 24, due to the fact that said function b is controlled by the microcontroller 22, the external unit operates as a general-use memory mechanism (memory means) 10b that can perform general-use file management in accordance with the specified operating system. And the memory 23 is used primarily as general-use memory.

The microcontroller 22 and the external connector 13 provide PC Card Standard or Compact Flash Type II external interfaces to external units. Signal processing and control for providing these external interfaces are carried out by the microcontroller 22. The wireless telecommunications mechanism 10a and the general-use memory mechanism 10b are connected to each external unit via these external interfaces, and operate as a standard modem and ATA (AT Attachment) Flash Disk for the external unit. At this time, the wireless telecommunications unit 10 is recognized, for example, as a Multi-function Compact Flash Type II card with both the functions of a standard modem and an ATA Flash Disk, from the connected external unit. Thus, external units such as personal computers to which the wireless telecommunications unit 10 is attached, can use the general-use memory mechanism 10b in the same manner as a memory device such as memory built into this external unit. Here, the Flash Disk has a large volume of non-volatile memory, and it is a storage-type PC card that can be directly inserted into the PC card slot, and the ATA Flash Disk is based on the ATA (AT Attachment). The AT (AT Attachment) is an Integrated Drive Electronics (IDE) standard promoted by the American National Standards Institute (ANSI).

The ID database 24 is provided in the housing 11 with a memory card (identification number recording means) sufficiently smaller than the housing 11, for example, an SIM card or small memory card that can be mounted in or removed from the housing 11, and has a memory slot (not pictured) into which the memory card can be inserted. The SIM card or small memory card that is inserted into the slot contains ID data (identification number for wireless telecommunications) such as a phone number or an identification code of the wireless telecommunications mechanism 10a or the like. The ID data within this SIM card or small memory card is referenced or read or written by the external unit via the external connector 13 of the wireless telecommunications unit 10, and the wireless telecommunications mechanism 10a of the wireless telecommunications unit 10 is operated by using the ID data that it read out. A SIM (Subscriber Identification Module) card is a module that makes possible access to wireless telecommunications services, and contains telephone numbers of user terminals or other specified identification is numbers (subscriber ID data) for wireless telecommunications. Thus, the wireless telecommunications unit 10 can be applied to a plurality of identification numbers by exchanging the memory card inserted into the slot, making it possible to raise the level of universality of use.

The microcontroller 22 is able to perform the signal processing necessary for wireless telecommunications using the wireless telecommunications mechanism 10a, while writing to the general-use memory mechanism 10b received data or data generated along with the telecommunications in a file format compatible with the specified operating system, or transmitting the memory data in the general-use memory mechanism 10b by means of the wireless telecommunications mechanism 10b (see mechanism c above). Therefore, the telephone directory or log files for electronic mail in the general-use memory mechanism 10b can be freely read and written from the external unit connected to the wireless telecommunications unit 10 as general-use files on an ATA flash disk. Thus, operating from an external unit such as a mobile terminal or external data equipment can actualize access to a telephone directory, display an intraoffice number, or produce and send electronic mail. The specified operating system is a well-known operating system such as MS-DOC, MS-Windows, Mac OS, or UNIX, which are able to manage general-use files using the general-use memory mechanism 10b.

Figure 3:
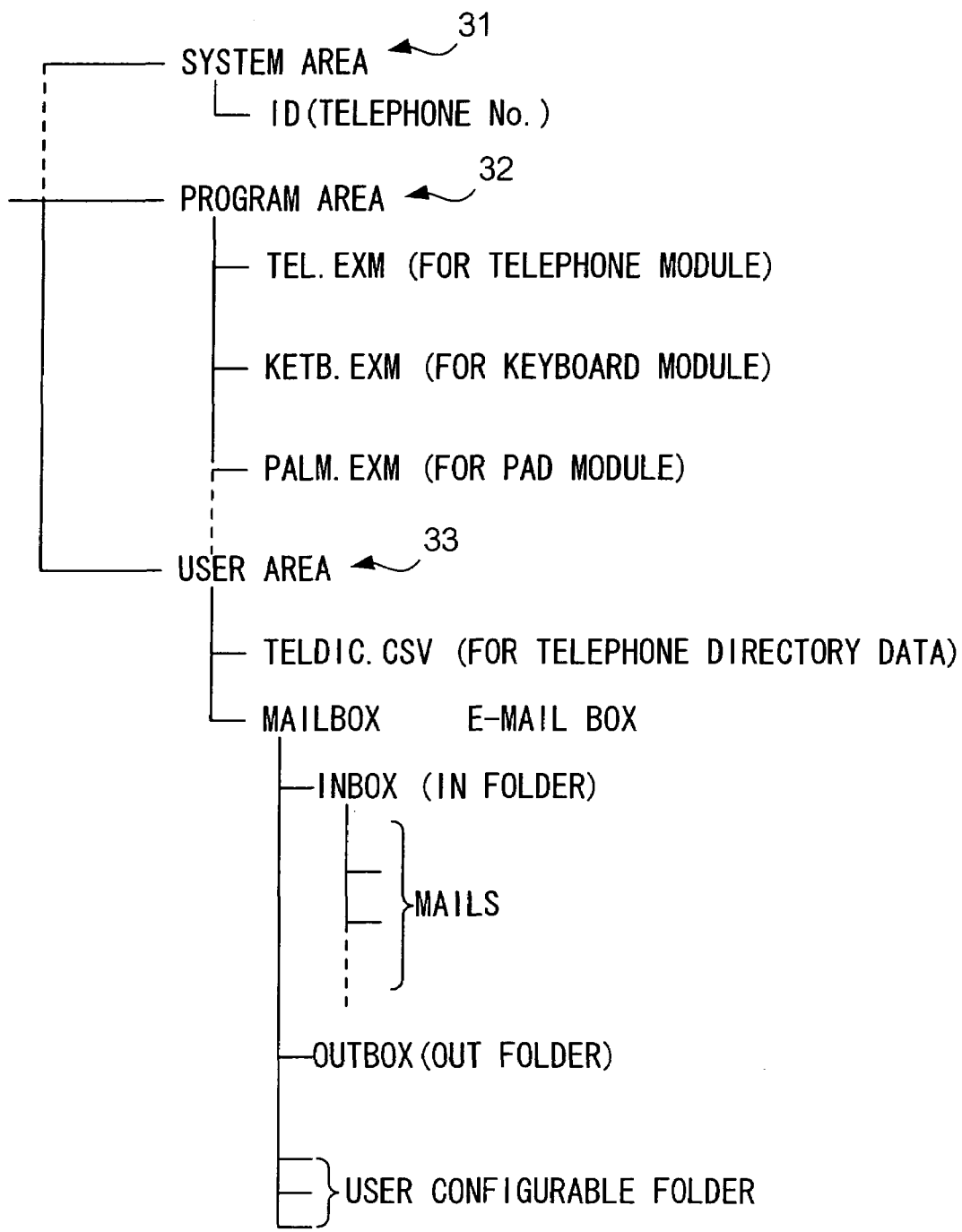
FIG. 3 is a diagram illustrating an example of the file structure in the general-use memory mechanism in said embodiment.

Following is a description of the content of data stored within the general-use memory mechanism 10b. FIG. 3 is an example of the file structure in the general-use memory mechanism 10b. In the figure, a system area 31 permits only the reading of some data (e.g., ID data) with respect to the external unit. In an embodiment, specific methods for the external unit to read the ID data stored in the system area 31 are a method that involves recognizing the wireless telecommunications unit 10 as a standard AT modem, and writing said ID data using an expanded AT command, and a method that involves recognizing the wireless telecommunications unit 10 as an ATA Flash Disk, and reading said ID data as a read-only file within the file system of the same unit. It should be noted that the maker of the terminal and the carrier can undertake special procedures to make it possible to write the data to the system area 31.

Data for the control of at least one type of external data equipment is stored in a program area 32. The user can read and write this data by following special procedures. Data for controlling external data equipment includes program and patch data (or modified or revised data for patches) for various types of external data equipment such as telephone (voice telephone) modules, keyboard modules, pad modules, and the like. When the wireless telecommunications unit 10 is connected to an external unit such as external data equipment, and the format of the external data equipment is judged by the handshake of both parties, the program or patch data for the external data equipment in the program area 32 is downloaded to the external data equipment, and is used to modify the functions of the external data equipment. Furthermore, The microcontroller 22 of the wireless telecommunications unit 10 functions as an identification means to identify the identification code of the external data equipment or to identify the operating position of switches provided to the external data equipment. Accordingly, when the wireless telecommunications unit 10 and specified external data equipment are joined, the above-mentioned control becomes possible due to the fact that the microcontroller 22 functions as an identification means, detecting the specified external data equipment. It should be noted that disclosure of the method of controlling the external data equipment makes it possible for the user to modify the operation of the external data equipment, and to connect external data equipment of ones own making. Furthermore, when the external data equipment is connected to the wireless telecommunications unit 10, a means for identifying the external data equipment can be provided to the controller of the external data equipment side, rather than to the microcontroller 22 of the wireless telecommunications unit 10.

A user area 33 is an area for freely reading or writing from the external unit side, and contains user data such as a telephone directory or log files for electronic mail. As methods of access from the external unit side to the user area 33, the wireless telecommunications unit 10 permits an ordinary access method (file access to general files) in accordance with a specified operating system, and an access method using expanded AT commands.

Both of these methods permit not only the reading and writing of files, but also the initialization of recording media, and when the user performs an ordinary initialization operation on the memory mechanism 10b (or wireless telecommunications unit 10) using the specified operating system of the external unit, only the user area 33 is initialized. That is to say, the data in the system area 31 and the program area 32 is kept, and only the data in the user area 33 is deleted. It should be noted that in this embodiment, user data including telephone directories was stored in the user area 33, but some important user data such as telephone directories can be written into the program area 32, and not deleted by the above-mentioned ordinary formatting operation.

On the other hand, the latter method of access is an access method that can be used from the external unit side that does not permit multi-function. For example, if the telephone directory is given the file name "TELEDIC.CSV" then the user can read the data in the telephone directory file (i.e., telephone directory data) by inputting an expanded AT command such as "AT@@FILE//USER/TELEDIC/CSV" from the external unit side. In other words, even in cases where the wireless telecommunications unit 10 is not recognized as an ATA Flash Disk from the external unit side, if it is recognized as a standard AT modem, access becomes possible from the external unit side to the user area 33, and the convenience of the wireless telecommunications unit 10 is enhanced. It should be noted that in this embodiment, the universality is enhanced by using the common day file format CSV for the file format of the telephone book.

Returning now to FIG. 2, the mode selection switch (SW) 14 is a switch for setting the operating mode of the wireless telecommunications unit 10 as a modem or flash disk for the various function modes or multi-function modes. By operating this mode selection switch 14, the user can cause the wireless telecommunications unit 10 to be recognized as a modem or as an ATA Flash Disk, even for external units that do not support multi-function cards, as some PDA and personal computers do. Even in this case, the convenience of the wireless telecommunications unit 10 can be enhanced by making minimum access possible from the modem to some of the files (telephone directory, etc.) by expanding the AT command as described above.

As described above, the wireless telecommunications unit 10 relating to this embodiment is formed by integrating the wireless telecommunications mechanism 10*a* formed from the antenna 12 and the wireless transceiver 21, and the general-use memory mechanism 10*b* formed from the memory 23 and the ID database 24, with the microcontroller 22 that is interposed between the two mechanisms, and can be separated and connected to external units. At this time, the wireless telecommunications unit 10 provides to the external units an external interface with a high level of universality. The external units can store and reference data in a file format of the specified operating system in the general-use memory mechanism 10*b*, via this external interface. Therefore, it is possible to connect many kinds of data equipment with the specified operating system to the wireless telecommunications unit 10 as external units. Furthermore, ID data, user data, or electronic mail and voice mail logs can be shared among a plurality of data equipment, since it is possible to change an external unit which is connected to the wireless telecommunications unit 10 by nothing more than the very simple operation of substituting the wireless telecommunications unit 10.

Furthermore, on a case-by-case basis, the wireless telecommunications unit 10 can be used by selecting external data equipment with a suitable operating style, then connecting it.

For example, in cases where voice communications such as by telephone is primary, a comfortable operation can be implemented by combining with a conventional handset style external data equipment (see Section A-4 below).

In the case of electronic mail, the ratio of transmission (or composing) is smaller than that of receiving (viewing). Accordingly, usually, mail viewing and simple operations (marking and deleting) are combined with small external devices (see Section A-7 below) which do not have a keyboard for viewing that is mobile. On the other hand, when replying, an external unit for mail equipped with a small keyboard and tablet (see Sections A-5 and A-6 below) can be substituted. This makes it possible to easily input text and to respond. Furthermore, the wireless telecommunications unit 10 can be plugged into a PC card slot of a home personal computer and the like. In this case, it is possible to view large volumes of mail and to input text more comfortably.

Consequently, in accordance with the wireless telecommunications unit 10 of this embodiment, it is possible to select a desirable operating style with an external unit from a plurality of types of terminals depending on the operating objective, while keeping the individual telephone numbers and the ID data relating thereto in the general-use memory mechanism 10*b*. In other words, the desired terminal can be selected from among a plurality of types of mobile terminals, in accordance with the common wireless telecommunications unit 10 and the plurality of types of terminals (external units). In addition, mail logs and telephone directories can be cross-referenced in the form of general-use files between the plurality of mobile terminals. Therefore, there is no problem with operability becoming poor with respect to specified operations, since the terminal format is selected as in the case of the conventional integrated equipment.

Furthermore, in accordance with this embodiment, it is possible to set the operating mode of the wireless telecommunications unit 10 to the function mode or multi-function mode by means of mode selection switch 14. Therefore, universality can be enhanced by expanding the range of equipment that can be connected as an external unit, such as PDA and personal computers that do not correspond to multi-function cards. Moreover, in accordance with this embodiment, access to the general-use memory mechanism 10*b* from the wireless telecommunications means 10*a* via the microcontroller 22 is possible in the wireless telecommunications unit 10. Thus, processes such as referencing an address record recorded in the general-use memory mechanism 10*b* is referenced and calling it out by the wireless telecommunications means 10*a*, and receiving mail by the wireless telecommunications means 10*a* and storing it in the general-use memory mechanism 10*b* can be executed without going through an external unit.

It should be noted that the wireless telecommunications unit 10 described above operates with power supplied from other equipment, but a small battery can also be placed inside. Accordingly, it is possible to reduce the power consumption of the connected external data equipment without attaching the battery unit described below. Furthermore, even in cases where an external unit is not attached, electronic mail can be received automatically using the wireless telecommunications unit all by itself.

A-2. Card Adapter-Type Battery Unit Connectable to Wireless Telecommunications Unit

A-2-1. EXAMPLE 1

Figure 4:
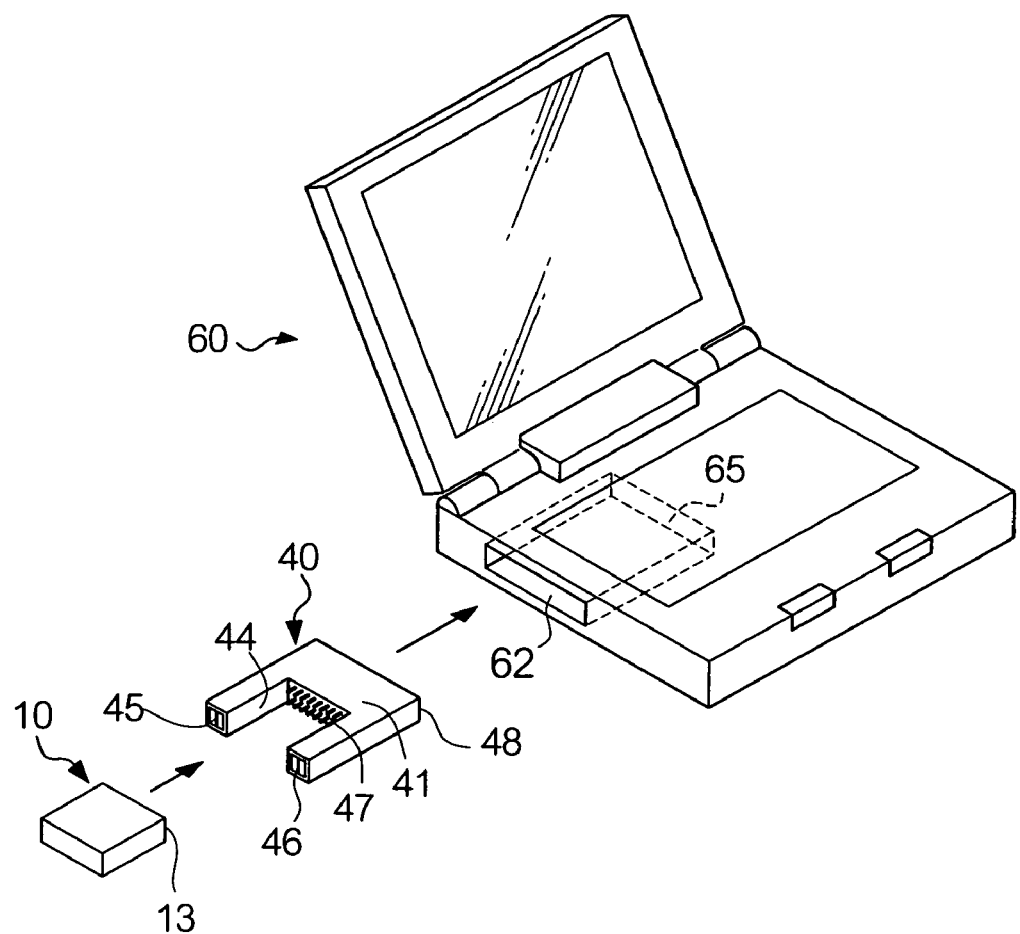
FIG. 4 is an oblique view illustrating a wireless telecommunications unit relating to said embodiment and a battery unit and external unit that can be used therewith.

FIG. 4 is an oblique view showing the wireless telecommunications unit 10 relating to this embodiment and the battery unit 40 and the external unit 60 that can be used therewith. In FIG. 4, the wireless telecommunications unit 10 is of a size that is the same as a small card such as a Compact Flash (registered trademark of Sun Disk Corporation), Smart Media (registered trademark of Toshiba Corporation), Memory Stick (registered trademark of Sony Corporation), Multi Media Card (registered trademark of Siemens A.G.), or a small PC card. The battery unit 40 has a housing 41. In this housing 41 is formed a notched slot 44 that can accommodate the wireless telecommunications unit 10 which is a small card. On the two ends of the slot 44 are provided, respectively, a charging selection switch 45 for switching the charging, and a LED 46 as an indicator for displaying the charging status. At the bottom of the slot 44 is placed a connector 47. When the wireless telecommunications unit 10 is inserted into the slot 44, the external connector 13 of this wireless telecommunications unit 10 is connected to the connector 47. The battery unit 40 in a state in which the wireless telecommunications unit 10 is inserted into the slot 44 has the same overall configuration as a PC card of Type II, Type III, or Type IV, as prescribed by the PC Card Standard. The dimensions of these various PC cards are as follows.

Type II: Length & width=85.6 mm×54.0 mm; Thickness=5.0 mm

Type III: Length & width=85.6 mm×54.0 mm; Thickness=10.5 mm

Type IV: Length & width=85.6 mm×54.0 mm; Thickness=16.0 mm

The connector 48 for the PC card format is provided at a portion of the side opposite to the slot 44 in the housing 41. This battery unit 40 can be inserted into a PC card slot 62 of an external data equipment such as a common PDA or notebook computer. The connector 48 of the battery unit 40 is connected to a connector 65 on the external data equipment side provided deep inside the PC card slot 62.

Figure 5:
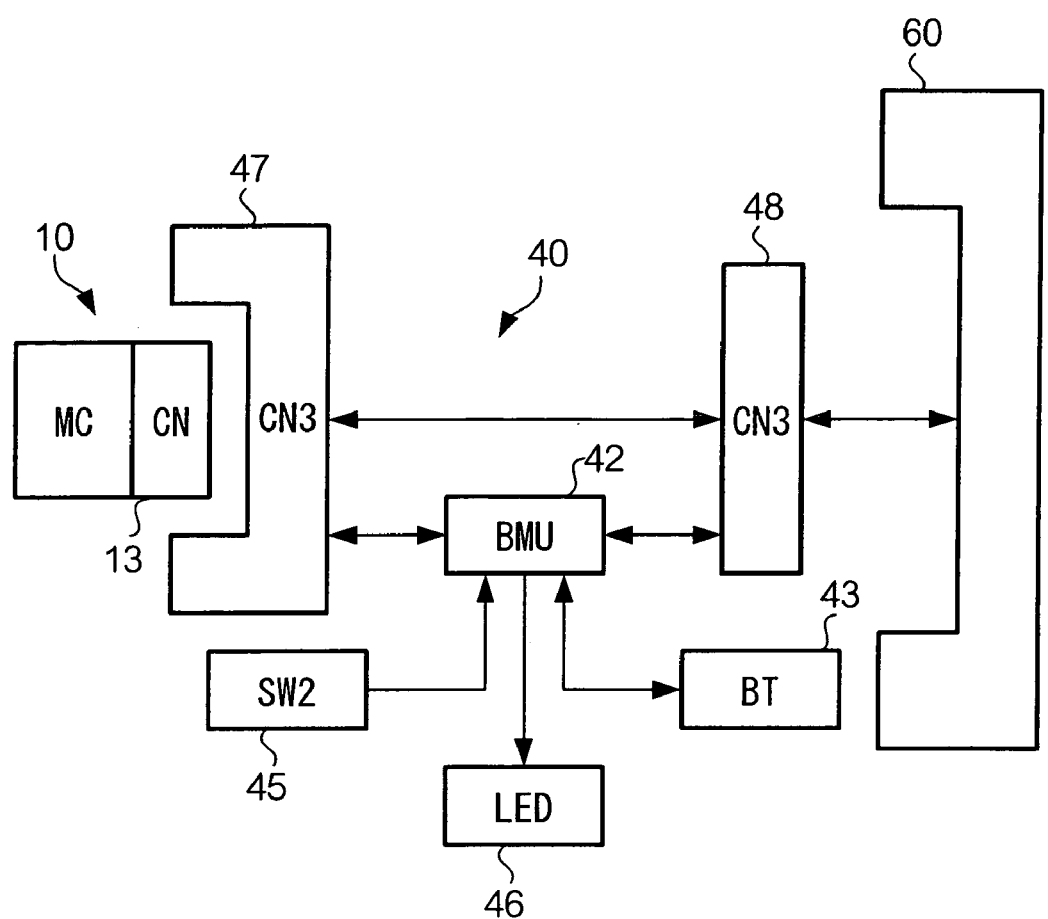
FIG. 5 is a block diagram illustrating a battery unit in said embodiment.

FIG. 5 is a block diagram illustrating the configuration of the battery unit 40. As shown in the diagram, the battery unit 40 has a battery monitor unit (BMU) 42 and a battery (BT) 43. Power from the battery 43 is supplied to the wireless telecommunications unit (CM) 10 via the battery monitor unit 42 and the connector (CN2) 47. The battery monitor unit 42 controls whether or not the battery 43 is charged, based on the setting of the charging selection switch (SW2). Furthermore, in cases where the battery monitor unit 42 charges the battery 43, a LED 46 is driven to emit light to inform the user.

The connector 47 and the connector 48 (CN3) are connected. Therefore, the battery unit 40 functions as an adapter mechanism with a specified configuration for making it possible to transmit data between the wireless telecommunications unit 10 and external units, connecting the wireless telecommunications unit 10 connected to the connector 47 and external units such as PDA connected to the connector 48. Here, "specified configuration" refers to the configuration of PC cards of Type II, Type III, and Type IV as stipulated in the above-mentioned PC Card Standard.

When a wireless telecommunications unit 10 is attached to the battery unit 40 which is an adapter mechanism with this specified configuration and inserted into a PC card slot, the external data equipment 60 recognizes the wireless telecommunications unit 10 as a multi-function PC card that functions as a standard modem or an AT flash. Also, the wireless telecommunications unit 10 functions as a standard modem or ATA flash for the external data equipment 60. Furthermore, the wireless telecommunications unit 10 can be operated as a PC card of any designated operating mode by using the mode selection switch 14 (see FIG. 2). That is to say, if the wireless telecommunications unit 10 is attached to the battery unit 40 and attached to the external data equipment, the same operation is obtained as when the above-mentioned wireless telecommunications unit 10 is directly connected to external data equipment. In this case, since the operating power of the wireless telecommunications unit 10 is supplied from the battery 43 within the battery unit 40, the operation can continue for a long time even when the external data equipment 60 is a small mobile terminal (PDA or the like) with little extra power.

Furthermore, in cases where external units with extra power such as notebook personal computers are used, the operating power of the wireless telecommunications unit 10 is supplied from an external unit by operating the charge selection switch 45, and it is also possible to simultaneously charge the battery 43. It should be noted that the battery 43 can be charged even in cases where the battery unit 40 is inserted into a PC card slot or a charging module without being attached to the wireless telecommunications unit 10. It is also possible to provide the power of the battery 43 to other functional modules and external units by operating the switch 45.

The battery unit 40 can serve as an operating battery and PC card-type adapter of the wireless telecommunications unit 10. Therefore, if this battery unit 40 and the wireless telecommunications unit 10 are connected to a mobile terminal, it is possible to perform operations for a long time using a mobile terminal with no extra power capacity. On the other hand, it is possible to charge batteries in cases where there is no extra power capacity on the side of the connected external unit.

A-2-2. EXAMPLE 2

Figure 6:
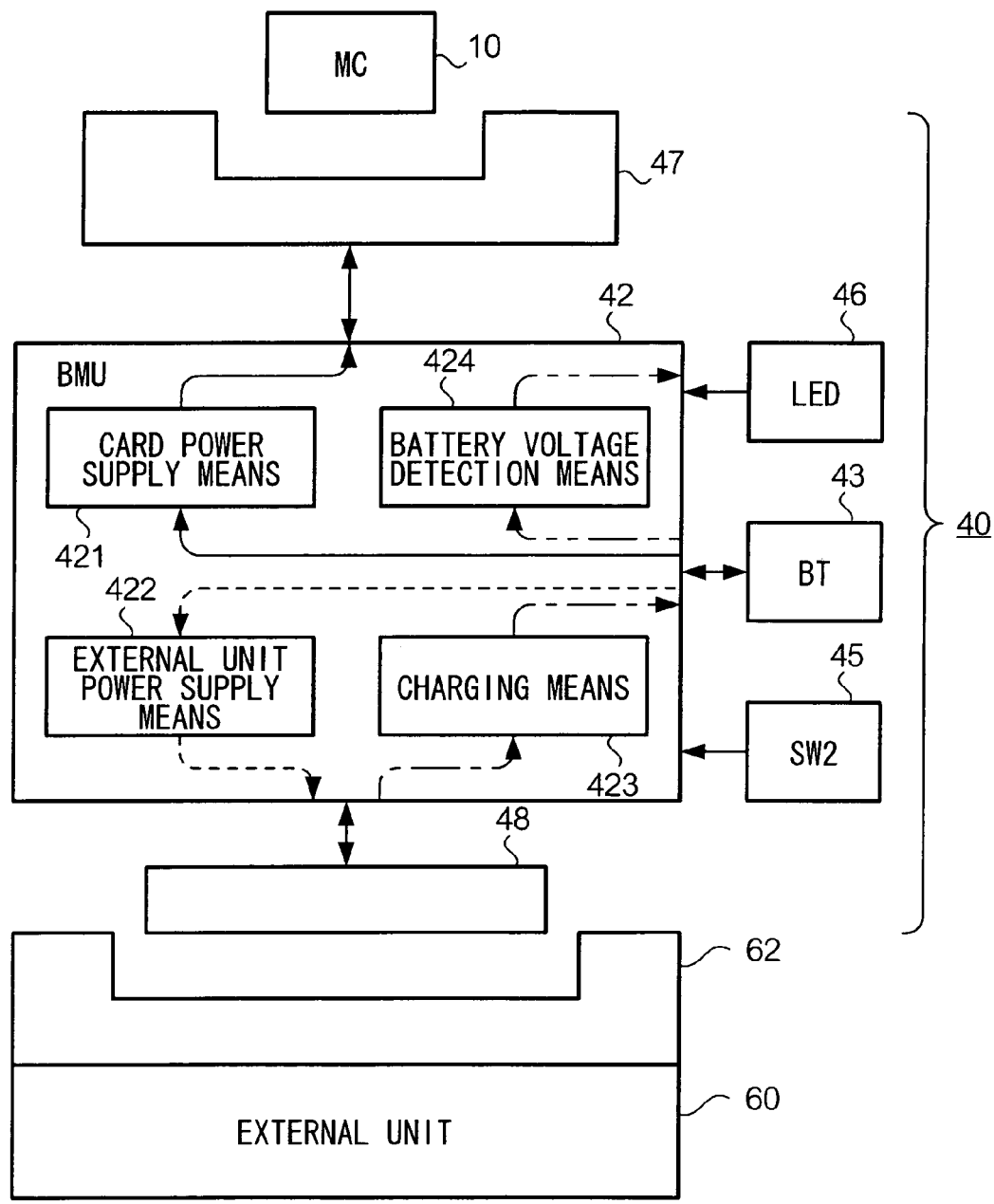
FIG. 6 is a block diagram illustrating the configuration of the second example of the battery unit in said embodiment.

FIG. 6 is a block diagram illustrating the functional configuration of the second example of the battery unit 40. This battery unit 40 is an improvement on the batter monitor unit 42 in Example 1 above. It should be noted that, in order to impart a deeper understanding of the functional configuration of this battery unit, FIG. 6 shows the small card wireless telecommunications unit 10 and the external unit 60 together with the battery unit 40.

In FIG. 6, the battery monitor unit 42 has a card power supply means 421 that supplies operating power to the wireless telecommunications unit 10 from the battery 43, and an external unit power supply means 422 that supplies operating power to the external unit 60 from the battery 43, and the charging means 423 that charges the battery 43 from the external unit 60, and the battery voltage detection means 424 that detects the voltage level of the battery 43, and transmits the voltage level signals of the battery 43 to a LED 16.

Next is an explanation of the operation of the devices shown in FIG. 6. First, the wireless telecommunications unit 10 is plugged into the PC card slot of the battery unit 40. This joins the connector on the wireless telecommunications unit 10 and the connector 47 of the battery unit 40. When this happens, the small card wireless telecommunications unit 10 is connected to the battery unit 40, which means that overall, it is in a PC card configuration as stipulated by the PCMCIA/JEIDA standards. Furthermore, when the battery unit 40 containing the wireless telecommunications unit 10 is inserted into the PC card slot of the external unit 60, the connector 48 and the connector 62 of the PC Card Standard are connected. Accordingly, the wireless telecommunications unit 10 is connected to the external unit 60 via the battery unit 40.

As a result, the signals between the external unit 60 and the wireless telecommunications unit 10 are propagated through the connector 62, the connector 48, and the connector 47. Accordingly, telecommunications is possible between the external unit 60 and the wireless telecommunications unit 10, without the use of special means.

When this connection is made, the battery monitor unit 42 permits the operation of the card power supply means 421. As a result, power from the installed battery 43 is supplied to the wireless telecommunications unit 10 through the card power supply means 421 and the connector 47.

On the other hand, the battery unit 40 has the following three types of operating modes in relation to the battery 43.

i. The charging mode that permits the operation of the charging means 423, and that prohibits the operation of the external unit power supply means 422.

ii. The external unit power supply mode that prohibits the operation of the charging mode 423, and permits the operation of the external unit power supply means 422.

iii. The external unit connection prohibition mode that prohibits the operation of the charging means 423, and prohibits the operation of the external unit power supply means 422.

The user can select any mode from among these three modes by performing the selection operation of the charge selection switch 45.

Figure 7:
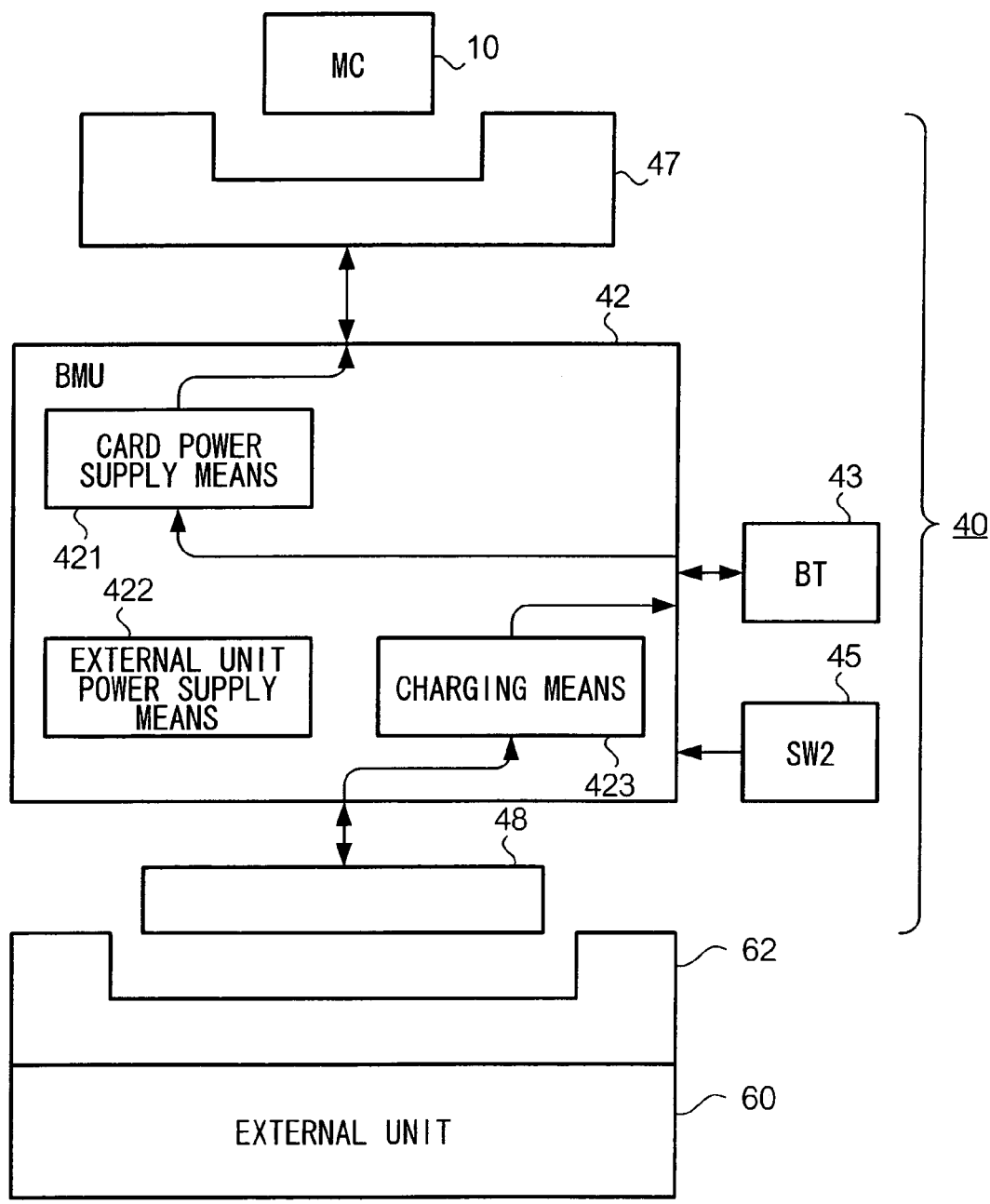
FIG. 7 is a block diagram illustrating the structure of the mechanism in the charging mode of said battery unit.
Figure 8:
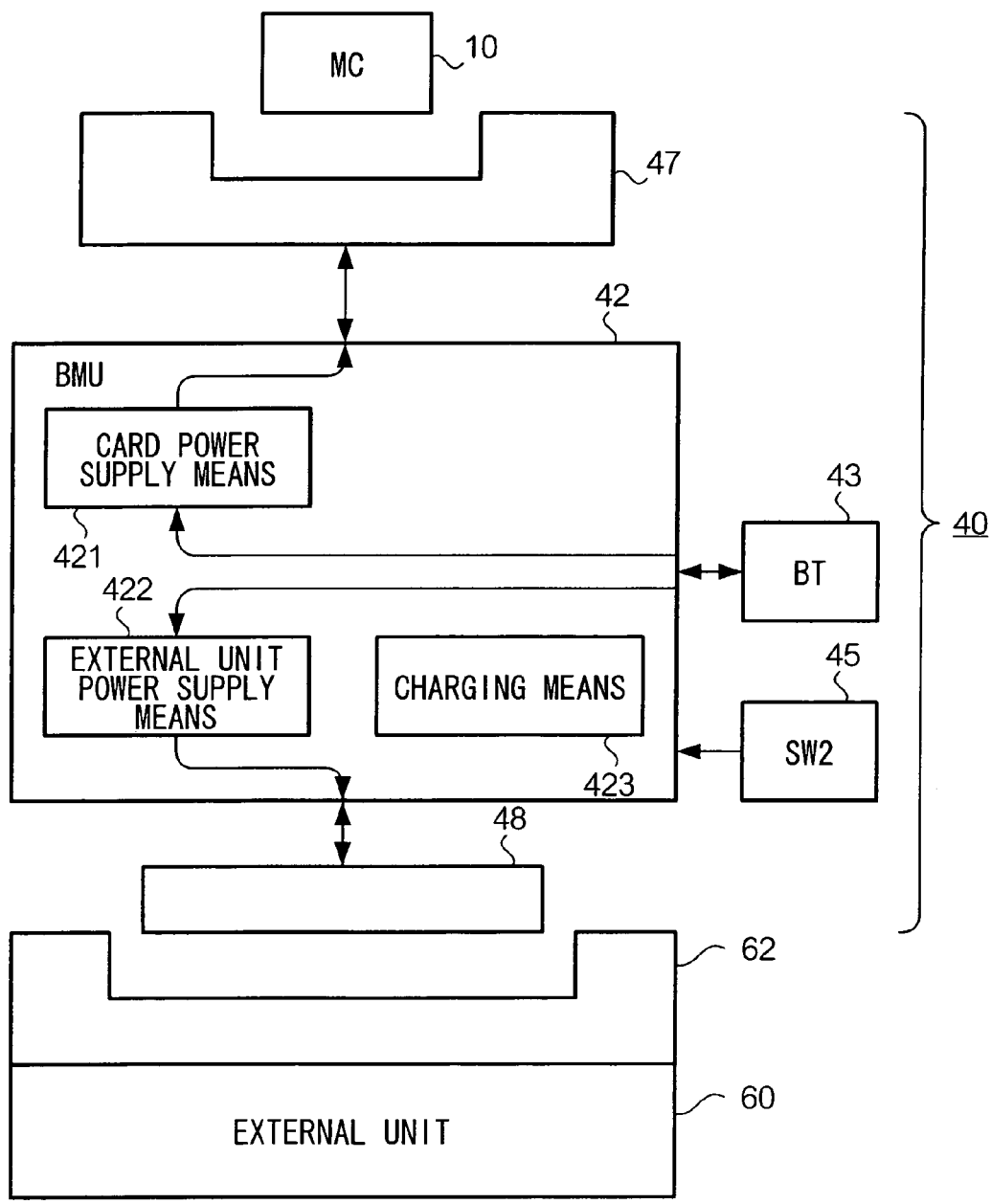
FIG. 8 is a block diagram illustrating the structure of the mechanism the external unit power supply mode of said battery unit.
Figure 9:
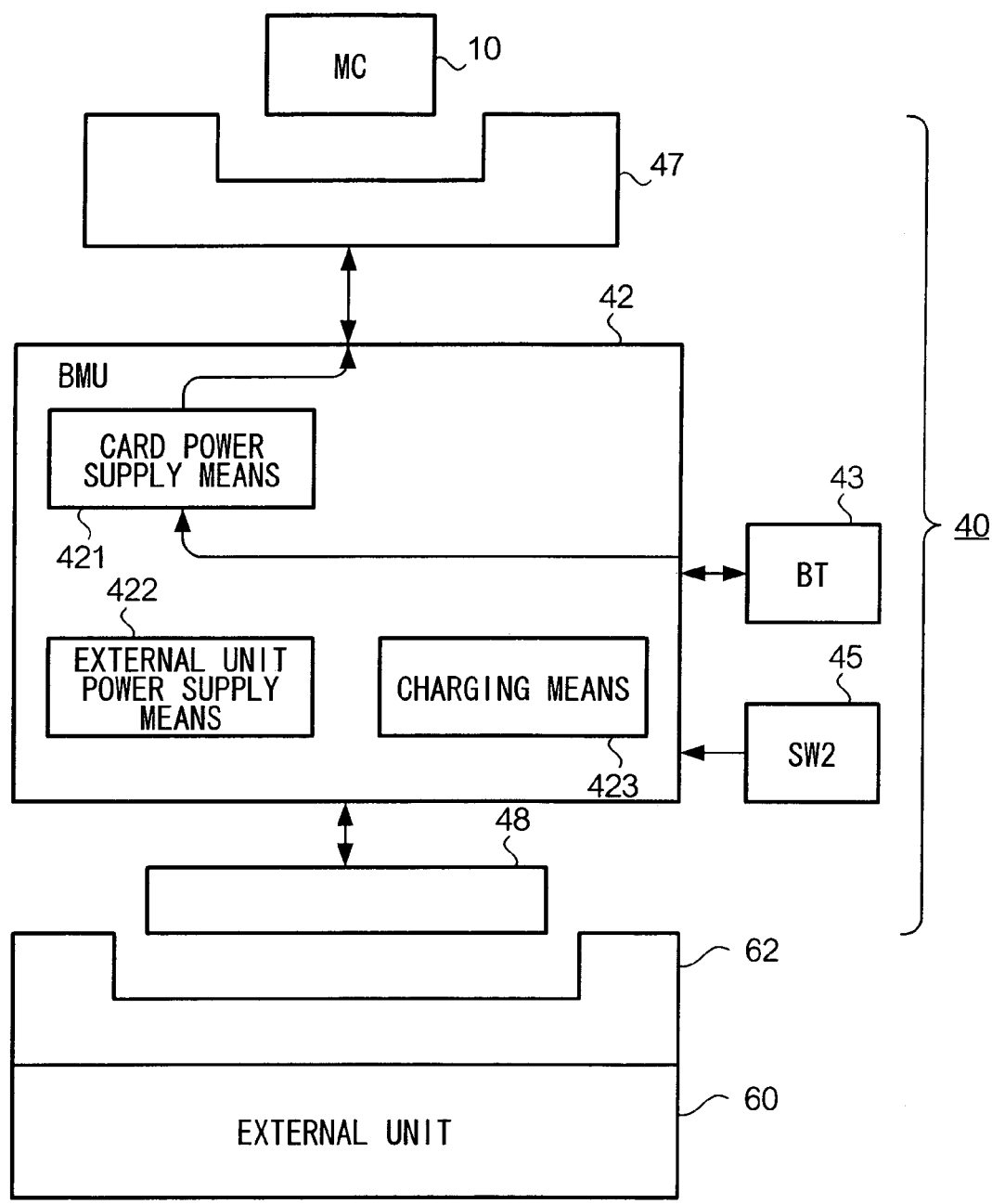
FIG. 9 is a block diagram illustrating the structure of the mechanism in the external unit connection prohibition mode of said battery unit.

FIG. 7 is a block diagram illustrating the functional configuration of the charging mode. FIG. 8 is a block diagram illustrating the functional configuration of the external unit power supply mode. FIG. 9 is a block diagram illustrating the functional configuration of the external unit connection prohibition mode.

When, for example, a user selects the charging mode using the charging selection switch 45, the power of the external unit 60 is supplied to the battery 43 through the connector 62, the connector 48, and the charging means 423, with the battery monitor unit 42 permitting the operation of the charging means 423, as shown in FIG. 7. Accordingly, in cases where electronic equipment with extra power such as a notebook personal computer is used as the external unit 60, it is possible to charge the battery 43 and at the same time supply operating power to the wireless telecommunications unit 10 from the external unit 60, by selecting this mode.

Furthermore, in cases where the external unit connection prohibition mode is selected by the charging selection switch 45, the battery monitor unit 42 prohibits the operation of the external unit power supply means 422 and the charging means 423, blocking the connection of the external unit 60 and the battery 43, as shown in FIG. 9. In cases where a small mobile terminal (PDA or the like) with no extra power is used as the external unit 60, the operating power of the wireless telecommunications unit 10 is supplied from the battery 43 within the battery unit 40, by selecting this mode. Accordingly, the external unit 60 does not receive the burden of providing power due to the operation of the wireless telecommunications unit 10, and the operation can continue for a long time.

Furthermore, when an external unit power supply mode is selected by means of the charging selection switch 45, the battery monitor unit 42 permits the operation of the external unit power supply means 422, as shown in FIG. 8. Accordingly, the operating power of the external unit 60 is supplied from the battery 43 via the battery monitor unit 42, the connector 48, and the connector 62. Consequently, if a mode is selected when the battery in the external unit 60 has no extra power, the external unit 60 can operate longer than when the external unit connection prohibition mode is selected.

It should be noted that in the case of recent Operating Systems (OS), there is the possibility that the charging of the battery 43 within the battery unit 40 becomes impossible when the small card wireless telecommunications unit 10 is not used, since the personal computer side is set up to cut off the power for the PC card when the PC card is not in use. Such cases can be handled by either installing in the external unit 60 a driver software for providing a constant supply of power to the battery unit 40 when the battery unit 40 is in use, or changing the configuration of the OS so that PC card power source stoppage checking will not be implemented.

In the battery unit 40, the voltage level of the battery 43 is detected by the battery voltage detection means 424, and this is transmitted to the LED 46. Accordingly, the voltage level of the battery 43 is displayed by the LED 46 as an indicator. This display can have three levels: HIGH, MID, and LOW.

Thus, in this embodiment, the battery unit 40 functions not only as an adapter for the small card wireless telecommunications unit 10, but also as an operating power source for the wireless telecommunications unit 10 and the external unit 60. Consequently, even in cases where the external unit 60 has no extra power capacity, there is no burden of providing power on the external unit 60, and it is possible to operate for a long time. Furthermore, in cases where the external unit 60 has extra power capacity, the battery 43 can be charged.

A-3. Battery Charging Device

Figure 10:
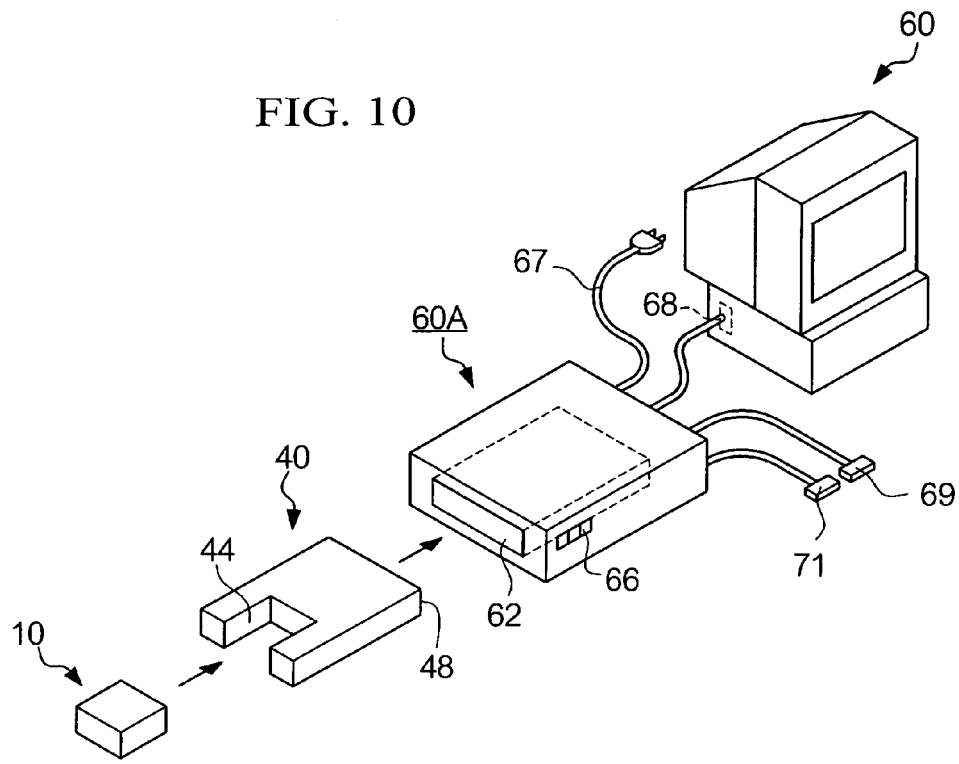
FIG. 10 is a diagram illustrating a charging device for charging batteries of the battery unit in said embodiment.

FIG. 10 shows the charging device 60A for charging the battery 43 of the battery unit 40. The housing 61 of the charging device 60 is provided with the PC card slot 62 into which the battery unit 40 can be inserted.

Figure 11:
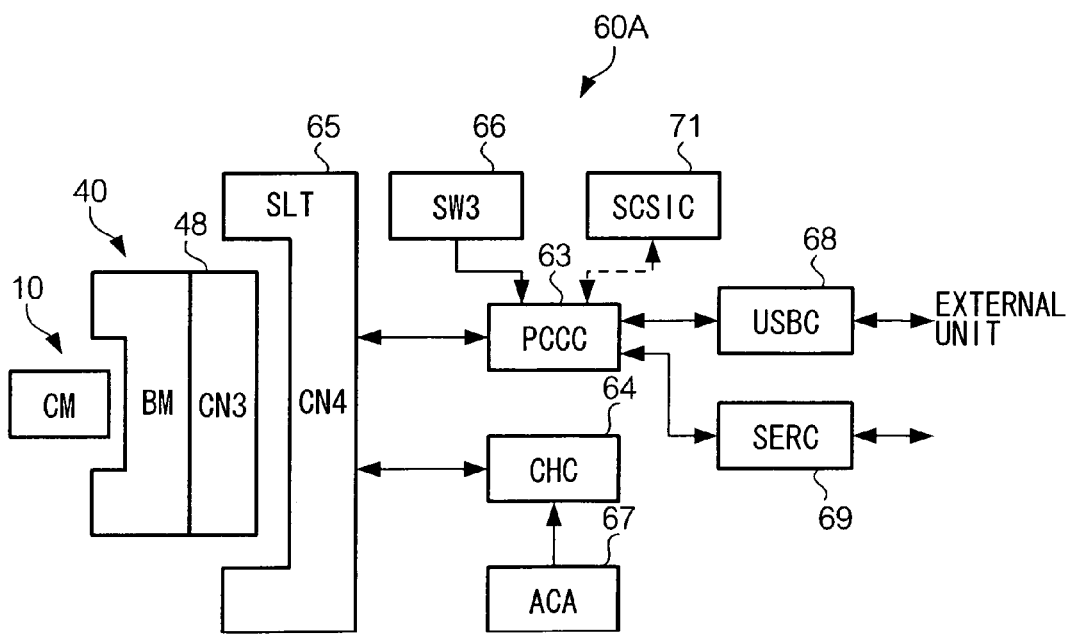
FIG. 11 is a block diagram illustrating the configuration of said charging device.

FIG. 11 is a block diagram illustrating the configuration of the charging device 60A. As shown in the diagram, the charging device 60A is provided with a PC Card Controller (PCCC) 63 positioned within the housing 61 (see FIG. 10), a charging controller (CHC) 64, a connector (CN4) 65 positioned at the bottom of the PC card slot 62 (see FIG. 10), a switch (SW3) 66 positioned on the outside of the housing 61, and an AC adapter (ACA) 67 for the power supply.

The charging controller 64 is a controller that controls charging with respect to the battery unit 40 that is connected to the connector 65. The PC card controller 63 performs the reading/writing of the PC card (the wireless telecommunications unit 10 recognized as a PC card when the battery unit 40 is installed) that is connected to the connector 54. The switch 66 is a switch used for selecting the external interface discussed below.

Furthermore, the charging device 60 is provided with a USB connector (USBC) 68, a serial connector (SERC) 69, and a SCSI connector (SCSIC) 71. It is thus possible to transmit data between the wireless telecommunications unit 10 that is recognized as a PC card installed in the connector 65, and the external units connected to the USB connector 68, the serial connector 69, or the SCSI connector 71. It should be noted that this is one example of an external interface provided to the charging device 60, and other external interfaces can also be provided. Here, USB is a Universal Serial Bus, IEEE 1394 is a standard for serial interfaces, and SCSI (Small Computer System Interface) is a standard interface that handles parallel signals.

In this configuration, when the battery unit 40 installed in the wireless telecommunications unit 10 is inserted into the PC card slot 62, the battery 43 within the battery unit 40 is charged. Furthermore, when an external unit is connected to the USB connector 68, the serial connector 69, or the SCSI connector 71 it is possible to operate the wireless telecommunications unit 10 as a standard modem or as an ATA Flash Disk. In detail, when an external unit is connected to the serial connector 69, the wireless telecommunications unit 10 is recognized by an external unit connected to the serial connector 60 as a standard modem, a standard ATA Flash Card, or as both. Furthermore, it is recognized as a standard ATA Flash Card by an external unit connected to the SCSI connector 71.

Consequently, the above-mentioned wireless telecommunications unit 10 can be operated without using driver software on the external unit side that is connected to the external interface of the charging device 60. However, a greater number of functions can be activated by using special software. For example, the wireless telecommunications unit 10 can be operated as a modem by an external unit connected to the SCSI connector 71.

The selection of an operating mode for said standard wireless modem or ATA Flash Card, or the selection of an external interface, should be made by operating the selection switch 66. The user can accordingly select any desired operating mode. Also, in cases where no selection switch 66 is provided, or in cases where the user can select a non-set state, the operation should follow an operating mode selected by the mode selection switch 14 (see FIG. 2) of the above-mentioned wireless telecommunications unit 10.

When the battery unit 40 is inserted into the charging device 60, the PC Card Controller (reading/writing means) 63 can perform reading/writing processing with respect to a PC Card (including the wireless telecommunications unit 10 recognized as a PC Card) inserted into the battery unit 40. In other words, it can be operated as a Reader/Writer of a general-use PC Card, at the same time as charging the battery unit 40. In this case, the charging device 60 is an external unit for the wireless telecommunications unit 10.

Furthermore, if a personal computer or other external unit is connected to an external interface, the wireless telecommunications unit 10 connected to the battery unit 40 from an external unit can be used as a wireless modem or an ATA Flash Disk. It should be noted that when the battery unit 40 is to be charged, charging can be carried out regardless of the status of the charging selection switch 45 of the battery unit 40, by performing a handshake between the controller 42 in the battery unit 40 and the controller 64 of the charging device 60. Accordingly, it is possible to prevent charging errors due to forgetting to set the switch 45.

Figure 12:
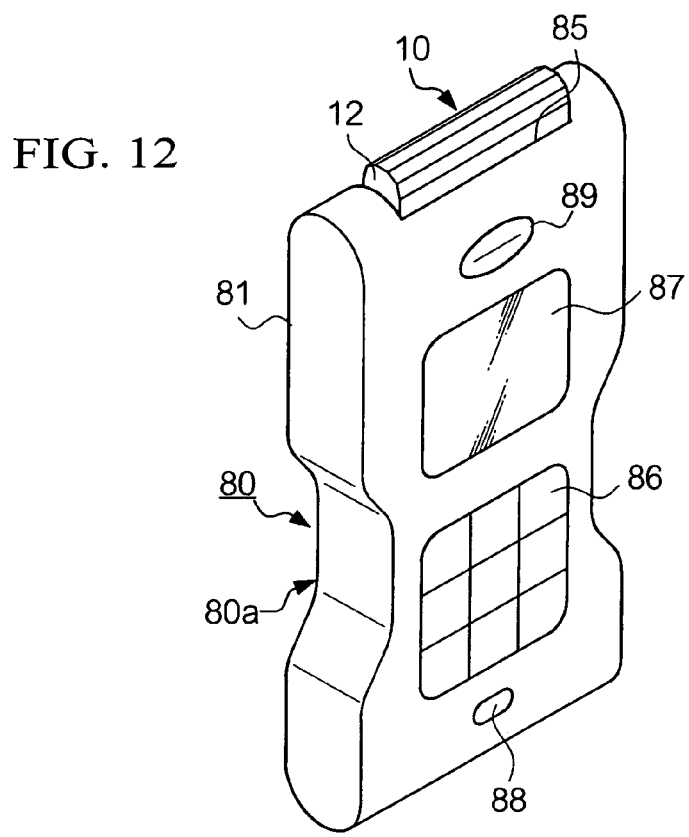
FIG. 12 is an oblique view illustrating the external appearance of the first example of a mobile terminal using a wireless telecommunications unit relating to said embodiment.

A-4. Example 1 of a Mobile Terminal Using a Wireless Telecommunications Unit Relating to this Embodiment FIG. 12 is an oblique view illustrating the external appearance of a mobile terminal constructed by using the wireless telecommunications unit 10 relating to this embodiment. In the drawing, a mobile terminal 80 is a mobile terminal capable of voice communication, and this is provided with the wireless telecommunications unit 10 and a terminal main body 80a connected thereto. The terminal main body 80a is used when executing voice communication, and the wireless telecommunications unit 10 is attached to the terminal main body 80a when a user carries out voice communication.

The terminal main body 80a has a housing 81, and a slot 85, into which the wireless telecommunications unit 10 is inserted, is formed at the top of the housing 81. Furthermore, a speaker 89, a display 87, a keypad 86, and a microphone 88 are provided at the front of the housing 81. Good transmission and receiving sensitivity are maintained, without loss of portability, if only the antenna 12 of the wireless telecommunications unit 10 is exposed, as shown in the drawing, when the wireless telecommunications unit 10 is attached to the slot 85.

Figure 13:
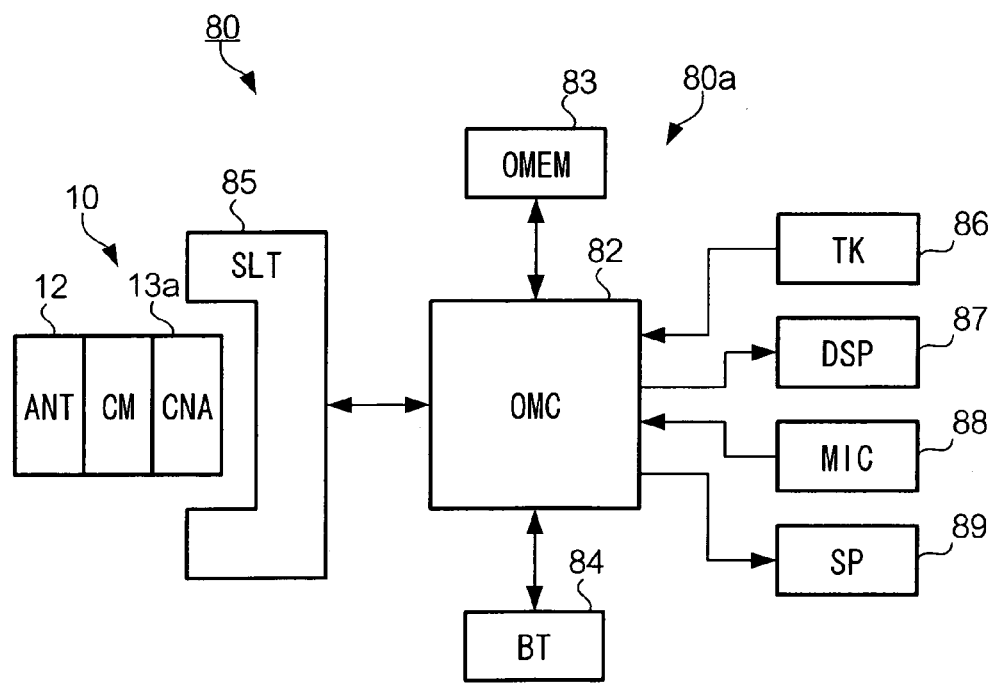
FIG. 13 is a block diagram illustrating the configuration of said mobile terminal.

FIG. 13 is a block diagram illustrating the configuration of the mobile terminal 80. In the diagram, the wireless telecommunications unit 10, which is attached to the terminal main body 80a, has an external interface 13a for voice data which is added to the configuration of the wireless telecommunications unit 10 appearing in FIG. 1 and FIG. 2. The wireless telecommunications unit 10 can send and receive voice data between the terminal main body 80a via this external interface 13a (CNA).

The terminal main unit 80a is provided with the above-mentioned slot (SLT) 85, the speaker (SP) 89, the display (DSP) 87, the keypad (TK) 86, as well as the microphone (MIC) 88, the microcontroller (OMC) 82, a memory (OMEM) 83, and a battery (BT) 84 that supplies power to the various devices of the mobile terminal 80.

The microcontroller 82 controls the telecommunications operation by the microcontroller 22 (see FIG. 2) installed in the wireless telecommunications unit 10, as well as by the terminal main body 80a and the wireless telecommunications unit 10. Furthermore, the microcontroller 82 has an AD/DA converter, which converts the voice analog signals that enter from the microphone 88 to digital signals, and transmits them to the wireless telecommunications unit 10. Furthermore, the voice digital signals received by the wireless telecommunications unit 10 are converted to analog signals, and transmitted to the speaker 89. It should be noted that the AD/DA converter can be provided to the microcontroller 22 of the wireless telecommunications unit 10.

Moreover, in addition to the above-mentioned telecommunications control function, the microcontroller 82 also functions as a file management unit, writing and reading data to the general-use memory mechanism 10b (see FIG. 2) of the wireless telecommunications unit 10. In detail, it executes the process of reading data such as telephone numbers recorded in the general-use memory mechanism 10bh and displaying it on the display 87, and the process of writing data such as telephone numbers input with the keypad 86 to the general-use memory mechanism 10b, in response to the operation of the keypad 86 by the user.

The memory 83 is a partitioned area which is released by the user, and the user can freely write data into this area. For example, a telephone directory or electronic mail log file recorded in the general-use memory mechanism 10b can be written into this area.

The mobile terminal 80 attached to the wireless telecommunications unit 10 can carry out communication by operating in the same manner as an ordinary mobile telephone. The terminal main body 80a has excellent portability, and is formatted to be able to easily carry out voice communication, and the user can readily carry out voice communication. Furthermore, if the wireless telecommunications unit 10 is taken off, and connected to other equipment, it is possible to reference and process data stored in the wireless telecommunications unit 10, using the connected equipment. There is consequently no need to record data such as a telephone directory in each connected external unit. Furthermore, in the case of an ordinary mobile phone, telephone directory data input by keypad is troublesome, but if the wireless telecommunications unit 10 is taken off and connected to another external data equipment such as a personal computer, and the telephone directory data is input from this personal computer, the operation of inputting becomes easy. It thus becomes possible to easily execute the data input operation, while maintaining the ease of voice communication as with an ordinary mobile telephone, since the wireless telecommunications unit 10 can be exchanged.

It should be noted that it is of course also possible to record voice data in the general-use memory mechanism 10*b* of the wireless telecommunications unit 10. Therefore, it is also possible to send recorded sound of conversations and voice data by means of the mobile terminal 80, as well as to establish functions such as answering machine functions.

Furthermore, in cases where programs and batch data corresponding to the terminal main body 80*a*, which is external data equipment, are stored in the program area 32 (see FIG. 3) of the above-mentioned general-use memory mechanism 10*b*, this data is automatically downloaded to the terminal main body 80*a* from the wireless telecommunications unit 10, when the terminal main body 80*a* and the wireless telecommunications unit 10 are connected. Consequently, the operation of the microcontroller 82 can be switched, and it becomes possible to easily execute patches (revisions and modifications) of programs relating to the operation, and to easily introduce new operating programs.

Moreover, another voice output means such as earphones can be attached instead of the speaker 89. Also, a command button or a keypad can be attached instead of the microphone 88 which performs the input/output of image and text to function either as voice input (microphone) or voice output (speaker), and when these are operated, the image or text data can be input and transmitted. Files that are thusly stored in the general-use memory mechanism 10*b* are not limited to voice data files, but other types of general-use files such as image and text data can also be stored.

Figure 14:
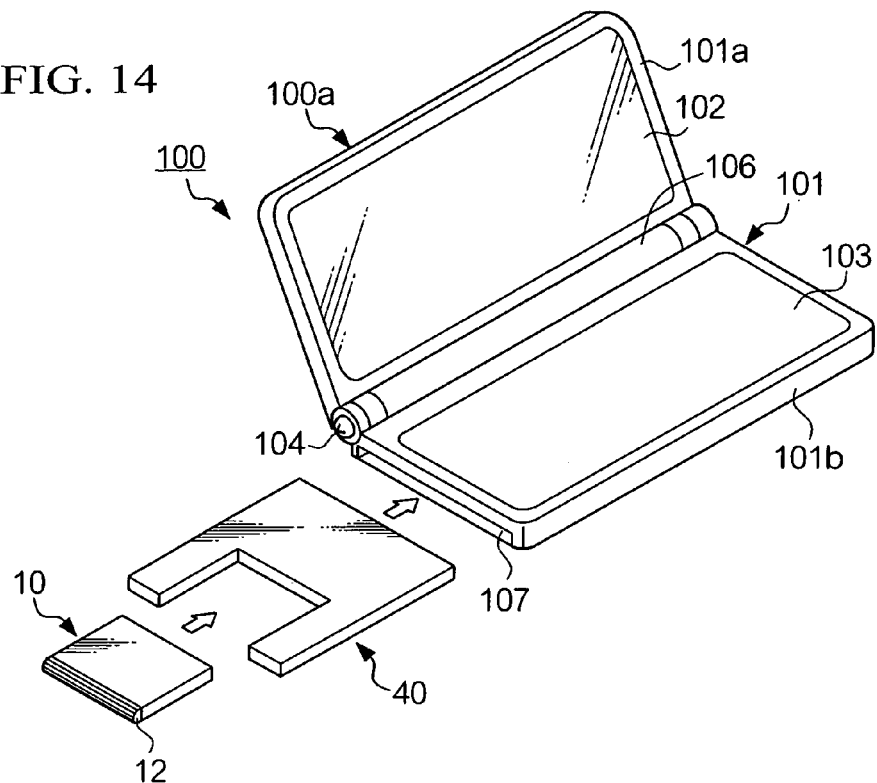
FIG. 14 is an oblique view illustrating the external appearance of the second example of a mobile terminal using a wireless telecommunications unit relating to said embodiment.

A-5. Example 2 of a Mobile Terminal Using a Wireless Telecommunications Unit Relating to this Embodiment FIG. 14 is an oblique view illustrating the external appearance of a mobile terminal with another configuration. A mobile terminal 100 shown in the drawing is a mobile terminal capable of keyboard input and provided with the battery unit 40 with the above-mentioned wireless telecommunications unit 10, and is provided with the wireless telecommunications unit 10, the battery unit 40, and a terminal main body 100*a* attached to the battery unit 40.

The terminal main body 100*a* has a housing 101 that can open and close. The housing 101 has a cover 101*a* and a main body 101*b* that are connected with a hinge mechanism. The cover 101*a* of this housing 101 has a display 102, and the main body 101*b* has a keyboard 103. Furthermore, A battery 106 that drives the mobile terminal 100 is placed between the hinge mechanism of the housing 101. In addition, on the side of the main body 101*b* is formed a slot 107 that is inserted into the battery unit 40.

Figure 15:
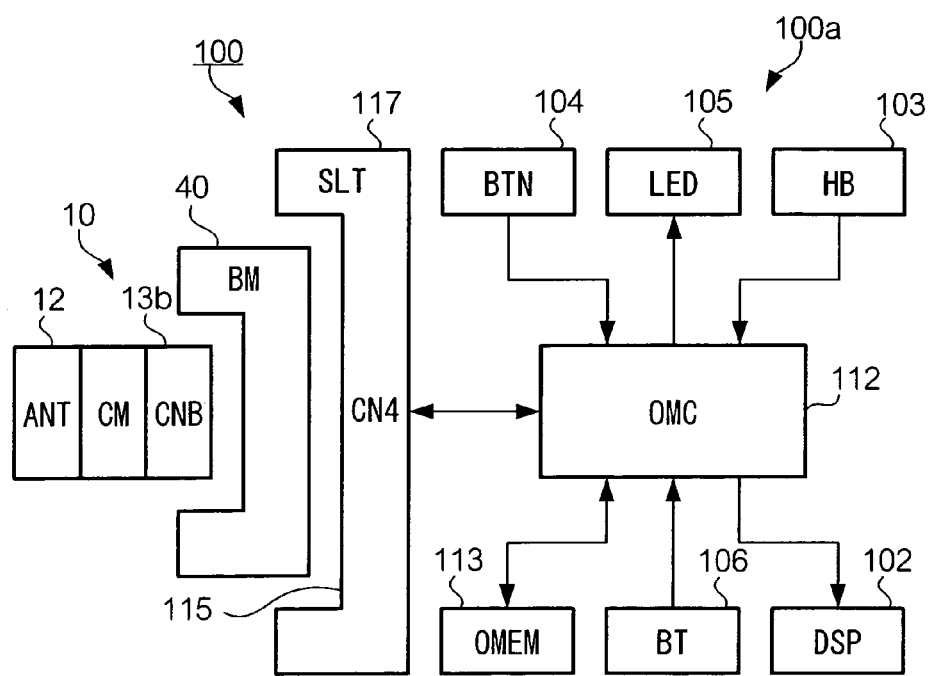
FIG. 15 is a block diagram illustrating the configuration of said mobile terminal.

FIG. 15 is a block diagram illustrating the configuration of the mobile terminal 100. As shown in the diagram, the wireless telecommunications unit 10 attached to the terminal main body 100*a* has an external interface (CNB) 13*b* for character and pattern data, in addition to the configuration of the wireless telecommunications unit 10 shown in FIG. 1 and FIG. 2. The wireless telecommunications unit 10 can send and receive character and pattern data between the terminal main body 100*a* via this external interface 13*b*.

The terminal main body 100*a* is provided with the above-mentioned display (DSP) 102, the keyboard (HB) 103, the battery (BT) 106, as well as the slot (SLT) 107, the mail receive button (BTN) 104, an indicator 105, a microcontroller (OMC) 112, an external memory (OMEM) 113, and a connector (CN5) 115.

The microcontroller 112 controls the telecommunications operation of the wireless telecommunications unit 10, along with the microcontroller 22 (see FIG. 2) of the wireless telecommunications unit 10, based on the data input from the keyboard 103 and stored in the general-use memory mechanism 10*b*. Furthermore, the microcontroller 112 and the microcontroller 22 possess a display output function that displays on the data input by the keyboard 103 and stored in the general-use memory mechanism 10*b* on the display 102.

Furthermore, in addition to the above-mentioned telecommunications control function, the microcontroller 112 and the microcontroller 22 also function as file management units, writing and reading data to the general-use memory mechanism 10*b* of the wireless telecommunications unit 10.

The memory 113 is a partitioned area which is released by the user, and the user can freely write data into this area. For example, a telephone directory or electronic mail log file recorded in the general-use memory mechanism 10*b* can be written into this area.

The slot 107 has a format making it able to receive the various PC Card types II, III, and IV, and when a PC Card is inserted into the slot 107, this PC Card becomes connected to the connector 115 at the bottom of the slot 107.

The mail receiving button 104 is positioned at the hinge of the housing 101. The user can execute the operations of turning on the power of the mobile terminal 100, sending and receiving mail, and turning the power off, by pressing down on this mail receive button 104. The arrival of new mail or the presence of unsent mail can be checked by the flashing and the color of the light emitted by the indicator 105 formed from a LED or the like. Control over the light emitted by the indicator 105 is carried out by the microcontroller 112.

Since this mobile terminal 100 possesses the keyboard 103 and the display 102, it is possible to set a desirable operating style, such as browsing the World Wide Web (WWW) or accessing various online service networks, by using text communication, electronic mail viewing, or Internet access. However, pressing the mail receive button 104 as described above makes receiving e-mail by a one-button operation very simple. Thus, in the case of text communication such as e-mail, it is a good idea to connect the wireless telecommunications unit 10 to the terminal main body 100*a*.

By combining the wireless telecommunications unit 10 with the terminal main body 100*a* that is suitable for text communication, it becomes possible to send and receive electronic mail, and to process and replay data, and to utilize various online services with a terminal format that has a favorable operating style and compactness. Moreover, since the external interface of the wireless telecommunications unit 10 is a general-use interface, it is possible to reference and process data stored in the wireless telecommunications unit 10 using common data terminal equipment including PDA and personal computers. For example, after storing voice data in the general-use memory mechanism 10*b*, with the wireless telecommunications unit 10 attached to the above-mentioned terminal main body 80*a*, it is possible to perform processing and replay in the mobile unit 100, connecting the wireless telecommunications unit 10 to the terminal main body 100*a*.

It should be noted that the wireless telecommunications unit 10 can be operated by using the battery unit 40 in the mobile terminal 100, without consuming the battery 106 of the terminal main body 100*a*. However, in cases where the capacity of the battery 106 is sufficiently large, the wireless telecommunications unit 10 can be operated using the battery 106, and the battery 43 of the battery unit 40 may be charged. Furthermore, in cases where the capacity of the battery 106 is sufficient, a terminal main body can be selected that has the slot 107 compatible with the Compact Flash Type II format, and the wireless telecommunications unit 10 can be directly attached to the slot 107. Such a terminal main body that has the slot 107 can be made more compact than the above-mentioned terminal main body 100*a*.

Furthermore, when programs and batch data corresponding to the external data equipment terminal main body 100*a* are stored in the program area 32 (see FIG. 3) of the above-mentioned general-use memory mechanism 10*b*, it is possible to switch the operation of microcontroller 112 in the same manner as described in Section A-4 above, and it is easy to process patches (modifications or revisions) of programs pertaining to the operation, or to introduce new operating programs.

In addition, if a flash-type mail reception notification service is used, a user can receive electronic mail at any time, without implementing a receive request from the mobile terminal 100.

Figure 16:
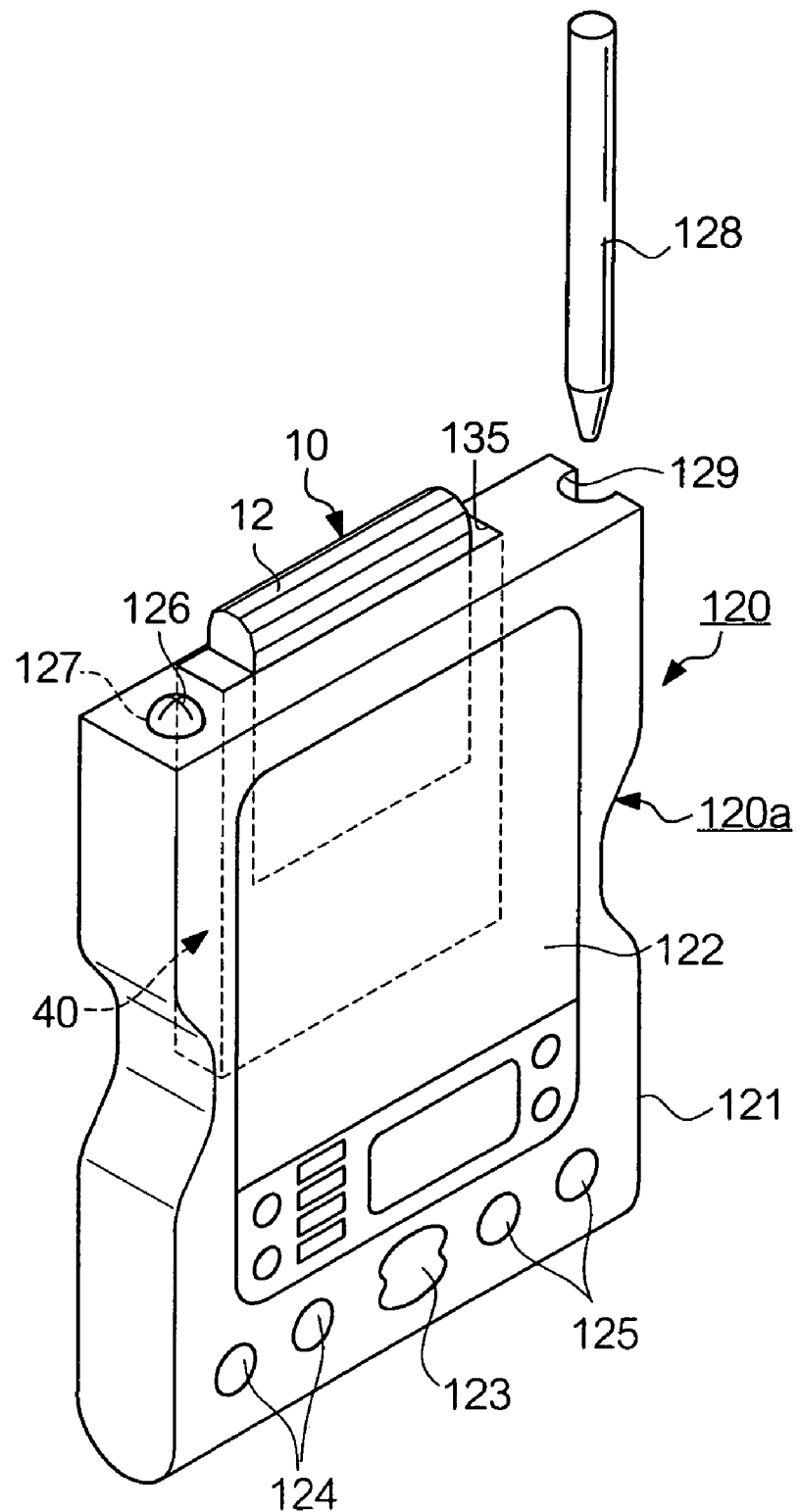
FIG. 16 is an oblique view illustrating the external appearance of the third example of a mobile terminal using a wireless telecommunications unit relating to said embodiment.

A-6. Example 3 of a Mobile Terminal Using a Wireless Telecommunications Unit Relating to this Embodiment FIG. 16 is an oblique view illustrating the external appearance of a mobile terminal with yet another configuration. The mobile terminal 120 shown in the drawing is a mobile terminal provided with the battery unit 40 attached to the above-mentioned wireless telecommunications unit 10, and is provided with the wireless telecommunications unit 10, the battery unit 40, and a terminal main body 120*a* with the battery unit 40 attached.

The terminal main body 120*a* has a housing 121 that is almost a rectangular parallelepiped in shape. On the front surface of the housing 121 are provided a display 122 which has a touch panel function, and a plurality of operating buttons 123, 124, and 125. Also, at the top of the housing 121 is formed a slot 135 into which the battery unit 40 can be inserted. As shown in the drawing, when the battery unit 40 is inserted, the slot 135 is formed so that only the antenna 12 of the wireless telecommunications unit 10 attached to the battery unit 40 is exposed. Consequently, good transmission and receiving sensitivity are maintained, without loss of portability.

The two sides of the slot 135 in the housing 121 are provided, respectively, with a mail receive button 126 and an indicator LED 127, and a pen insert hole 129 is also provided. A pointing device pen 128 is inserted into the pen insert hole 129.

Figure 17:
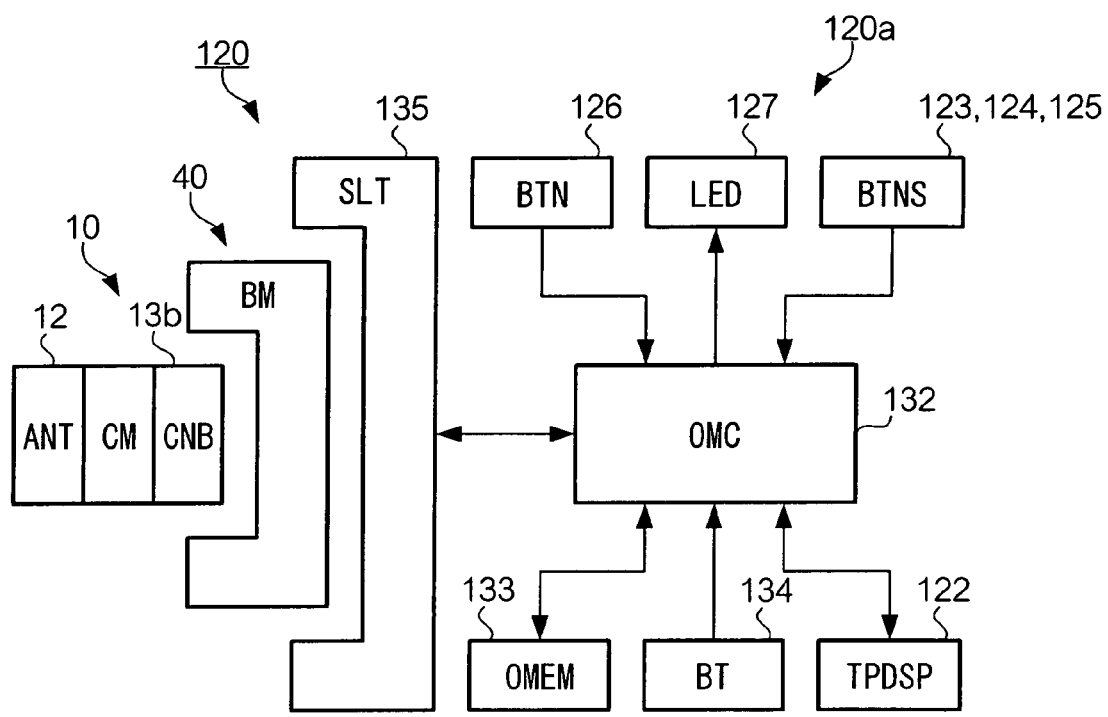
FIG. 17 is a block diagram illustrating the configuration of said mobile terminal.

FIG. 17 is a block diagram illustrating the configuration of the mobile terminal 120. As shown in the drawing, the wireless telecommunications unit 10 attached to the terminal main body 120*a* has the external interface 13*b* for character and pattern data, in addition to the configuration of the wireless telecommunications unit 10 of FIG. 1 and FIG. 2. And the character and pattern data can be sent and received between the terminal main body 120*a*, via the external interface 13*b*.

The terminal main body 120*a* is provided with the above-mentioned display (TPDSP) 122, the operating buttons (BTNS) 123, 124, and 125, the push button (BTN) 126, as well as the indicator LED 127, a microcontroller (OMC) 132, an external memory (OMEM) 133, and a battery (BT) 134.

The microcontroller 132 controls the telecommunications operation of the wireless telecommunications unit 10*a*, along with the microcontroller 22 (see FIG. 2) of the wireless telecommunications unit 10, based on the data input from the display 122 and the operating buttons 123, 124, and 125, and stored in the general-use memory mechanism 10*b*.

Furthermore, the microcontroller 132 and the microcontroller 22 possess a display output function that displays the data input from the keyboard 103 and stored in the general-use memory mechanism 10*b* on the display 102.

Furthermore, in addition to the above-mentioned telecommunications control function, the microcontroller 132 and the microcontroller 22 also function as file management units, writing and reading data to the general-use memory mechanism 10*b* of the wireless telecommunications unit 10.

The memory 113 is a partitioned area which is released by the user, and the user can freely write data into this area. For example, a telephone directory or electronic mail log file recorded in the general-use memory mechanism 10*b* can be written into this area.

The slot 135 has a format making it able to receive the various PC Card types II, III, and IV, and functions as a connector able to connect the PC Card.

The mail receive button 126 is a button indicating the receipt of mail. The user can execute the operations of turning on the power of the mobile terminal 120, sending and receiving mail, and turning the power off, by pressing down on this mail receive button 126. The arrival of new mail or the presence of unsent mail can be checked by the flashing and the color of the light emitted by the indicator 127 formed from a LED or the like. Control over the light emitted by the indicator 127 is carried out by the microcontroller 132.

This mobile terminal 120 possesses the pointing device pen 128, the display device 122 with a touch panel function, and the operating buttons 123, 124, and 125. Therefore, as explained in Section A-5, it is possible to set a desirable operating style, such as browsing the World Wide Web (WWW) or accessing various online service networks, by using text communication, electronic mail viewing, or Internet access. However, pressing the mail receive button 126 as described above makes receiving e-mail by a one-button operation very simple. Thus, in the case of text communication such as e-mail, it is a good idea to connect the wireless telecommunications unit 10 to the terminal main body 120*a*.

By combining the wireless telecommunications unit 10 with the terminal main body 120*a* that is suitable for text communication, it becomes possible to send and receive electronic mail, and to process and replay data, and to utilize various online services with a terminal format that has a favorable operating style and compactness. Moreover, since the external interface of the wireless telecommunications unit 10 is a general-use interface, it is possible to reference and process data stored in the wireless telecommunications unit 10 using common data terminal equipment including PDA and personal computers. For example, after storing voice data in the general-use memory mechanism 10*b*, with the wireless telecommunications unit 10 attached to the above-mentioned terminal main body 80*a*, it is possible to perform processing and replay in the mobile unit 120, connecting the wireless telecommunications unit 10 to the terminal main body 100*a*.

It should be noted that the wireless telecommunications unit 10 can be operated by using the battery unit 40 in the mobile terminal 120, without consuming the battery 134 of the terminal main body 120*a*. However, in cases where the capacity of the battery 134 is sufficiently large, the wireless telecommunications unit 10 can be operated using the battery 134, and the battery 43 of the battery unit 40 may be charged. Furthermore, in cases where the capacity of the battery 134 is sufficient, a terminal main body can be selected that has the slot 135 compatible with the Compact Flash Type II format, and the wireless telecommunications unit 10 can be directly attached to the slot 135. Such a terminal main body that has such a slot can be made more compact than the above-mentioned terminal main body 120*a*.

Furthermore, when programs and batch data corresponding to the external data equipment terminal main body 120*a* are stored in the program area 32 (see FIG. 3) of the above-mentioned general-use memory mechanism 10*b*, it is possible to switch the operation of microcontroller 132 in the same manner as described in Section A-5 above, and it is easy to process patches (modifications or revisions) of programs pertaining to the operation, or to introduce new operating programs.

Figure 18:
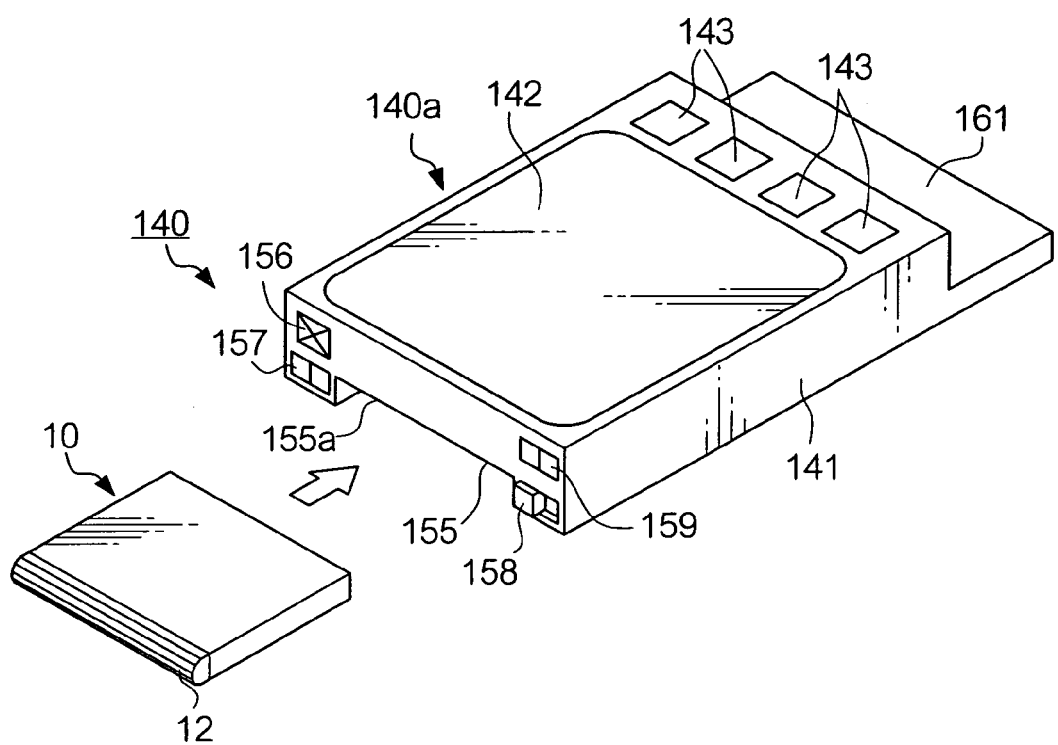
FIG. 18 is an oblique view illustrating the external appearance of the fourth example of a mobile terminal using a wireless telecommunications unit relating to said embodiment.

A-7 Example 4 of a Mobile Terminal Using a Wireless Telecommunications Unit Relating to this Embodiment FIG. 18 is an oblique view illustrating the external appearance of a mobile terminal with yet another configuration. The mobile terminal 140 shown in the drawing is a mobile terminal with the wireless telecommunications unit 10 freely attachable and detachable, and is provided with the wireless telecommunications unit 10, the battery unit 40, and a terminal main body 120*a* with the battery unit 40 attached.

The terminal main body 140*a* has a housing 141, and at the top of this housing 141 are provided a display 142 and a plurality of operating buttons 143. Furthermore, on the side of the housing 141 is formed a slot 155*a*, and the wireless telecommunications unit 10 can be inserted into this slot 155*a*. Here, the slot 155*a* is shaped such that when the wireless telecommunications unit 10 is inserted into the slot 155*a*, only the antenna 12 of the wireless telecommunications unit 10 is exposed, so that good transmission and receiving sensitivity are maintained, without loss of portability. On the opposite side of the surface of the housing 141 on which the slot 155*a* is provided, there is a PC Card format connector 161.

The two sides of the slot 155*a* in the housing 141 are provided, respectively, with a mail receive button 156 and an indicator 157, as well as a charge selection switch 158 and a charge indicator 159.

Figure 19:
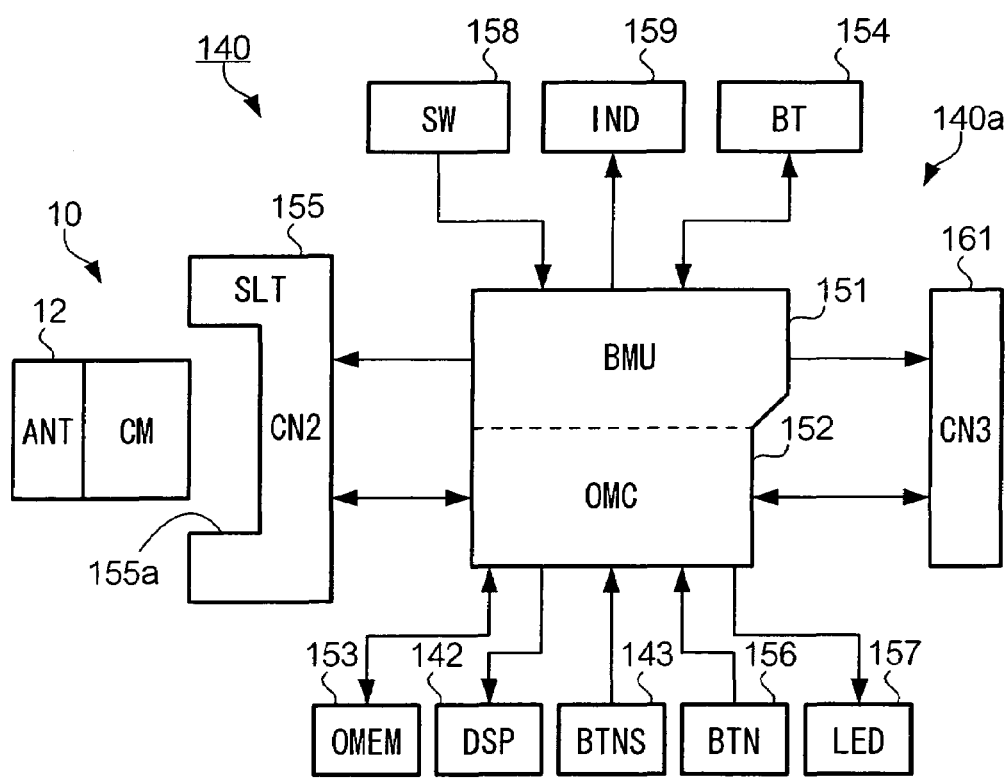
FIG. 19 is a block diagram illustrating the configuration of said mobile terminal.

FIG. 19 is a block diagram illustrating the configuration of the mobile terminal 140. As shown in the diagram, the terminal main body 140*a* is provided with the above-mentioned display (DSP) 142, the operating button (BTNS) 143, the slot (SLT) 155*a*, the mail receive button (BTN) 156, the indicator 157, the charge selection switch (SW) 158, the charge indicator (IND) 159, as well as the connector (CN3) 161, a battery monitoring unit (BMU) 151, a microcontroller (OMC) 152, a battery (BT) 154, a memory (OMEM) 153, and a connector (CN2) 155.

The microcontroller 152 controls the telecommunications operation of the wireless telecommunications unit 10*a*, along with the microcontroller 22 (see FIG. 2) of the wireless telecommunications unit 10, based on the data input from the display 142 and the operating button 143, and stored in the general-use memory mechanism 10*b*. Furthermore, the microcontroller 152 and the microcontroller 22 possess a display output function that displays the content of electronic mail received by the wireless telecommunications mechanism 10*a* and the data stored in the general-use memory mechanism 10*b* on the display 142.

Furthermore, in addition to the above-mentioned the communications control function, the microcontroller 152 and the microcontroller 22 also function as file management units, writing and reading data to the general-use memory mechanism 10*b* of the wireless telecommunications unit 10.

The memory 153 is a partitioned area which is released by the user, and the user can freely write data into this area. For example, a telephone directory or electronic mail log file recorded in the general-use memory mechanism 10*b* can be written into this area.

The connector 155 is a connector capable of connecting the external connector 13 of the wireless telecommunications unit 10, and when the wireless telecommunications unit 10 is inserted into the slot 155*a*, the external connector 13 and the connector 155 are connected.

The mail receive button 156 is a button indicating the receipt of mail. The user can execute the operations of turning on the power of the mobile terminal 140, sending and receiving mail, and turning the power off, by pressing down on this mail receive button 156. The arrival of new mail or the presence of unsent mail can be checked by the flashing and the color of the light emitted by the indicator 157 formed from a LED or the like. Control over the light emitted by the indicator 157 is carried out by the microcontroller 152. The charging mode selection switch 158 is a switch for selecting the charging mode, and the battery monitor part 151 controls the charging of the battery 154 according to the mode set by this charging mode selection switch 158. The charging indicator 159 is an LED or the like that displays the charging status, and light emission is driven by the battery control 151.

This mobile terminal 140 makes it possible to easily receive e-mail by the one-button operation of pressing the mail receive button 126 as described above. Users who primarily view received electronic mail, rather than send electronic mail they have created, don't create or process electronic mail so much, so for them it is sufficient to view, save, delete, or mark for future reference the electronic mail that is received. For such users, it is advantageous to have better portability than to have a keyboard as in the mobile terminal 140. Furthermore, the terminal can readily be made more compact by reducing the number of commands that can be input, such as for viewing, saving, and marking mail for future reference, and this makes it possible to enhance portability.

Moreover, by making the external interface of the wireless telecommunications unit 10 a general-use interface, it becomes possible to reference and process data stored in the wireless telecommunications unit 10 using common data terminal equipment including PDA and personal computers. Therefore, when creating and processing electronic mail, the wireless telecommunications unit 10 should be connected to the above-mentioned terminal main body 100*a* or the terminal main body 120*a*.

Furthermore, since the mobile terminal 140 has the connector 161, it is possible to connect other data equipment or the battery 154 to a charging device (e.g. the charging device 60; see FIG. 4). When connected to other data equipment, the terminal main body 140*a* operates as an adapter with a battery as in the above-mentioned battery unit 40.

Furthermore, when programs and batch data corresponding to the external data equipment terminal main body 120*a* are stored in the program area 32 (see FIG. 3) of the above-mentioned general-use memory mechanism 10*b*, it is possible to switch the operation of microcontroller 152 in the same manner as described in Sections A-4 to A-6 above, and it is easy to process patches (modifications or revisions) of programs pertaining to the operation, or to introduce new operating programs.

As explained above, since the wireless telecommunications unit 10 relating to this embodiment has a highly universal external interface, and the general-use memory mechanism 10b that stores data in a highly universal file format, it is possible to connect it to various types of mobile terminal main units, as shown in Sections A-4 to A-7 (voice communications terminals, keyboard-type terminals, pad-type terminals, and minipad-type terminals). Therefore, the user can select a mobile terminal main body to connect to the wireless telecommunication unit 10 in accordance with the application. For example, when leaving the home or office, in cases where a mobile terminal is used where the wireless telecommunications unit 10 is attached to the terminal main body 80a with excellent portability or the terminal main body 140a (terminal main body 80a in the case of voice communication), and there is a high volume of input involving the creation and processing of electronic mail at home or at the office, it is advantageous to use a terminal such that the wireless telecommunications unit 10 is attached to the terminal main body 100a, the terminal main body 120a, or a notebook or desktop personal computer. In accordance with such an embodiment, the user is able to select a terminal format appropriate to the application. Furthermore, since the wireless telecommunications unit 10 has a simple configuration, being formed from the wireless telecommunications mechanism 10a and the general-use memory mechanism 10b, the system can be easily made more compact, and the mobile terminal connected to the wireless telecommunications unit 10 is also easily made more compact.

B. The Second Embodiment

B-1. Wireless Telecommunications Unit Relating to this Embodiment

Figure 20:
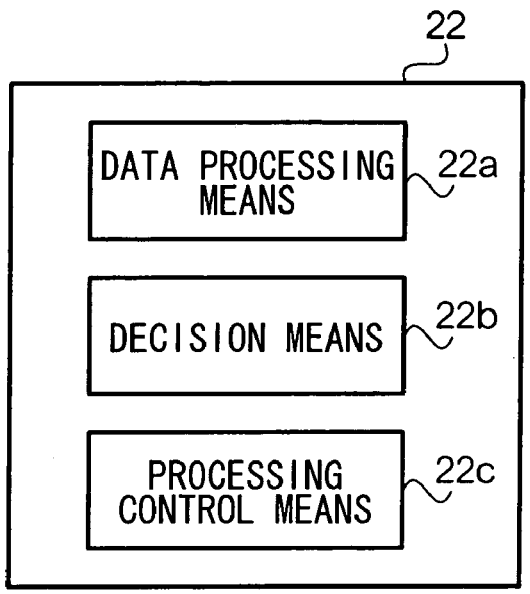
FIG. 20 is a block diagram illustrating only the part relating to functions added to the first embodiment above, out of all functions of the microcontroller in a wireless telecommunications unit relating to the second embodiment of this invention.

The wireless telecommunications unit relating to this embodiment has functions added to the microcontroller 22 in the wireless telecommunications unit of the first embodiment above. FIG. 20 is a block diagram illustrating only the part relating to functions added to the first embodiment above, out of all functions of the microcontroller 22 in this embodiment. As shown in this diagram, the microcontroller 22 in this embodiment has, from a functional standpoint, an additional data processing means 22a, a decision means 22b, and a processing control means 22c.

The data processing means 22a is a means for performing processing of data (hereinafter referred to as "data processing") such as write/read data with respect data transmitted and received by the wireless telecommunications unit 10 and with respect to the memory mechanism 10b.

The decision means 22b decides whether or not there is data processing capacity specified for the external units attached to the wireless telecommunications unit 10, and will, for example, decide whether or not an external unit has a greater data processing capacity (for example, data processing speed) than that of the data processing means 22a. Specifically, for example, identification data (e.g. terminal ID codes) of external units is obtained via an external interface, and the data processing capacity corresponding to the identification data obtained is specified with reference to a data processing capacity table stored in the memory mechanism 10b, and it is determined whether or not this data processing capacity is greater than the data processing capacity of the controller 22. It should be noted that in this case, the decision means 22b obtains in advance the data processing capacity of the data processing means 22a (in other words, the microcontroller 22), and the data processing capacity table contains various identification data and data processing capacities that can be used for external units (or the computing elements of external units). Of course, this embodiment is not limited to this example, and a list that gives the identification data (including the identification data of the microcontroller 22) in the order of their data processing capacity is stored in the memory mechanism 10b, and a decision can be made with reference to this list.

The processing control means 22c modifies the execution format of data processing based on the decision made by the decision means 22b. For example, when it is decided that an external unit has a greater data processing capacity than the data processing means 22a, some or all of the data processing is executed by said external unit.

There can be a variety of situations in which the processing control means 22c should execute some or all of the data processing in an external unit, but in this embodiment, certain types of data processing are to be executed by an external unit. Specifically, the processing control means 22c specifies the types of data processing to be done, and in cases where the data processing capacity of an external unit is greater than that of the data processing means 22a, and when the type of specified data processing is of the desired type, then the external unit is ordered to execute the data processing. It should be noted that this order also contains the data for regulating the operation of the external unit after data processing (e.g., sending the data processing results to the microcontroller 22).

In addition to what was described above, the programs for operating the data processing means 22a, the decision means 22b, and the processing control means 22c, as well as the data processing capacity tables are stored in the program area 32 of the general-use memory (see FIG. 2).

Following is a description of an example of operation of this embodiment.

In the following explanation, when using the data processing means 22a of the microcontroller 22 of the wireless telecommunications unit 10 all by itself, it is possible to execute satisfactorily only data processing on the level of receiving text mail, and the computing element of the external unit of the wireless telecommunications unit 10 to be attached has a greater data processing capacity than the data processing means 22a. Furthermore, the processing control means 22c of the microcontroller 22 is such that the voice recognition processing and the image mail saving processing are set in advance as the desired processing to be executed in the external unit. Moreover, the external unit executes the specified operating system, and has the function of receiving commands from the processing control means 22c of the microcontroller 22.

First, when the wireless telecommunications unit 10 is attached to an external unit, the decision means 22b of the microcontroller 22 of the wireless telecommunications unit 10 receives the identification data of the external unit, and based on this identification data, it was determined that the data processing capacity of the external unit is greater than that of the data processing means 22a.

In cases where the wireless telecommunications mechanism 10a receives voice and image mail, the processing control means 22c determines that the data processing to be executed is the desired data processing that was set in advance (voice recognition processing or image mail saving processing), and commands the execution of the processing of received data (e.g., voice recognition processing and creation of compressed files) that is necessary for the decoding of received data of the wireless telecommunications mechanism 10a and writing files to the memory 23), as well as other processing. Also, the processing control means 22c receives the processing results sent from the external unit as a response, and writes these into the user area 33 of the memory 23.

As described above, in accordance with this embodiment, the data processing that is to be performed by the microcontroller 22 can be executed in an external unit with a greater data processing capacity. Specifically, data processing such as voice recognition processing and image mail saving which can be executed by the microcontroller 22 but which does not obtain sufficient processing quality (data processing speed and data processing precision) are set in advance as the desired processing, and this desired data processing is delegated to the external unit, and the data processing quality can be enhanced in the meantime by executing other data processing in the microcontroller 22. That is to say, it is possible to substantially increase the data processing capacity of the wireless telecommunications unit 10 by effectively utilizing an external unit with a high data processing capacity, without putting an excessive burden on the powerless microcontroller 22. As a result, it is possible to increase the types of data processing that can produce useful quality, and to substantially increase the functions of the wireless telecommunications unit 10.

Furthermore, it is also possible to select any desired advantageous operating style from the many types of operating units, according to the purpose of the operation, by simply attaching or removing the wireless telecommunications unit 10, by configuring the ID data stored in the wireless telecommunications unit 10 from the external unit side so that it can be utilized without preparing a plurality of ID data. Therefore, in accordance with this embodiment, it is possible to enhance the operability of the attachable and detachable wireless telecommunications device formed from the wireless telecommunications unit 10 and the external unit.

Moreover, user data such as mail logs and telephone directories can be easily cross-referenced among a plurality of external units via the wireless telecommunications unit 10, due to the fact that user data in the wireless telecommunications unit 10 can be accessed from the external units by standard procedures. In particular, the above-mentioned cross-referencing can be executed very easily by permitting general-use file access by the specified operating system. Furthermore, it is possible to easily connect a variety of external units by using a compact flash format as an interface format for connecting with external units, without losing portability of the wireless telecommunications unit. This is the same as a PC Card standard format is used as an interface format for connecting with external units. That is to say, in accordance with this embodiment, user data can be easily shared among a plurality of external units.

Incidentally, in this embodiment, an example was given in which high-load data processing that can be executed by an external unit is the desired processing, and all of this desired data processing is delegated to an external unit, but this embodiment is not limited thereto, and load distribution can be implemented, whereby a portion of the desired processing is delegated to an external unit, or even in the case of low-load data processing, it can be delegated to an external unit. Below, examples of the delegation of data processing are categorized by their essential elements.

(1) Delegation of Data Processing with the External Unit as an Essential Element In cases where, for example, the data processing capacity of the external unit is great (for the microcontroller 22 or data processing), the format in which delegation of data processing occurs with an external unit as an essential element involves delegating to the external unit data processing that can be executed by an external unit (e.g., data processing that utilizes only data stored in areas that can be accessed from the external unit side).

(2) Delegation of Data Processing with the Type or Content of Data Processing as an Essential Element As exemplified in this embodiment, the format in which delegation of data processing occurs with an external unit as an essential element involves delegating to the external unit specified data processing that was configured beforehand. Furthermore, data processing that can be executed by an external unit must be delegated to the external unit. Moreover, in cases where an indication of the command for data processing to be executed by the external unit is included (the indication is given is a predetermined intermediate language), the format can be such that execution of the data processing is delegated to the external unit. It should be noted that said predetermined intermediate language can be an executable script embedded in HTML (Hyper Text Markup Language) data.

(3) Delegation of Data Processing with the Microcontroller 22 as an Essential Element In cases where, for example, there is a decrease in the data processing capacity of the microcontroller 22, the format in which delegation of data processing occurs with the microcontroller 22 as an essential element involves delegating to the external unit data processing that can be executed by an external unit. It should be noted that it has been determined that the processing capacity of the microcontroller 22 while other processing is being executed is less than when no processing is being carried out.

It should also be noted that although the above categories are used for the sake of easy understanding, as shown in this embodiment, the delegation of data processing can be carried out based on factors that overlap in a plurality of categories (e.g., the data processing capacity of the external unit and whether or not the specified data processing has been set in advance).

Following are examples of approaches to distributed processing carried out as described above.

① When delegating, all of the data processing is to be executed by the external unit.

② The microcontroller 22 executes only the processing the quality of which can be completely ensured, and the external unit executes the remaining processing.

③ Processing is distributed according to a predetermined ratio. This ratio can be a fixed ratio, or it can be a ratio that depends on the proportion of or difference between the data processing capacity of the external unit and the data processing capacity of the microcontroller 22, or it can be a ratio set in advance according to the data processing.

Of course, it is also possible to combine the above approaches. For example, approach ① can be used when other processing is being executed in the microcontroller 22, and approach ③ can be used in other cases. Furthermore, it is also possible to execute control of the distributed processing in the external unit.

An example of a combination of the above approaches is used in this embodiment, but other combinations are, of course, possible. For example, the processing procedures for the desired data processing (the procedures for task management and work flow management) can be recorded in advance in the memory 23 of the wireless telecommunications unit 10, and then the processing can be distributed at a ratio according to said procedures, in cases where the said data processing prior to execution of the data processing is the desired data processing. Furthermore, in the case of an external unit capable of high-speed data processing of a specified type, all of the data processing of this specified type can be delegated to an external unit. Results similar to these can be obtained by varying the circumstances and the approach for each type of data processing.

Moreover, when decisions are made by the decision means 22b of the microcontroller 22, if the data processing capacity (the data processing capacity that can be allocated to the wireless telecommunications unit 10) of the external unit is substantially specified, and if this specification and said decision are repeated, it is possible to determine the current data processing capacity of the external unit in the microcontroller 22, making it possible to perform the appropriate distributed processing.

If, for example, the data processing capacity of an external unit that can be used by the microcontroller 22 falls below the desired data processing capacity, due to the fact that the external unit is performing other processing, there is no delegation to the external unit, and this approach becomes possible to realize. It should be noted that a specific approach to executing repeated decisions involves the approach of making decisions at specified periods, and making decisions in cases where there is a greater need for distributed processing (e.g., when processing is initiated in the microcontroller 22). Of course, at least a partial delegation of data processing to an external unit can be requested, if the data processing capacity of the microcontroller 22 is substantially repeated and specified, and if the most recent data processing capacity is below the desired data processing capacity.

It should be noted that in this embodiment, the external unit records the specified operating system in advance, but said operating system can also be downloaded from the program area 32 of the wireless telecommunications unit 10. Furthermore, in this embodiment, if distributed processing is carried out using access only by expanded AT commands, since access is permitted using expanded AT commands, there is no need to create a filing system in the user area 33 for the specified operating system.

B-2. Applications

The format for using both the battery unit and the charging device described in the first embodiment above is a format for using the wireless telecommunications unit 10 relating to this embodiment. There is also a format for configuring a variety of mobile terminals explained in the first embodiment above, using the wireless telecommunications unit 10 relating to this embodiment. The specific device configurations using these formats do not differ in any way from those already described in the first embodiment above. Therefore, an explanation of the configuration thereof is avoided here, and instead, a description is given only of the results obtained when the wireless telecommunications unit 10 relating to this embodiment is used in a format that uses them.

B-2-1. Advantageous Effects when the Embodiments of FIG. 4 and FIG. 5 are Used

Even in cases where the battery of the computer 60 has no extra power, long-term operation of the attachable and detachable wireless to telecommunications device is possible since the operating power of the wireless telecommunications unit 10 is supplied by the battery 43 within the battery module 40. Furthermore, it is possible to enhance the data processing capacity of the attachable and detachable wireless telecommunications device, since it is possible to effectively activate the computer 60 which generally has a much greater data processing capacity than the PC Card format wireless telecommunications unit 10, for data processing in the wireless telecommunications unit 10.

B-3. Advantageous Effects when the Embodiments of FIG. 12 and FIG. 13 are Used

The microcontroller 82 of the voice communication external module 80 and the microcontroller 22 of the wireless telecommunications unit 10 share the burden of data processing as appropriate. Here, the shared data processing is data processing for controlling communication of the wireless telecommunications mechanism 10a based on data stored in the memory mechanism 10b, and data processing for outputting data stored in the memory mechanism 10b to the outside, via the display 87 or the speaker 89. By employing an external interface containing the external connector 13a, it is possible to transmit voice signals in an analog signal format. That is to say, the function of encoding/decoding voice signals in the microcontroller 22 is no longer needed, so the configuration of the microcontroller 22 can be simplified. Moreover, since it is possible to write telephone directory files within the wireless telecommunications unit 70 by means of the microcontroller 82 of the voice communication external module 80, there is no longer a need to manage the telephone directory for each of the plurality of voice communication external modules 80 (e.g., a plurality of mobile phones), so the consistency of the telephone directory can be assured.

C. Variations

Figure 21:
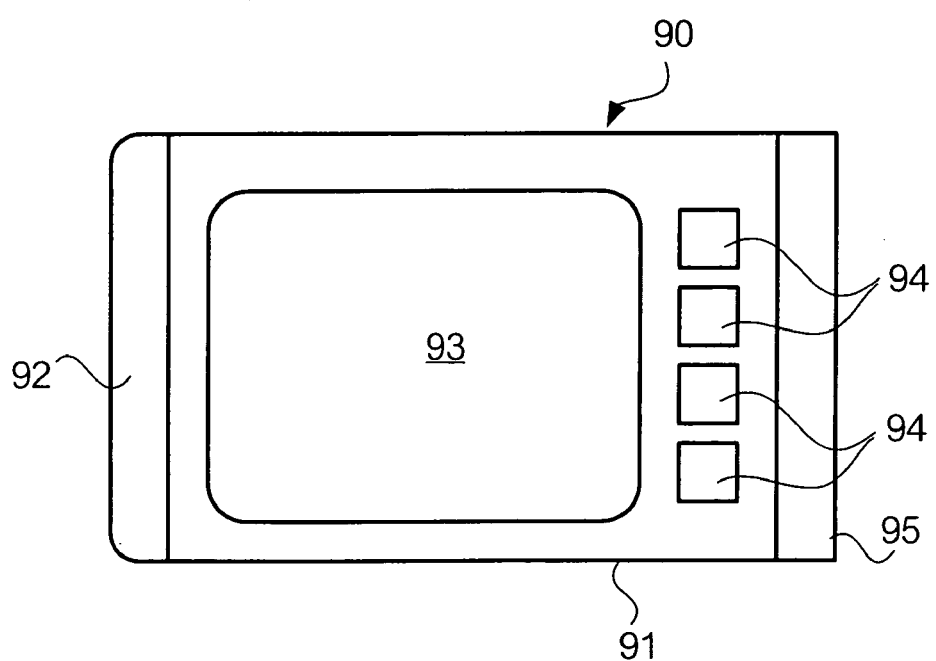
FIG. 21 is a diagram illustrating the external appearance of a wireless telecommunications unit that is a variation on said embodiment.
Figure 22:
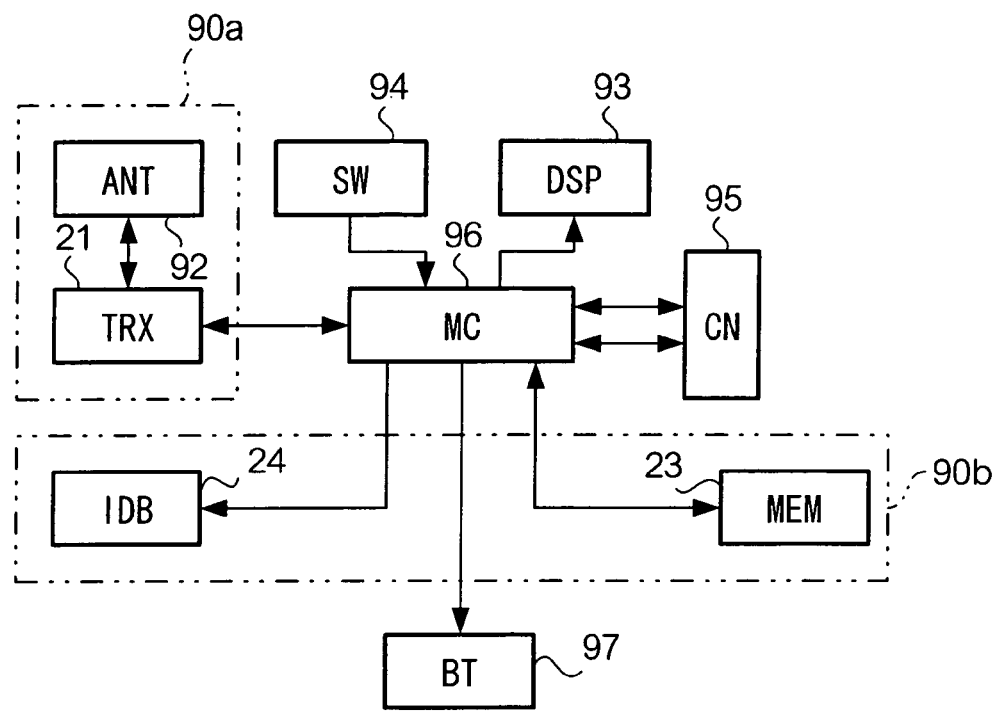
FIG. 22 is a block diagram illustrating the configuration of said mobile terminal.

Following is a description of a variation on this embodiment. FIG. 21 illustrates the external appearance of a wireless telecommunications unit 90 according to this embodiment. FIG. 22 is a block diagram illustrating the internal configuration of the wireless telecommunications unit 90. In these figures, the parts in common with FIG. 1 and FIG. 2 have the same reference numbers, and an explanation thereof is omitted. These figures show that the wireless telecommunications unit 90 of this embodiment can be operated simply using a battery (BT) 97 that is installed.

Furthermore, the wireless telecommunications unit 90 is a small pad model suitable for viewing electronic mail, and it has a flat housing 91 as shown in FIG. 21. This housing 91 is provided with a wireless telecommunications antenna (AT) 92, a display (DSP) 93 for displaying data, a plurality of operating switches (SW) 94, and an external connector (CN) 95 for connecting to external units not depicted. Furthermore, the wireless telecommunications unit 90 has a wireless transceiver 21 that forms a wireless telecommunications mechanism 90a together with the antenna 92, the memory 23, the ID database 24 that forms the memory mechanism 90b together with the memory 23, a microcontroller (MC) 96 that controls the various parts of the wireless telecommunications unit 90, and the battery (BT) 97 that supplies power to the microcontroller 96, which are provided within the housing 91. It should be noted that the wireless telecommunications unit 90 is provided with a cover (not shown) for preventing the exposure of the external connector 95 when it is separated from the external unit.

The microcontroller 96 receives the power supplied by the battery 97, and executes the same functions as the microcontroller 22 in the embodiments. However, communication with an external unit is done through the connector 95. Furthermore, the microcontroller 96 controls the display by the display 93, and functions to receive input from the operating switch 94.

When the wireless telecommunications unit 90 operates by itself, the microcontroller 96 executes data processing to control telecommunications by the wireless telecommunications mechanism 90a, as well as data processing for the display and output of data stored in the memory mechanism 90b on the display 93, based on the data stored in the memory mechanism 90b. It should be noted that the data processing capacity of the microcontroller 96 is on a level capable of realizing a sufficient processing quality, as long as it processes text mail that is received.

On the other hand, in cases where the wireless telecommunications unit 90 is connected to an external unit such as a portable PC via the external connector 95, the external unit and the microcontroller 96 of the wireless telecommunications unit 90 will share the data processing in this variation 3, as in the embodiment. Here, the shared data processing is data processing Here, the shared data processing is data processing for controlling communication of the wireless telecommunications mechanism 90a based on data stored in the memory mechanism 90b, and data processing for displaying data stored in the memory mechanism 90b on the display 93.

Operation of the wireless telecommunications unit 90 relating to this variation is the same as the operation of the wireless telecommunications unit 10 relating to the embodiment, and since the only thing that differs is the content (applications) of the data processing, the explanation is omitted.

According to this variation, it is possible to obtain the same advantageous effects as with the embodiment. The operation is also possible with the wireless telecommunications unit 90 by itself.

It should be noted that a low energy consumption power mode (low voltage and low clock frequency) and a high energy consumption power mode (high voltage and high clock frequency) are provided as operating modes of the microcontroller 96, and the low energy consumption mode is used when operating with the wireless telecommunications unit 90 alone, and the high energy consumption power mode is used, with a power source is used on the external unit side, when connected to an external unit.

It should be noted that such technology is known as a technology for achieving lower energy consumption and higher speeds for CPUs of portable computers.

Furthermore, it is also possible to supply high frequency clock signals from the external unit side to the wireless telecommunications unit 90, shifting the operating mode of the microcontroller 96 to the high energy consumption power mode.

Moreover, in order to guard from heat emission during high speed operation, a heat conduction pathway can be put in place between the external unit and the microcontroller 96. For example, a heat conducting material with sufficient contact surface area and a heat conductivity that is greater than the other parts can be provided at the joint between the wireless telecommunications unit and the external unit. In addition, a heat conducting surface for heat emission can be formed on the back surface of the housing 91 and on both sides, in cases where the housing is inserted into the slot of the external unit.

It should be noted that the present invention is not limited to the embodiments above or to the specific configurations of the variations, and appropriate variations are possible depending on the application.

C. The Third Embodiment

Figure 23:
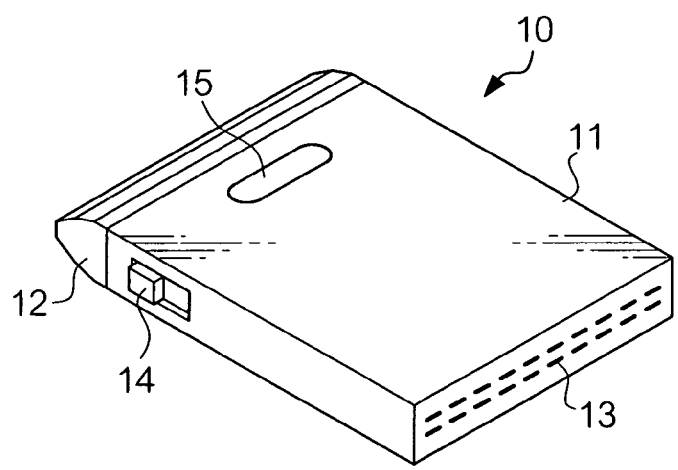
FIG. 23 is a diagram illustrating the external appearance of a wireless telecommunications unit relating to the third embodiment of this invention.

FIG. 23 shows the external appearance of the wireless telecommunications unit 10 relating to this embodiment. The wireless telecommunications unit 10 relating to this embodiment, in contrast to that of the first embodiment, has a light emitting element 15 of a LED or buzzer and the like, serving as a means for announcing the receipt of data.

Furthermore, regarding functions, the wireless telecommunications unit 20 relating to this embodiment can be considered as providing additional functions to the microcontroller 22 of the wireless telecommunications unit 10 relating to this embodiment. Among these additional functions, the primary function is that of controlling the operation of receiving and replaying data, according to the type of data received, as well as the connection state of the external unit in the external interface when data is received.

There are the following two types of operating modes of the microcontroller 22, depending on the function. The user can, for example, designate the operating mode for the microcontroller 22 by employing a device for temporarily writing data that designates the operating mode in a specified memory area in the memory mechanism 10b.

① The First Operating Mode (Rapid Response Mode)

When an external unit is connected to the wireless telecommunications unit 10, the microcontroller 22 acquires the terminal identification number of the external unit and the device data. Based on this acquired data, a determination is made whether or not the functions of the external unit that is connected include the text communication and replay function, voice communication function, the still image data communication and text replay function, or the movie image data communication and replay function, or combinations of these, and the range within which the communication and replay processing is possible is specified by the external unit 10.

Next, when data is received by the wireless telecommunications unit 10, the microcontroller 22 identifies the terminal telephone number and communication mode of the transmission source and the type of data from the attribute data of the various levels of the header data received by the wireless transceiver (TRX) 21, and determines the replay conditions of each received data (file) from the identification data.

In addition, the range within which replay processing is possible determines whether or not the replay conditions are satisfied.

Based on these results, the microcontroller 22 controls data read/write with respect to communication by the wireless telecommunications mechanism 10a and with respect to the memory mechanism 10b.

In further detail, the microcontroller 22 receives the received data and supplies it to the external unit when the received data can be replayed by the external unit while it is connected. By contrast, when the received data cannot be replayed by the external unit while it is connected, the microcontroller 22 writes the received data to the memory 23 in a predetermined format. At this time, if necessary, conversion processing can be performed from the original format of the received data to a format suited to the external unit while it is connected.

On the other hand, when the received data is not that that can be replayed by an external unit while it is connected the microcontroller 22 writes at least the transmission source, the time of receipt, or the type of data to the specified record file of the memory 23.

Based on the data written to this record file, the microcontroller 22 uses a light emitting element (or a buzzer) to notify the user of the wireless telecommunications unit 10 of the reception of the received data that cannot be replayed by the external unit while it is connected.

Moreover, the microcontroller 22 uses the external unit to announce the reception of received data that cannot be replayed, with some type of output format (display screen, flashing light, voice output, or vibrations) that can be output by the external unit.

② The Second Operating Mode (External Unit Exchange Permission Mode)

In this operating mode, when the received data is determined to be data that cannot be replayed by the external unit while it is connected, the microcontroller 22 generates a signal requesting support for the wireless telecommunications channel (channel support request signal) while it is connected, during the specified time required for switching the connection destination of the wireless telecommunications unit 10 to an external unit that can replay the received data, and outputs the channel support request signal to the telecommunications network side by means of the wireless telecommunications means 10a. In detail, the request is to extend the time-out time beyond the usual.

Here, the telecommunications network side is provided with a channel control device that can support the wireless telecommunications channel while it is connected, for a specified period of time when a channel support request signal is received from the wireless telecommunications terminal 1. In addition, during the time that the wireless telecommunications unit 10 of the wireless telecommunications terminal 1 is disconnected from the external unit, the connected wireless telecommunications channel is supported by the channel control device, and when the wireless telecommunications unit 10 is connected to an external unit capable of replaying the received data within a specified time period, the channel is controlled so that the data receipt processing is executed by the wireless telecommunications unit 10 and the external unit. It should be noted that once it is determined that the received data is not data that can be replayed by the external unit while it is connected, an ordinary ringer tone sounds on the on the call origination side for as long as it takes to switch to a designated external unit (the maximum for this period would be the duration of the aforementioned specified time).

Furthermore, when there is received data that cannot be replayed, the microcontroller 22 drives a light emitting element or a buzzer to continue announcing to the user that data has been received, and that the system is waiting for a switch of the connection of the external unit, while the wireless telecommunications unit 10 alone has been detached so as to switch the connection destination of the wireless telecommunications unit to another external unit.

Meanwhile, when the external unit is removed so as to exchange to another external unit, the microcontroller 22 checks whether or not the exchanged external unit is compatible with the replay conditions of the received data. When it is confirmed that the connection switching to an external unit compatible with the replay conditions of the received data by the switching determination means, the microcontroller 22 executes the receipt processing of the received data.

The above describes the functions of the microcontroller 22.

Following is a description of the operation of this embodiment.

① Operating in the First Operating Mode

Following is a description of the operation of this embodiment in the case where data is received by the wireless telecommunications unit 10 in the first operating mode (rapid response mode). It should be noted that in the following explanation, the received data is replayed the same as in a real time system (conversation), or in a cumulative system (mail) (the extent to whether or not there is a repetition of "answering machine talk") so from this point of view, no distinction is made, and the received data is distinguished by the subject, and then separated. Of course, in cases where the received data is multimedia mail including text mail, voice mail, still image mail, and/or movie image mail, it is of course possible to suitably perform processing, giving consideration to the combination of the varieties of mail.

<A1> The Case where an External Unit Possessing the Functions of Receiving and Replaying Received Data is Connected to the Wireless Telecommunications Unit 10 at the Time the Data is Received In this case, the received data is received by the wireless telecommunications unit 10 and replayed by the external unit.

<A2> The Case where an External Unit Possessing the Functions of Receiving and Replaying Received Data is not Connected to the Wireless Telecommunications Unit 10 at the Time the Data is Received In this case, the processing A1–A15 in the table are carried out, in response to the type of received data (the reception mode) and the replay functions of the external unit (terminal mode).

TABLE 1

| Reception mode | Text | Voice | Still Image | Movie Image |
| --- | --- | --- | --- | --- |
| Terminal mode | | | | |
| Text | — | A1 | A2 | A3 |
| Voice | A4 | — | A5 | A6 |
| Still image (with voice) | A7 | A8 | — | A9 |
| Still image (voice capability) | A10 | A11 | — | A12 |
| Movie image (voice capability) | A13 | A14 | A15 | — |

It should be noted that the processing shown in Table 1 is further classified according to the cases of p, q, and r below.

p: The case where the external unit does not have a telecommunications mode corresponding to the received data. (e.g., the external unit does not correspond to the voice communication protocol when there is voice communication.)

q: The case where the external unit has a telecommunications mode corresponding to the received data, but the received data cannot be replayed. (e.g., the external unit corresponds to the voice communication protocol when there is voice communication, but it does not have a speaker)

r: The case where the received data can be converted to alternate data of another format in conformity to the replay function of the external unit.

Following is an explanation of the processing content for each of these cases, for the various combinations of reception mode and terminal mode shown in Table 1.

(1) Processing of Voice Data Using the Text Terminal Mode (Processing A1)

(1-p) When the wireless telecommunications unit 10 does not have the telecommunications function of receiving voice data which is the received data, the caller ID with the telephone number of the caller (the transmission source) and the time of the call are stored as a call receipt history, and the type of received data (voice data) is stored in the memory 23 as text mail.

(1-q) The external unit has the telecommunications function enabling it to receive voice data, but when it does not have the replay means to replay the voice data (e.g. a speaker), the data is automatically received using the same method as an answering machine, and the data is stored in the memory 23 as voice mail.

(1-r) When the wireless telecommunications unit 10 has a voice recognition function, after the data is automatically received using the same method as an answering machine, the voice data which is the received data is converted to text data, and stored in the memory 23 as text mail.

(2) Processing of Still Image Data Using the Text Terminal Mode (Processing A2)

(2-p) When the external unit does not have the telecommunications function of receiving still image data, the caller ID with the telephone number of the caller (the transmission source) and the time of the call are stored as a call receipt history, and the type of received data (still image data) is stored in the memory 23 as text mail.

(2-q) The external unit has the telecommunications function enabling it to receive still image data, but when it does not have the replay means to replay the still image data (e.g. a display screen with the desired resolution), the data is automatically received and is stored in the memory 23 as still image mail.

(2-r) Text conversion of still images cannot be done because the technology does not exist.

(3) Processing of Movie Image Data Using the Text Terminal Mode (Processing A3)

(3-p) When the external unit does not have the telecommunications function of receiving movie image data, the caller ID with the telephone number of the caller (the transmission source) and the time of the call are stored as a call receipt history, and the type of received data (movie image data) is stored as text mail.

(3-q) The external unit has the telecommunications function enabling it to receive movie image data, but when it does not have the replay means to replay the movie image data, the data is automatically received and is stored as movie image mail.

(3-r) Text conversion of moving images cannot be done because the technology does not exist.

(4) Processing of Text Data Using the Voice Terminal Mode (Processing A4)

(4-p) When the external unit does not have the telecommunications function of receiving text data, the caller ID with the telephone number of the caller (the transmission source) and the time of the call are stored as a call receipt history, and stored in the memory 23.

(4-q) The external unit has the telecommunications function enabling it to receive text data, but when it does not have the replay means, the data is automatically received and stored as text mail.

(4-r) The external unit does not have the means to replay text data, but when it has the function of synthesizing voice in accordance with the text data, the type of received data (text data) is displayed if possible, and after being received automatically, voice synthesis performed out of the text data, and stored as voice mail.

(5) Processing of Still Image Data Using the Voice Terminal Mode (Processing A5)

(5-p) When the external unit does not have the telecommunications function of receiving still image data, the caller ID with the telephone number of the caller (the transmission source) and the time of the call are stored in the memory 23.

(5-q) The external unit has the telecommunications function enabling it to receive still image data, but when it does not have the replay means, the data is automatically received and stored as still image mail.

(5-r) Text conversion of still images cannot be done because the technology does not exist. It should be noted that the type of received data (text data) is displayed if possible.

(6) Processing of Movie Image Data Using the Voice Terminal Mode (Processing A6)

(6-p) When the external unit does not have the telecommunications function of receiving movie image data, the caller ID with the telephone number of the caller (the transmission source) and the time of the call are stored in the memory 23. Furthermore, that the type of received data (movie image data) is displayed if possible.

(6-q) The external unit has the telecommunications function enabling it to receive movie image data, but when it does not have the replay means, the data is automatically received and stored as movie image mail.

(6-r) Text conversion of moving images cannot be done because the technology does not exist.

(7) Processing of Text Data Using the Still Image Terminal Mode or the Movie Image Terminal Mode (Processing A7, Processing A10, or Processing A13)

(7-p) When the external unit does not have the telecommunications function of receiving text data, the caller ID with the telephone number of the caller (the transmission source) and the time of the call are stored in the memory 23. Furthermore, that the type of received data (text data) is stored as still image mail.

(7-q). The external unit has the telecommunications function enabling it to receive text data, but when it does not have the replay means (text display function), the data is automatically received and stored as still image mail.

Of course, if the reception and display of text mail is possible, it can be stored as text mail, and after automatic reception, it can undergo image conversion, and be stored as still image mail. In the case of many still image/movie image terminals, text mail reception and display are possible, so there are cases in which it is desirable to show the accumulated still image mail "text" as "images."

(8) Processing of Voice Mail with the Still Image Terminal Mode which is not Capable of Voice Processing (Processing A8)

(8-p) When the external unit does not have the telecommunications function of receiving voice data, the caller ID with the telephone number of the caller (the transmission source) and the time of the call are stored in the memory 23. Furthermore, the type of received data (voice data) is stored as still image mail.

(8-q) The external unit has the telecommunications function enabling it to receive voice data, but when it does not have the replay means (no voice processing), the data is automatically received as in the case of an answering machine, and stored as voice mail.

(8-r) In cases where the external unit has the voice recognition function, after automatic reception, the voice data which is the received data is converted to text data or to image data, and stored as text or still image mail.

(9) Processing of Movie Image Data with the Still Image Terminal Mode (Processing A9 or Processing A12)

(9-p) When the external unit does not have the telecommunications function of receiving movie image data, the caller ID with the telephone number of the caller (the transmission source) and the time of the call are stored in the memory 23. Furthermore, a representative screen of the received data is stored as still image mail.

(9-q) The external unit has the telecommunications function enabling it to receive movie image data, but when it does not have the replay means, the data is automatically received and stored as movie image mail.

(9-r) Since movie image data is a collection of a large number of still image data, it is easy to remove the still image data from the movie image data and display it. The format can involve the detection of scene changes in moving images after they have been automatically received, and displaying representative screens that have been reduced in size (what is called a thumbnail display).

(10) Processing of Voice Data Using the Still Image Terminal Mode or the Movie Image Terminal Mode Capable of Voice Processing (Processing A11, Processing A140)

(10-p) When the external unit does not have the telecommunications function of receiving voice data, the caller ID with the telephone number of the caller (the transmission source) and the time of the call are stored in the memory 23. Furthermore, the type of received data (voice data) is stored as voice mail. Also, the data is automatically received as in the case of an answering machine, and stored as voice mail.

(10-q, r) The case when the external unit has the telecommunications function enabling it to receive voice data is the same as the case when there is a voice message in the voice terminal, so there is no processing corresponding to (10-q) and (10-r).

(11) Processing of Still Image Data Using the Movie Image Terminal Mode (Processing A15)

In this case, since the terminal mode is the movie image terminal mode, the external unit has the function of communicating still image data. Therefore, regardless of the presence or absence of means for replay still images, the data is automatically received, and stored as still image data. Identification processing is of course not necessary.

The above describes the operation of receiving data in this embodiment, combining the reception mode and the terminal mode, and the operation of recording in memory.

It should be noted that in each of the above cases, when the wireless telecommunications unit 10 does not have the telecommunications function enabling it to receive the received data, a response returns to the caller's terminal saying "attributes do not match" or "reception denied" and the call is immediately disconnected.

② Operating in the Second Operating Mode (External Unit Exchange Permission Mode)

When data is received by the wireless telecommunications unit 10, the microcontroller 22 determines whether or not an external unit is connected that is able to replay the received data.

Also, in cases where an external unit is not connected, or if some type of external unit is connected but this external unit is not able to replay the received data, the microcontroller 22 sends to the telecommunications network side a channel support request signal that requests support of the wireless telecommunications channel by the wireless telecommunications means 10*a*.

When the telecommunications network receives the channel support request signal from the wireless telecommunications unit 10, subsequently, for a specified time, channel control is executed which supports the wireless telecommunications channel that is used for communication with the wireless telecommunications unit 10.

Meanwhile, data reception notification is executed to the effect that data has been received that cannot be replayed by the wireless telecommunications unit.

Also, in cases where an external unit is connected that has the function of replaying the received data, the microcontroller 22 executes automatic reception, and supplies to the external unit the received data received by the wireless telecommunications means 10*a*.

The above is the operation using the second operating mode (external unit exchange permission mode)

③ Data Reception Notification

There are several types of methods for executing data reception notification using the data reception operation and a lamp and the like. Following is a description of some examples.

a) The method of notification at the time of receipt from the telecommunications network;

b) The method of notification at the time of storage as mail (that has undergone media conversion);

c) The method of notification of data reception using the light emitting element 15 or the like, without receiving the data, in the above-described second operating mode;

d) The method of returning the response "attributes do not match" and denying reception, without the data remaining in the log.

In the case of (c) above, data receipt communication is possible if the wireless telecommunications unit 10 is promptly detached from the external unit while it is connected as the main body of the terminal, and plugged into a specified external unit for the reception mode.

Meanwhile, a ringer tone is heard on the caller's side, and while channel control such as extending time out is implemented in response to the channel support request signal from the wireless telecommunications unit 10, data reception notification is performed by the light emitting element 15 or the buzzer mentioned above, while switching the connection of the external unit.

④ Format for the Case where the Received Data is Stored as Mail

Next, the following examples can be conceived of as mail headers of text mail that is stored in cases where there is no telecommunications function that can receive received data.

Example of a mail header showing the data reception date:

"Date: Thu, 29 Jul. 1999 19:35:00+0900"

Example of a mail header showing the sender (transmission source):

When it is in the address book

"From: John Doe (123-456-7890)"

When it is not in the address book

"From: (123-456-7890)"

When various attributes are given

"From: No go/cannot be displayed/public telephone"

When there is voice communication

"Subject: Voice communication was received"

When there are still image

"Subject: Still image were received"

When there are movie image
 "Subject: Movie image were received"

In addition, mail headers can be displayed for text mail, voice mail, still image mail, movie image mail, such as "Subject: Text mail," "Subject: Voice mail," "Subject: Still image mail," or "Subject: Moving image mail" Also, "X-type: Text," "X-type: Voice," "X-type: Still," "Still image mail," "X-type: Movie," ""X-type: StillV" can be displayed on mail headers for text mail, voice mail, still image mail, or movie image mail, and still image mail (with voice), respectively.

In further detail, a multimedia mailer can produce a data reception table such as that shown in part (a) of FIG. 24.

⑤ The Operation During Viewing and Replaying the Data Recorded in the Memory 23 (Voice Mail or Movie Mail)

When the user is about to view or replay data recorded in the memory 23, the microcontroller 22 of the wireless telecommunications unit 10 determines whether or not the external unit that is connected at that time possesses the means for replaying the data within the memory 23 which is the object of viewing and replay. In cases where the external unit has such a replay means, the wireless telecommunications unit 10 performs the processing B1–B15 in Table 2, in response to the replay conditions of the data which is to be viewed/replayed, and in response to the replay mode of the external unit.

TABLE 2

| Reception mode<br>Terminal mode | Text | Voice | Still Image | Movie Image |
|---|---|---|---|---|
| Text | — | B1 | B2 | B3 |
| Voice | B4 | — | B5 | B6 |
| Still image (with voice) | B7 | B8 | — | B9 |
| Still image (voice capability) | B10 | B11 | — | B12 |
| Movie image (voice capability) | B13 | B14 | B15 | — |

It should be noted that the processing given in Table 2 is further classified according to the cases of p and r below.

p: The case where the external unit has no means for replaying mail (e.g., there is no speaker for replaying voice mail)

r: The case where the external unit performs the conversion to a format suitable to the external unit Following is an explanation of the processing content for each of these cases, for the various combinations of reception mode and terminal mode shown in Table 2.

(1) Processing when the Content of the Voice Data is Viewed Using the Text Terminal Mode (Processing B1)

(1-p) When the external unit does not have the replay means capable of replaying voice data, it is impossible to replay the voice data itself.

(1-r) When the external unit has the voice recognition function, the voice data is converted to text data by voice recognition, and displayed as text data.

(2) Processing when Still Image Data is Replayed Using the Text Terminal Mode (Processing B2)

In this case, when the external unit does not have a replay mode for still image, the still image data cannot be displayed as it is, but when it is converted to a monochro bit map, it can be displayed on many text terminals.

(3) Processing when Movie Image Data is Replayed Using the Text Terminal Mode (Processing B3)

In this case, when the external unit does not have a replay mode for movie image, the movie image data cannot be displayed as it is, but when it is converted to a monochro bit map, it can be displayed on many text terminals.

(4) Processing when Text Data is Replayed Using the Voice Terminal Mode (Processing B4)

In this case, when the external unit does not have a replay mode for text, the text data cannot be displayed as it is, but when there is also recognition processing, the text data is read by voice synthesis.

(5) Processing when Still Image Data is Replayed Using the Voice Terminal Mode (Processing B5)

In this case, when the external unit does not have a replay mode for still image, still image data cannot be displayed as it is, but when there is also recognition processing, the voice can be replayed alone, if the still image mail includes voice.

(6) Processing when Movie Image Data is Replayed Using the Voice Terminal Mode (Processing B6)

In this case, when the external unit does not have a replay mode for movie image, movie image data cannot be displayed as it is, but the voice can be replayed alone, if the movie image mail includes voice.

(7) Processing when Text Data is Replayed Using the Still Image Terminal Mode or Movie Image Terminal Mode (Processing B7, B10, or B13)

In this case, when the external unit does not have a replay mode for text data, the received data cannot be displayed as it is, but when there is also recognition processing, the text can be converted to image, and displayed as still image mail. It should be noted that text mail reception and display are possible in the case of many still image/movie image terminals, so it is advantageous for the stored still image mail "text" to be shown as "images."

(8) Processing when Voice Data is Replayed Using the Still Image Terminal Mode which is not Capable of Voice Processing (Processing B8)

In this case, since the external unit does not have a replay mode for voice, the received data cannot be displayed as it is, but when there is also recognition processing, voice recognition can be used for text conversion, and the result can be displayed as still image mail.

(9) Processing when Movie Image Data is Replayed Using the Still Image Terminal Mode (Processing B9 or B12)

In this case, since the external unit does not have a replay mode for movie image, representative screens are displayed as still image mail, and representative screens are displayed as reduced and compressed thumbnail displays for each scene change. There is no need for recognition processing, but in the case of movie image mail with voice, voice replay is implemented if voice recognition is possible in Processing B12, and still image mail is displayed if text conversion is possible by using voice recognition in Processing B9.

(10) Processing when Voice Data is Replayed Using the Still Image Terminal Mode or Movie Image Terminal Mode that can Process Voice Data (Processing B11 or B14)

In this case, replay is carried out as voice mail, since the external unit has a replay mode for voice data.

(11) Processing when Still Image Data is Replayed Using the Movie Image Terminal Mode (Processing B15)

In this case, replay is carried out as still image mail, since the external unit does not have a replay mode capable of still image display.

Below is an example of a screen (subject box) in a multimedia mailer. For example, in the case of text mail, a screen in displayed as in part (b) of FIG. 24, for example. Also, in the case of the replay of voice mail a screen is displayed as in part (c) of FIG. 24. It should be noted that in the case of voice mail, the sender and the subject can be converted by voice recognition, although Caller-ID or text transmission by a predetermined protocol are also conceivable.

Furthermore, in the case of still image mail, a screen display such as in part (a) of FIG. 25 is produced (when voice is included, "W" is displayed instead of "S" in front of the sender's name, and in the case of movie image mail, a screen display such as in part (b) of FIG. 25 is produced, and when media conversion is completed, a screen display such as in part (c) of FIG. 25 is produced. It should be noted that in the case of both still image mail and movie image mail, conversion can be performed using voice recognition, but Caller-ID or text transmission by a predetermined protocol are also conceivable.

As explained above, according to this embodiment, a determination is made as to whether or not the received data is data that can be replayed by an external unit while in use, and in cases where the replay functions of the external unit being used are insufficient, selective data reception control is carried out in response to the replay functions of the external unit and to the replay conditions for each received data. Therefore, it is possible to eliminate wasted communication, so the communication efficiency can be raised.

Moreover, when the replay functions are insufficient, the transmission source data, data receipt time, and the received data are each stored separately in the memory mechanism 10b, and since the user is informed by the external unit that data has been received, based on this recorded data, even in cases where the received data cannot be received by the external unit during use, the user can receive the necessary data reception notifications and summary notifications. Therefore, based on this notification, the user is able to attach or detach the wireless telecommunications unit 10 to any external unit with suitable replay functions, thereby making highly efficient wireless telecommunications possible.

Moreover, since it is possible to change the replay mode of the received data to a replay mode suitable for the external unit in use or to another predetermined replay mode, the range of viewability and replayability can be expanded. In addition, the operability can be greatly enhanced by notifying the user that there has been conversion processing such as recognition processing and the like.

Also, in this embodiment, it is possible to select a desirable operating style from among a plurality of types of external units depending on the purpose of the operation, while keeping the telephone numbers and related ID data in the memory mechanism 10b, simply by replacing the wireless telecommunications unit 10. As a result, it becomes possible to enhance the operability of the wireless telecommunications terminal 1, as well as to cross reference mail logs and telephone directories as general-use files among a plurality of terminal formats (the wireless telecommunications unit 10 and a plurality of types of terminals formed from several external units from among a plurality of types).

It should be noted that in this embodiment, processing when data is received that cannot be replayed by the current external unit is not limited to the above-described processing, and data reception notification can be carried out according to the reception mode (differences in the type of received data such as voice, image, and text, and the difference between replaying in real time or after being stored), or according to the type of external unit currently in use, and in the case where data reception notification is carried out, but if there is time out, automatic conversion to replayable data can be accomplished by the current external unit, or a data receipt method whereby reception is denied when attributes do not match can be selected as desired.

The format for using the wireless telecommunications unit 10 relating to this embodiment is a format that uses both the battery unit and the charging device described in the first embodiment above. Furthermore, another format involves various mobile terminals that are configured as explained in the first embodiment, using the wireless telecommunications unit 10 relating to this embodiment. The specific device configurations when these formats are used do not at all differ from those that have been already described in the first embodiment. Thus, the description thereof is omitted here.

D. The Fourth Embodiment

The wireless telecommunications unit relating to this embodiment has functions that are added to the wireless telecommunications unit relating to the first embodiment.

Figure 26:
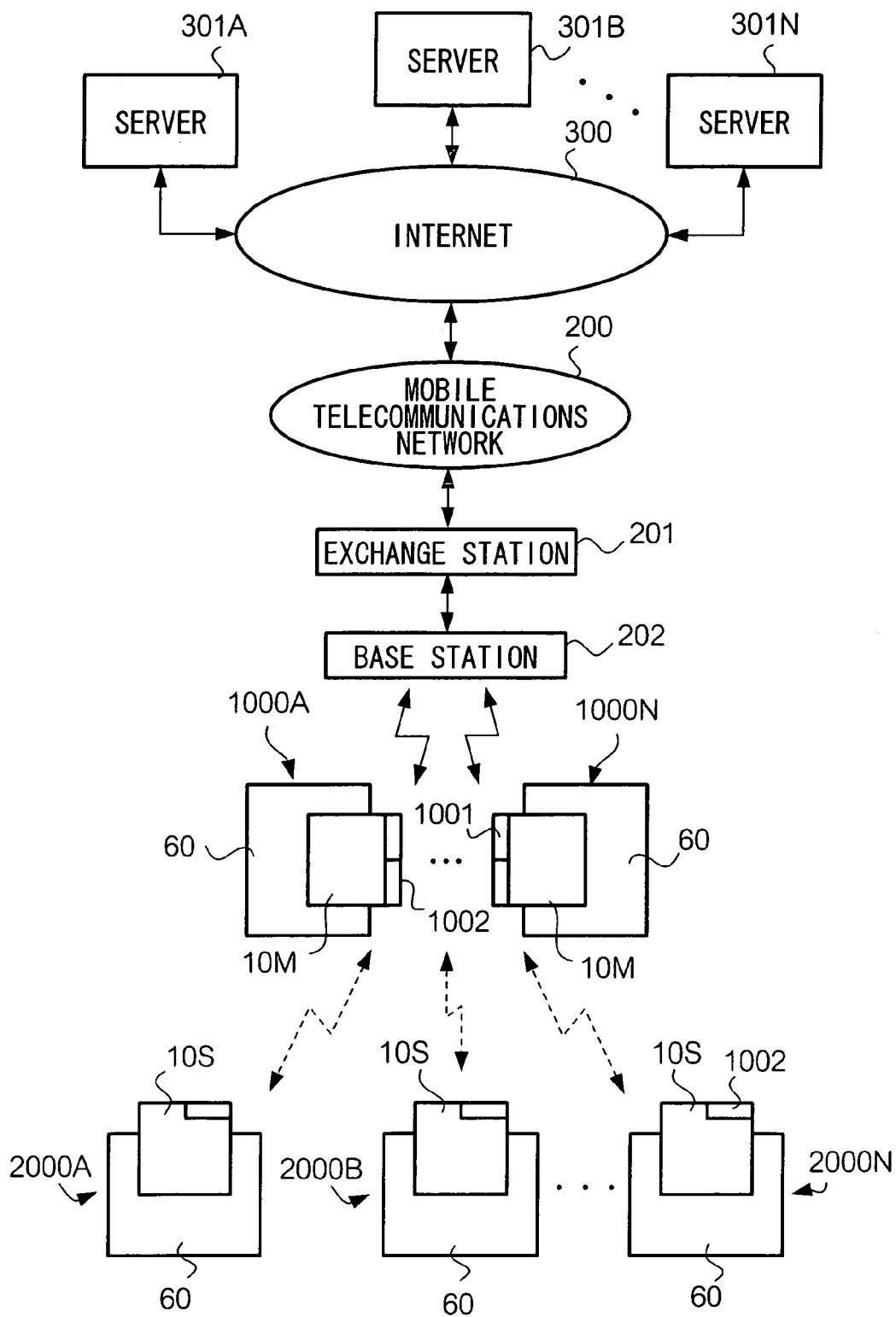
FIG. 26 is a diagram illustrating the first example of a data telecommunications system utilizing a wireless telecommunications unit relating to the fourth embodiment of this invention.

D-1. First Example of a Data Communications System Using a Wireless Telecommunications Unit Relating to this Embodiment D-1-1. Overall Configuration FIG. 26 is a schematic diagram showing the first example of a data telecommunications system using a wireless telecommunications unit relating to this embodiment.

As shown in the diagram, this data telecommunications system generally consists of the Internet 300, servers 301A, 301B . . . 301N (hereinafter referred to as the server 301 when there is no need to distinguish among them) connected to the Internet 300, mobile telecommunications network 200, master wireless data terminals 1000A, 1000B . . . 1000N (hereinafter referred to as the master wireless data terminal 1000 when there is no need to distinguish among them), and slave wireless data terminals 2000A, 2000B . . . 2000N (hereinafter referred to as the slave wireless data terminal 2000 when there is no need to distinguish among them).

Here, the server 301 is a computer connected to the Internet 300 via a router that is not pictured. This server 301 stores various data, and when it receives requests for data, it responds by sending said data to the request source. Here, examples of data include news, electronic books, image, movies, and the like. The servers 301A–301N have the addresses IPA–IPN, respectively.

The master wireless data terminal 1000 sends and receives data between a base station 202 connected to the mobile telecommunications network 200 through a switching station 201, using a packet switching system in wide-area wireless telecommunications. Furthermore, the master wireless data terminal 1000 sends and receives data between a slave wireless data terminal 2000, using short distance wireless telecommunications known as Bluetooth. Moreover, the slave wireless telecommunications terminal 2000A–2000N sends and receives data between other slave wireless data terminals, using short distance wireless telecommunications.

Here, wide-area wireless telecommunications refers to wireless telecommunications within a range of several kilometers.

Also, short distance wireless telecommunications (Bluetooth) refers to wireless telecommunications within a range of several 10 meters.

Bluetooth is a technology for telecommunications at a bit rate of 1 Mbps, and in a wavelength band of 2.45 GHz. It can be freely used without a license. Bluetooth differs from systems using IR light in that it can be used even if there are obstacles, as long as the distance between the equipment is within 10 meters, since it uses a wavelength band of 2.4 5 GHz.

Figure 27:
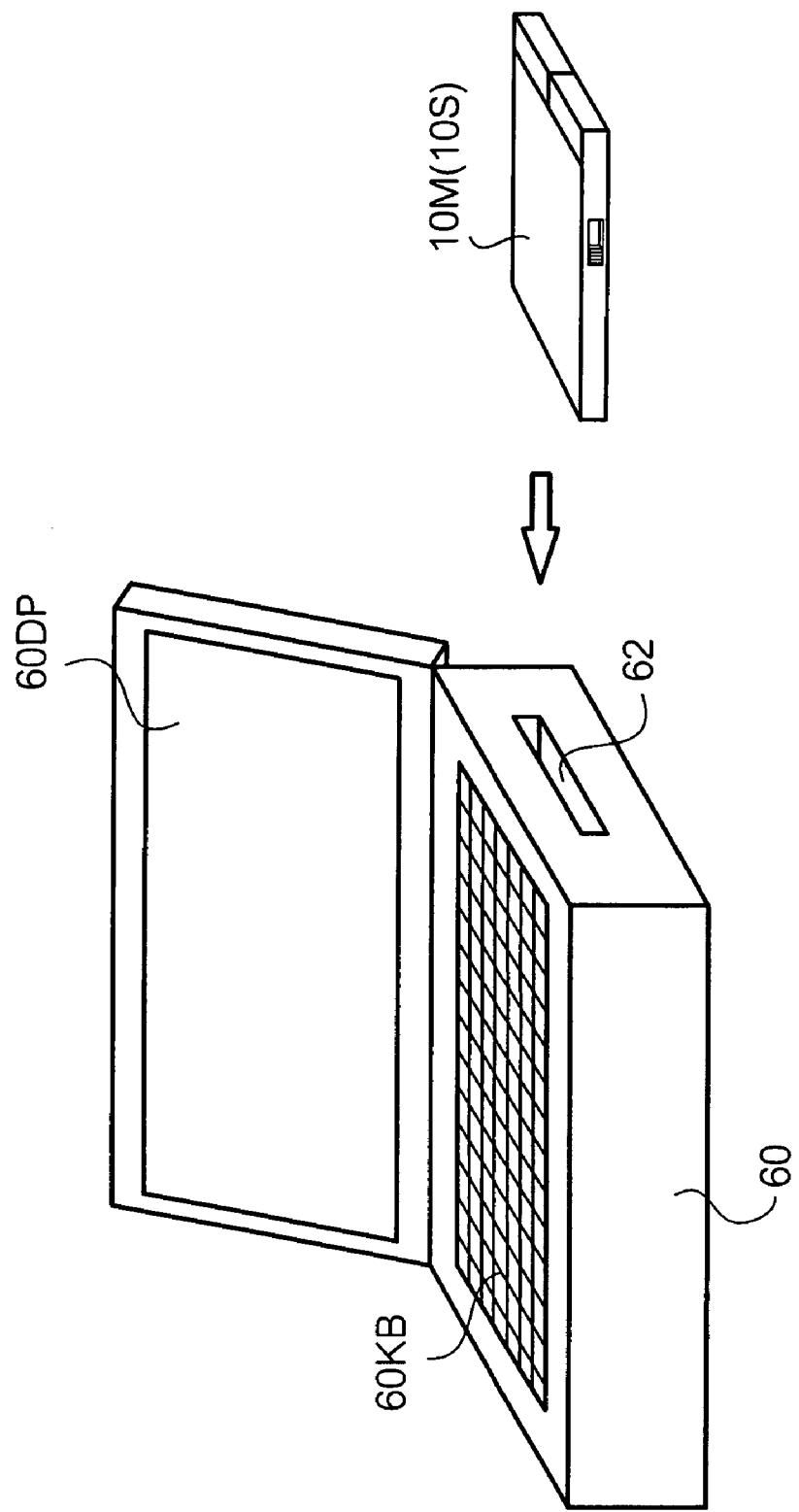
FIG. 27 is an oblique view illustrating the configuration of a master wireless data terminal in said embodiment.

As shown in FIG. 27, the master wireless data terminal 1000 has a master PC card 10M which is a wireless telecommunications unit relating to this embodiment inserted into the card slot 62 of the external unit 60 such as a personal computer. Here, the wireless telecommunications unit PC card 10M is provided with a wide-area wireless telecommunications unit 1001 for wide-area telecommunications, and a short distance wireless telecommunications unit 1002 for short distance telecommunications.

On the other hand, as shown in FIG. 27, the slave wireless data terminals 2000A–2000N has a slave PC card 10S which is a wireless telecommunications unit relating to this embodiment inserted into the external unit 60 such as a personal computer. Here, the slave PC card 10S has only the short distance wireless telecommunications unit 1002 for short distance telecommunications.

The PC cards 10M and 10S inserted into the external unit 60 are recognized as ordinary Standard AT Modems by the external unit 60.

The external unit 60 mainly consists of a CPU, ROM (Read Only Memory), RAM (Random Access Memory), hard disk, user interface (not pictured), and the card slot 62.

ROM is read-only program memory, CPU executes control programs read from ROM, and these parts control the various parts of the wireless data terminal. RAM is used as a work area when executing various control programs.

Various types of software and data used by the user are stored in the hard disk. The software stored in this hard disk can be data communication software, Internet access software for accessing the Internet 300 via a provider, or other common software. The user interface consists of a display part 60DP for displaying various types of data such as web pages and electronic mail, and a key operation part 60 KB for the user to perform key operations (see FIG. 2).

It should be noted that the external unit 60 can be a PDA in addition to being a computer.

D-1-2. Configuration of the Wireless Telecommunications Unit (PC Card)

Figure 28:
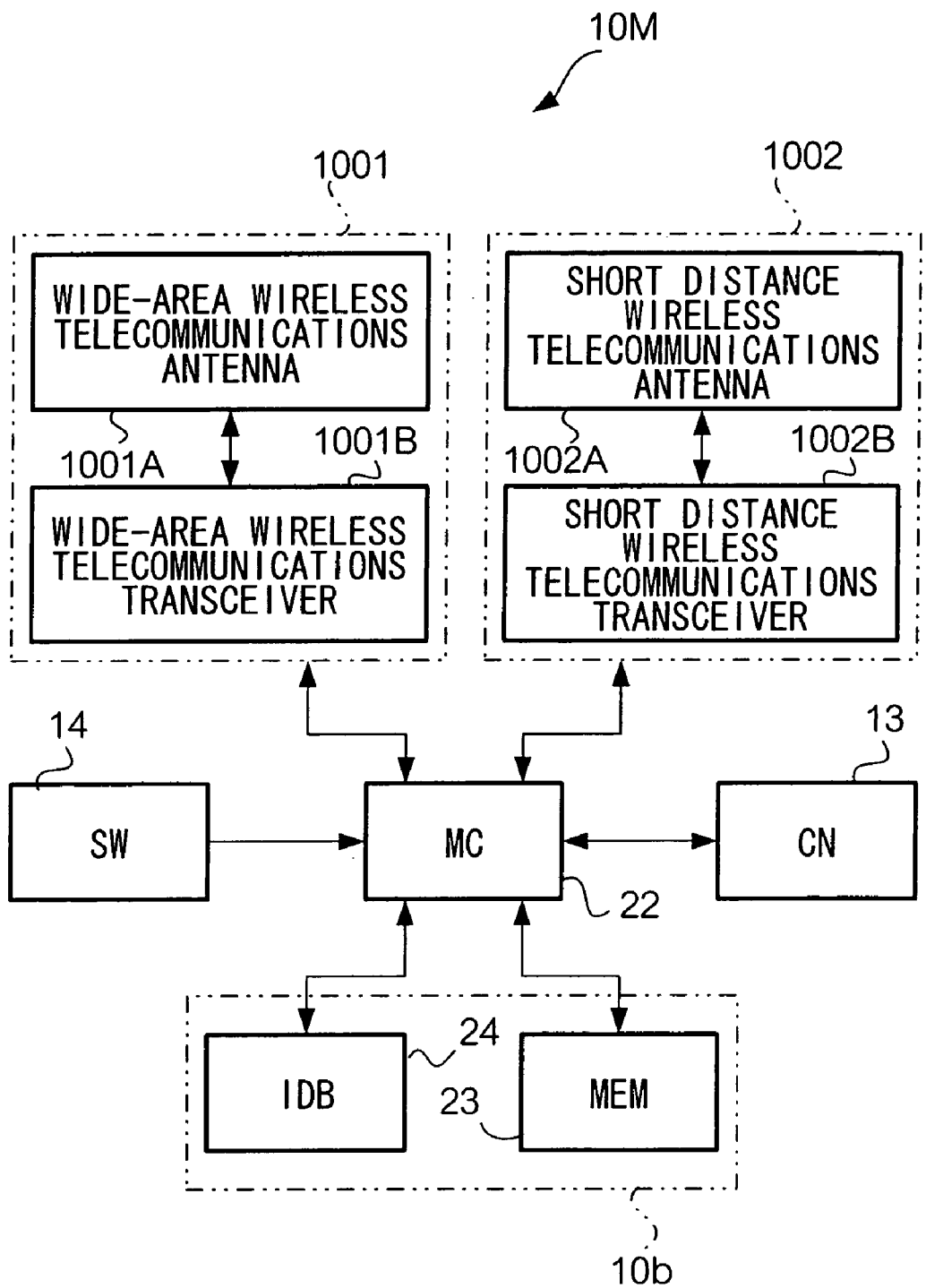
FIG. 28 is a block diagram illustrating the configuration of a master PC card forming said master wireless data terminal.
Figure 29:
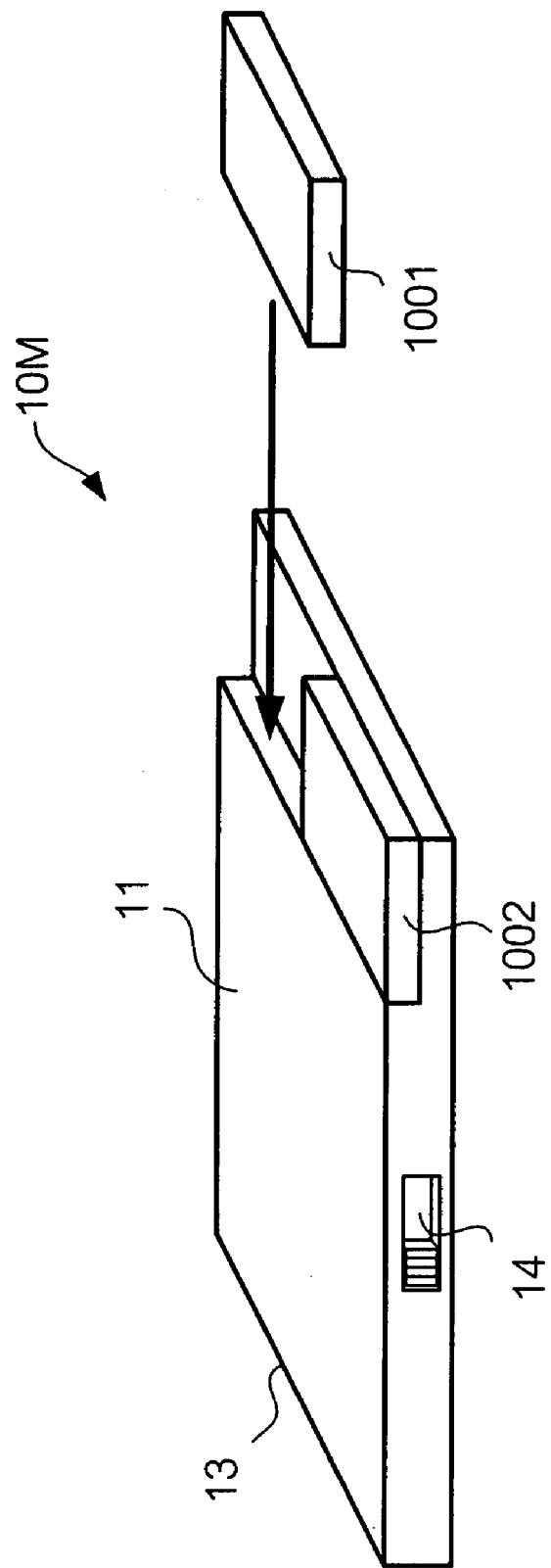
FIG. 29 is an oblique view illustrating the external appearance of said master PC card.
Figure 30:
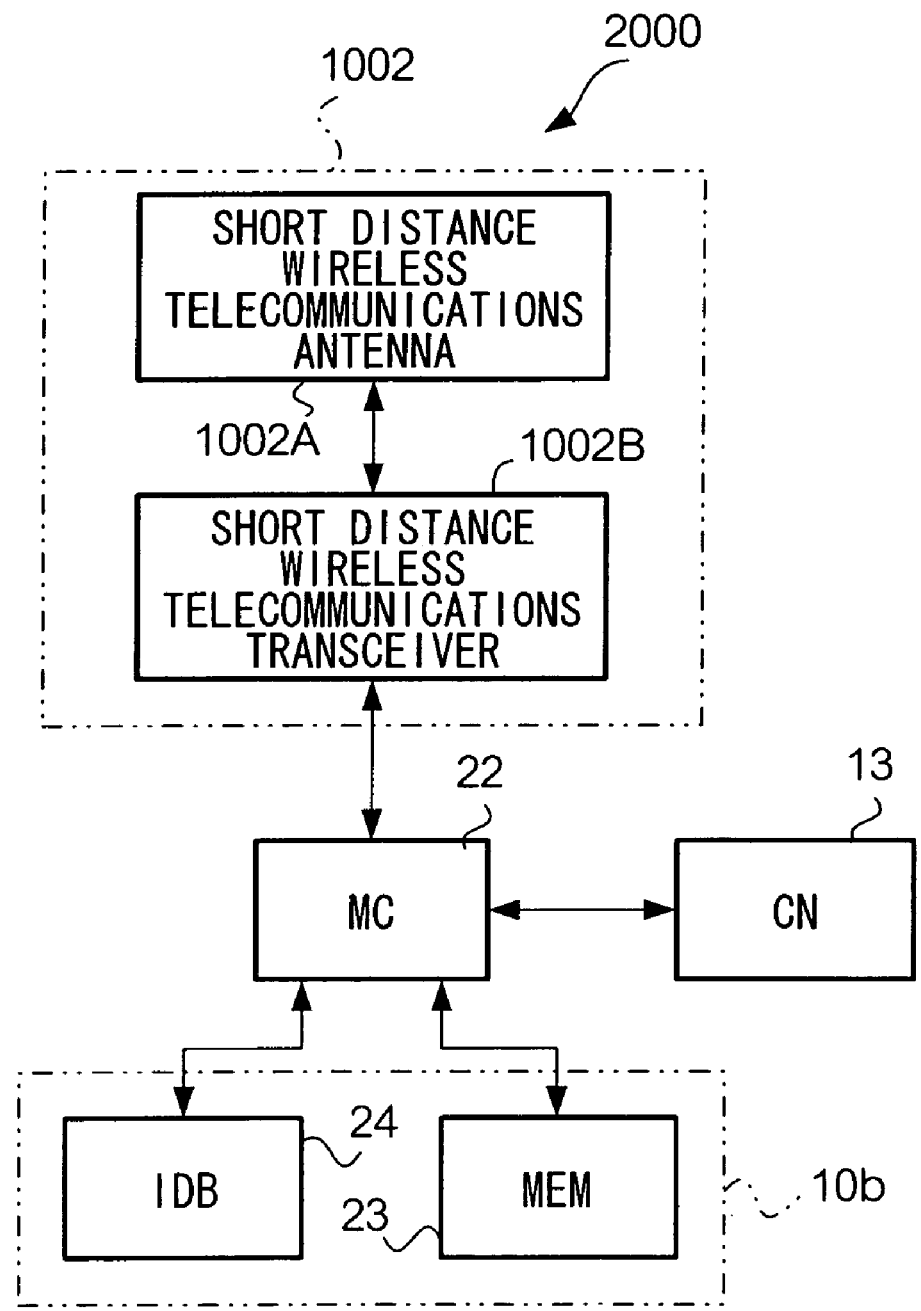
FIG. 30 is a block diagram illustrating the configuration of a slave PC card in said embodiment.

Following is an explanation of the PC cards 10M and 10S forming the wireless telecommunication unit, with reference to FIG. 28 to FIG. 30.

D-1-2-1. Configuration of the Master PC Card 10M

FIG. 28 is a block diagram illustrating the configuration of the master PC card 10M that forms the master wireless data terminal 1000 by inserting it into the card slot 62 of the external unit 60. This master PC card 10M is provided with the wide-area wireless telecommunications unit 1001 and the short distance wireless telecommunications unit 1002 as the wireless telecommunications mechanism 10a in the wireless telecommunications unit 10 (see FIG. 2) is the first embodiment.

The wide-area wireless telecommunications unit 1001 is formed from a wide-area wireless telecommunications antenna (AT) 1001A and a wide-area wireless telecommunications transceiver 1001B. This wide-area wireless telecommunications unit 1001 sends and receives data by wide-area telecommunications between the base station 202 connected to the mobile telecommunications network 200, using a PDC (Personal Digital Cellular) or a PHS.

The short distance wireless telecommunications unit 1002 consists of the short distance wireless telecommunications antenna (AT) 1002A and the short distance wireless telecommunications transceiver 1002B. This short distance wireless telecommunications unit 1002 sends and receives data by short distance wireless telecommunications between the short distance wireless telecommunications unit 1002 of another PC card.

When Bluetooth is used, the short distance telecommunications antenna 1002A can be a small one on the order of 0.5 square inches. It has the advantage over IR light in that it consumes little energy. Of course, other systems can be used, as long as it involves wireless telecommunications technology only between specified equipment for short distances.

In the ID database 24 are recorded identification numbers for wide-area wireless telecommunications (e.g., telephone numbers) and identification numbers for short distance wireless telecommunications. In further detail, identification numbers TIDa–TIDn for wide-area wireless telecommunications and identification numbers PIDa–PIDn for short distance wireless telecommunications are recorded in the ID database 24 of each master PC card 10M of the master wireless data terminals 1000A–1000N.

In addition to having the same functions as the microcontroller 22 in the first embodiment, the microcontroller 22 here has special functions.

One of these functions is the data relay function. That is to say, the microcontroller 22 has the data relay function of sending packet data received via the wide-area wireless telecommunications unit 1001 to the PC card 10S of the slave wireless terminals 2000A–2000N by the short distance wireless telecommunications unit 1002, and sending packet data received from the PC card 10S of the slave wireless terminals 2000A–2000N via the short distance wireless telecommunications unit 1002 to the base station 202 of the mobile telecommunications network 200 by the wide-area telecommunications unit 1001. The microcontroller 22 also has the function of converting or managing addresses for communication by technology such as IP masquerade or NAT (Network Address Translator) for data relay.

Moreover, the microcontroller 22 monitors the telecommunications resources of the wide-area telecommunications unit 1001, and has the function of sending data relating to the telecommunications resources to the slave wireless data terminal 2000, going around the short distance wireless telecommunications unit 1002. Transmission of this resource data is carried out in cases where there is a request for data from the slave wireless data terminal 2000.

Here, resource data refers to network resources (bandwidth) that can be used in wide-area wireless telecommunications, the receiving status, battery reserve (stamina), and the like.

Bandwidth of network resources is the bit rate (transmission speed) that can be used in wide-area telecommunications when connected to the mobile telecommunications network 200. The receiving status indicates the receiving status in the PC card 10M with respect to signals sent from the base station 202. Moreover, the battery reserve refers to the reserve of driving power for the PC card 10M supplied by the battery (not pictured). In some cases, this battery is installed in the PC card 10M, and in some cases it is installed in the external unit 60.

The above is the detailed configuration of the master PC card 10M.

FIG. 29 illustrates the external appearance of the PC card 10M.

The PC card 10M consists of a card main body as the housing 11 containing the controller 22, the wide-area wireless telecommunications unit 1001 and the short distance wireless telecommunications unit 1002 provided attachably and detachably to the side of the card main body 11. The switch 14 is deployed on the side of the card main body 11, and the connector 13 is positioned at the front end.

In this embodiment, the switch 14 is used to manually switch the telecommunications operation of the PC card 10M (i.e., the telecommunications functions of wide-area wireless telecommunications+short distance wireless telecommunications, and the telecommunications functions of short distance wireless telecommunications alone).

D-1-2-2. Configuration of the Slave PC Card 10S

FIG. 30 is a block diagram illustrating the configuration of the slave PC card 10S that forms the slave wireless data terminals 2000A–2000N by being inserted into the card slot 62 of the external unit 60. The slave PC card 10S has only the short distance wireless telecommunications unit 1002 as a wireless telecommunications means.

The microcontroller 22 transmits data supplied from the external unit 60 via the connector 13 to the master PC card of the master wireless terminal by the short distance wireless telecommunications unit 1002, or it has the function of supplying packet data received by the short distance wireless telecommunications unit 1002 to the external unit from the connector 13. Furthermore, the microcontroller 22 has the function of selecting which master wireless data terminal to use in the relay, from among the master wireless data terminals 1000A–1000N.

Identification numbers for short distance wireless telecommunications are recorded in the ID database 24.

D-1-3. Configuration of the Server 301

Figure 31:
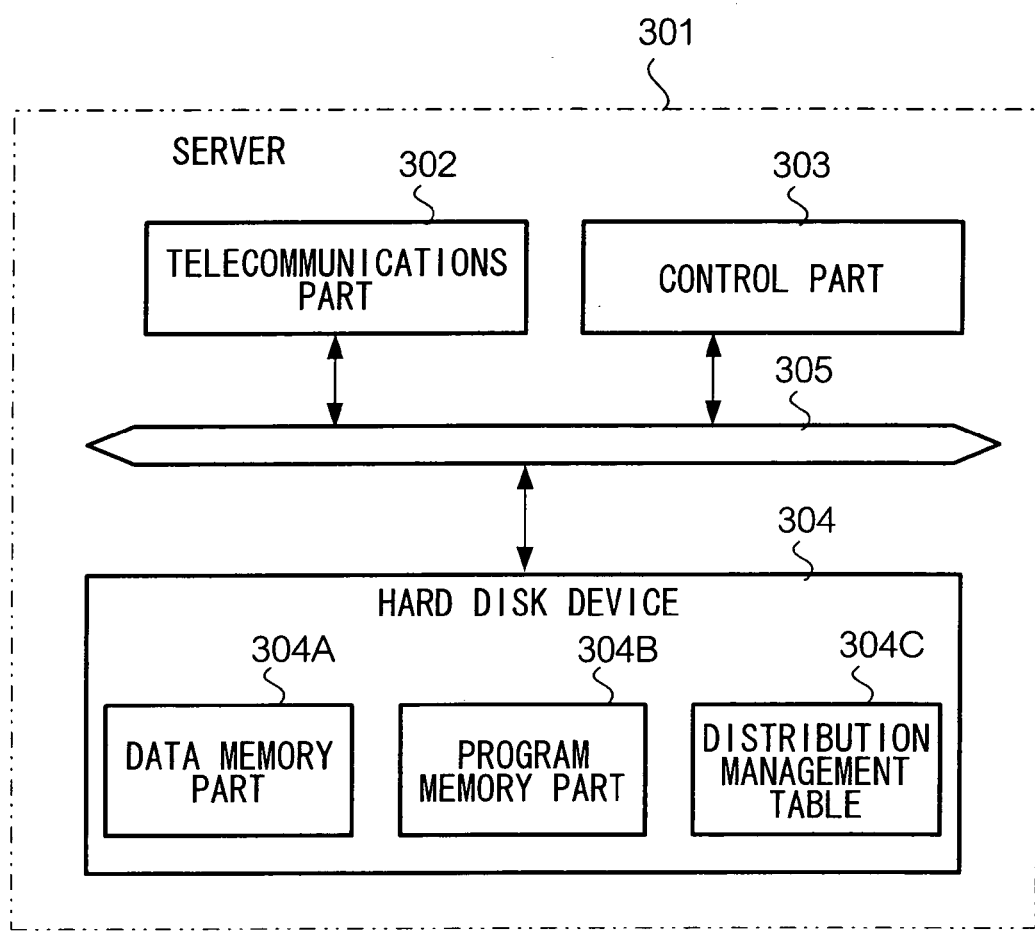
FIG. 31 is a block diagram illustrating the configuration of a server in said embodiment.

FIG. 31 is a block diagram illustrating the configuration of the server 301 for the Internet 300. The server 301 has a telecommunications unit 302, a control unit 303, a hard disk device 304, and a bus 305 that connects these to each other.

The telecommunications unit 302 consists of a modem which is not pictured, and telecommunications control circuits, and is connected to the Internet via a router. The telecommunications unit 302 performs packet communication between the master wireless data terminal 1000 via the Internet 300 and the mobile telecommunications network 200.

The control unit 303 consists generally of a CPU (not pictured), ROM, and RAM. ROM is program memory that stores control programs. The CPU performs the overall control of the server 301 by executing control programs read from RAM. RAM is used as a work area of the CPU.

The hard disk device 304 has memory areas known as a data memory unit 304A, a program memory unit 304B, and a data distribution control table 304C.

A plurality of contents, identification codes for the various contents, and menu data derived from the titles of the various contents are recorded in the data memory unit 304A.

Here, content includes text data showing characters and symbols, music data showing voice and music, image data showing still image and movie image, game software, and other computer programs. Furthermore, music data can be compressed according to the MP3 (MPEG Layer 3) format, image data can be compressed according to the GIF (Graphics Interchange Format) format, JPEG (Joint Photographic Experts Group) format, or the MPEG (Moving Photographic Experts Group) format.

The program memory unit 304B contains a data distribution program and an authentication program. A data distribution program is a program which has the control unit 303 control the packetizing and transmission of content requested by the master wireless data terminal 1000. Furthermore, an authentication program is a program for user authentication, employing user IDs and passwords stored in the data distribution control table 304C.

Identification numbers TID, user IDs, and passwords are stored in advance in the data distribution control table 304C so as to wireless data terminal 1000 (user) requesting the content.

D-1-4. Example of Data Telecommunications System Operation

Figure 32:
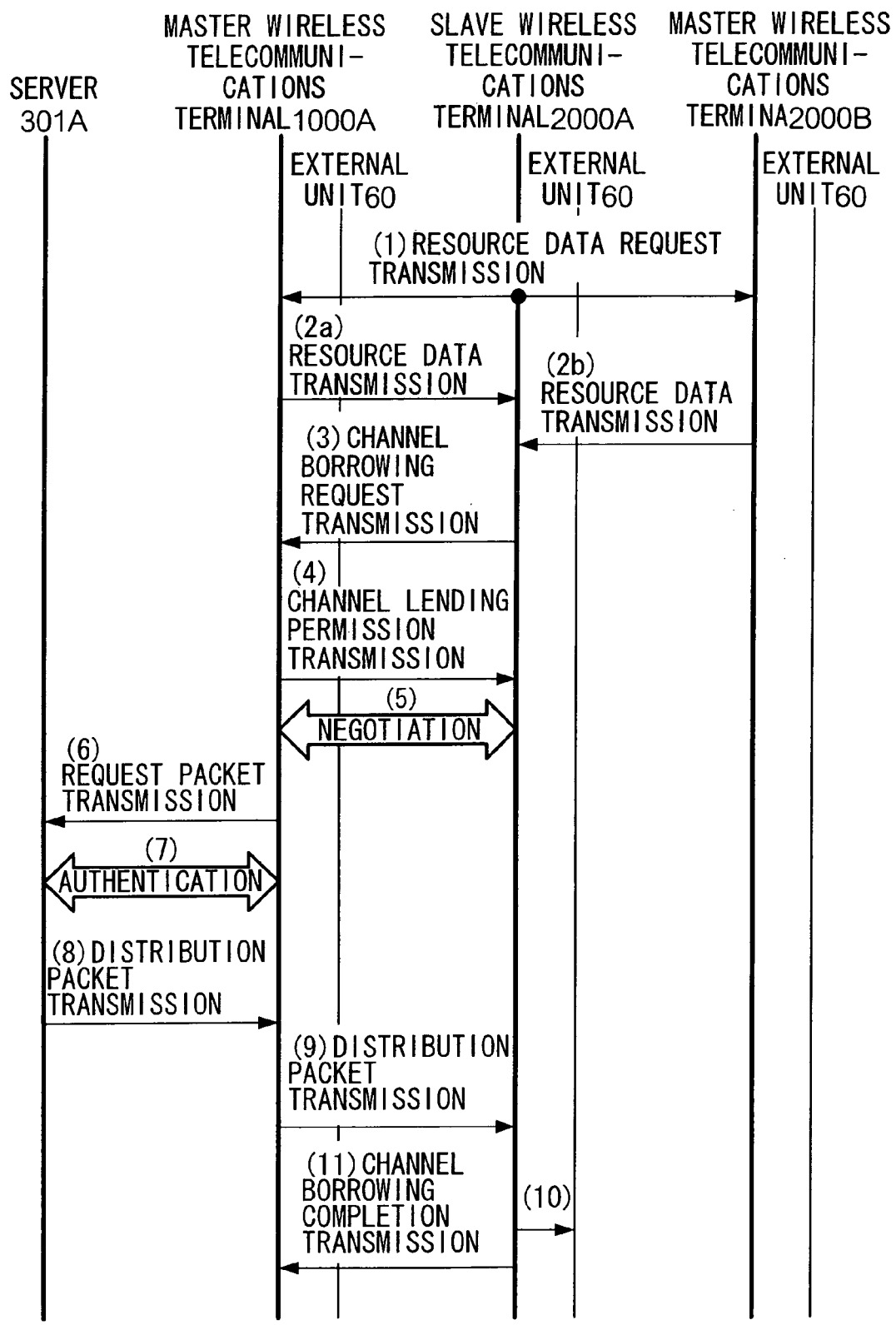
FIG. 32 is a sequence chart illustrating the operation of the first example of said data telecommunications system.

Following is a description of the operation of this embodiment, with reference to the sequence chart given in FIG. 32.

(1) Transmission of Resource Data Request Using Short Distance Wireless Telecommunications The PC card 10S attached to the slave wireless data terminal 2000A does not have wide-area wireless telecommunications functions. Accordingly, the slave wireless data terminal 2000A cannot directly access the server 301A connected to the Internet by the PC card 10S. Thus, the slave wireless data terminal 2000A requests the relay of data telecommunications with the server 301A, selecting any of the master wireless data terminals 1000A–1000N that has the function of wide-area wireless telecommunications. The slave wireless data terminal 2000A must determine the status of use of the wide-area wireless telecommunications unit of the master wireless data terminals 1000A–1000N, prior to the request, and requests the resource data to the master wireless data terminals 1000A–1000N.

The above operation is explained in further detail below. First, the user operates a key operating unit 60 KB of the external unit 60 of the slave wireless data terminal 2000A, and inputs the request command for requesting transmission of the resource data. This request command is supplied to the PC card 10S. When the microcontroller 22 of the PC card 10S receives the request command, packets are generated that have in the header the identification number PIDa–PIDn of the PC cards 10M of the master wireless data terminal 1000A–1000N as the destination address, and the identification number PIDA of the PC card 10S of the slave wireless data terminal 2000A as the transmission source address, and with the payload part containing the resource data request, the desired bandwidth, and the presence or absence of a bonus and the bonus amount. These packets are sent to the master wireless data terminal 1000A–1000N, using short distance wireless telecommunications (Bluetooth).

These master wireless data terminals 1000A–1000N contain private repeaters that accept only data relays requested by terminals within the same group (a plurality of privately owned wireless data terminals, and community units such as families and clubs), public repeaters that accept relays according to the bonus amount, and volunteer repeaters that accept relays gratis. It should be noted that the master wireless data terminals 1000A–1000N can also be such that they accept only data relays requested by certain predetermined groups (terminals owned by individuals, companies, or schools). In this case, the identification number of the PC card 10S that accepts the data relay request and the password are recorded in the ID database 24, and at the time of the request for channel borrowing discussed below, the microcontroller 22 of the PC card 10M can perform authentication according to the identification number and the password.

(2a, 2b) Transmission of Resource Data

When the PC card 10M of the master wireless data terminal 1000A accepts packets containing the resource data request, packets are generated that have in the header the identification number PIDA of the PC card 10S of the master wireless data terminal 1000A–1000N as the destination address, and the identification number PIDa of the PC card 20 of the master wireless data terminal 1000A as the transmission source address, and with the payload part containing the resource data such as bandwidth (bit rate) and the requested bonus amount, and these packets are sent to the slave wireless data terminal 2000A by short distance wireless telecommunications. As is the case with the various PC card 10M of the other master wireless data terminals 1000B–1000N, packets containing various resource data and requested bonuses are sent to the slave wireless data terminal 2000A by short distance wireless telecommunications.

(3) Transmission of Channel Usage in Short Distance Wireless Telecommunications

When the PC card 10S of the slave wireless data terminal 2000A accepts packets containing this resource data, the bandwidth and bonus amount of wide-area telecommunications that can be used for the various master wireless data terminals 1000A–1000N are stored in the memory 23. The microcontroller 22 of the PC card 10S selects which master wireless data terminal 1000A–1000N is used for relay, based on the resource data that can be used in the master wireless data terminal 1000A–1000N stored in the memory 23, and based on the bandwidth needed to acquire the desired content.

Also, in cases where the microcontroller 22 of the PC card 10S of the slave wireless data terminal 2000A selects, for example, the master wireless terminal 1000A for use in relay, packets are generated that have in the header the identification number PIDa of the PC card 10M of the master wireless data terminal 1000A as the destination address, and the identification number PIDA of the PC card 10S of the slave wireless data terminal 2000A as the transmission source address, and with the payload part containing channel borrowing request, command data, bandwidth used and bonus amount paid for channel use, and these packets are sent to the master wireless data terminal 1000A by short distance wireless telecommunications. Here, the command data contains the address IPA of the server 101A that serves as the destination address, the identification number of the content requesting data distribution, the user ID, and the password.

(4) Transmission of Channel Lending Permission Using Short Distance Wireless Telecommunications When the PC card 10M of the master wireless data terminal 1000A accepts packets containing this channel borrowing request packets that have in the header the identification number PIDA of the PC card 10S of the slave wireless data terminal 2000A as the destination address, and the identification number PIDa of the PC card 10M of the master wireless data terminal 1000A as the transmission source address, and channel lending permission data in the payload are sent to the slave wireless data terminal 2000A.

(5) Negotiating

The PC card 10S of the slave wireless data terminal 2000A determines that negotiating has taken place with the master wireless data terminal 1000A, based on the channel lending permission data. At this time, the selection of the master data terminal 1000A as the relay terminal is displayed on the display unit 60DP of the slave wireless data terminal 2000A.

(6) Transmission of Request Packets Using Wide-Area Wireless Telecommunications

The microcontroller 22 of the PC card 10M of the master wireless data terminal 1000A sends request packets that have in the header the address IPA of the server 101 as the destination address, and the identification number TIDa of the PC card 10M of the master wireless data terminal 1000A as the transmission source address, and with the address IPA from among the command data taken from the slave wireless terminal 2000A removed, that it to say, with the payload containing identification numbers for the content requesting distribution, user ID, and password, sending them via the wide-area wireless telecommunications unit 1001.

Furthermore, the command data and the identification number PIDA of the PC card 10S of the slave wireless data terminal 2000A as the primary data request are recorded in the memory 23 of the PC card 10M of the master wireless telecommunications terminal 1000A. In cases where distribution packets with content are received from the server 301, the microcontroller 22 determines whether or not the distribution packets are due to the request from the slave wireless data terminal 2000, based on data recorded in the memory 23.

Accordingly, the master wireless data terminal 1000A functions as a gateway wireless telecommunications terminal with what is known as an IP masquerade means.

(7) Authentication

The request packets are sent to the server 301A via the mobile telecommunications network 200 and the Internet 300.

The control unit 303 of the server 301A performs user authentication using the user ID and password in the payload of the request packet.

(8) Performing User Authentication Using Wide-Area Wireless Telecommunications

When establishing authentication, the control unit 303 of the server 301 reads the content corresponding to the requested data (identification codes) from the data memory unit 304A, based on the control program stored in the program memory unit 304B. Also, a plurality of distribution packets are generated with the divided data with the divided content contained in the payload, and having in the header the identification number TIDa of the PC card 10M of the master wireless data terminal 1000A as the destination address, and the address IPA of server 301A as the transmission source address. Also, the control unit 303 of the server 301A sends the distribution packet to the master wireless data terminal 1000A.

Furthermore, the control unit 303 bills a data fee for the distribution data according to the user ID of the slave wireless data terminal 2000A.

(9) Transmission of Distribution Packets Using Wide-Area Wireless Telecommunications When the PC card 10M of the master wireless data terminal 1000A receives distribution packets in accordance with the wide-area wireless telecommunications unit 1001, the destination address within the header of the distribution packets is changed to an identification number PIDA of the PC card 10S of the slave wireless data terminal 2000A stored in the memory 23, that is, the address of the buyer of the data. Also, the PC card 10M transmits the distribution packets via the short distance wireless telecommunications unit 1002.

(10) Transmitting to the External Unit 60

The PC card 10S of the slave wireless data terminal 2000A receives the distribution packets by means of the short distance wireless telecommunications unit 1002. Also, the microcontroller 22 of the PC card 10S determines whether or not the identification number PIDA stored in the ID database 24 is in agreement with the destination address in the header of the distribution packet. When the two are in agreement, the microcontroller 22 of the PC card 10S of the slave wireless data terminal 2000A transmits the data in the payload of the distribution packet to the external unit 60.

(11) Transmitting after Channel Borrowing is Finished

When transmission of the distribution packets to the external unit 60 is finished, the PC card 10S of the slave wireless data terminal 2000A transmits packets with notification of channel borrowing being finished included in the payload to the master wireless data terminal 10A by means of short distance wireless telecommunications. The packet header contains the identification number PIDa of the PC card 10M of the master wireless data terminal 1000A as the destination address, and the identification number PIDA of the PC card 10S of the slave wireless data terminal 2000A as the transmission source address. The short distance wireless telecommunications unit 1002 of the master wireless data terminal 1000A receives notification that channel borrowing is finished, and the relay is completed.

Incidentally, there are cases in which changes occur in the resources (bandwidth, battery reserve, receiving status, etc.) that can be transferred from the master wireless data terminal 1000A to the slave wireless data terminal 2000A while data telecommunications relay of the slave wireless data terminal 2000A is being carried out.

The reason for changes in resources that can be transferred can be that the master wireless data terminal 1000A itself needs to carry out wide-area wireless telecommunications or short distance wireless telecommunications (including the data receipt operation to the master wireless data terminal 1000A via wide-area wireless telecommunications or short distance wireless telecommunications), or changes have taken place in the telecommunications environment (reception conditions, congestion, etc.) for wide-area wireless telecommunications or short distance wireless telecommunications for the master wireless data terminal 1000A, or changes have occurred in the resources that can be used, such as power capacity or buffer memory of the master wireless data terminal 1000A, or there have been relay requests from other slave wireless data terminals.

Here we will discuss the example of the case where the master wireless data terminal 1000A had to carry out telecommunications using its own wide-area wireless telecommunications.

First, when there are changes in the resources that can be transferred to the slave wireless data terminal 2000A (bandwidth, battery reserve, reception conditions, etc.), the PC card 10M of the master wireless data terminal 1000A generates packets that have in their payloads resource data relating to resources that can be transferred, and these packets are transmitted to the slave wireless data terminal 2000A.

The PC card 10S of the slave wireless data terminal 2000A executes another channel borrowing request transmission of FIG. 32 (3). That is to say, the slave wireless data terminal 2000A studies the bandwidth which the master wireless data terminal 1000A provides.

① Also, in cases where it is possible to ensure enough bandwidth to continue telecommunications on the same level as the present, the slave wireless data terminal 2000A employs the master wireless data terminal 1000A to continue receiving the distribution packets.

② On the other hand, in cases where it is not possible to ensure enough bandwidth to continue telecommunications on the same level as the present, the microcontroller 22 of the PC card 10S of the slave wireless data terminal 2000A selects which master wireless data terminal 1000B–1000N is used for relay, based on the resource data that can be used in the master wireless data terminal 1000B–1000N, and based on the bandwidth needed to acquire the content. The processing after FIG. 32 (3) is carried out based on the selection results. In this case, the distribution packets distributed via the master wireless data terminal that was selected can be unsent items remaining in the server 301A. In order to make this a reality, it is necessary to provide the mobile telecommunications network 200 with a router to switch the wireless terminal for relay from the master wireless data terminal 1000A to another master wireless data terminal, while continuing telecommunications. However, in this case, it is possible to simplify the processing of (1) and (2) by implementing the processing after (3), to make it possible to switch the wireless terminal for relay to a master wireless data terminal.

It should be noted that retransmission of the resource data can be carried out not only when the bandwidth is modified, but also when the battery reserve has fallen below a certain prescribed level, or when the receiving status has fallen below the standard level.

Furthermore, the above explanation discussed the case where the wireless terminal for relay is modified to another wireless terminal, depending on the state of the master wireless data terminal that implements relay of the data telecommunications, but the wireless terminal for relay can also be modified according to the state of the slave wireless data terminal 2000A.

For example, when the slave wireless data terminal 2000A performs data telecommunications using the master wireless data terminal 1000A, there is the case where the slave wireless data terminal 2000A finds a master wireless data terminal with favorable conditions (bonus amount and telecommunications status), the case where the volume of data one wants the slave wireless data terminal 2000A to acquire changes and the necessary bandwidth changes, the case where there are changes in the natural resources that can be used, such as the power source capacity and the buffer memory, making the continuation of telecommunications difficult, and the case where the relay request is received from another slave wireless data terminal.

Figure 33:
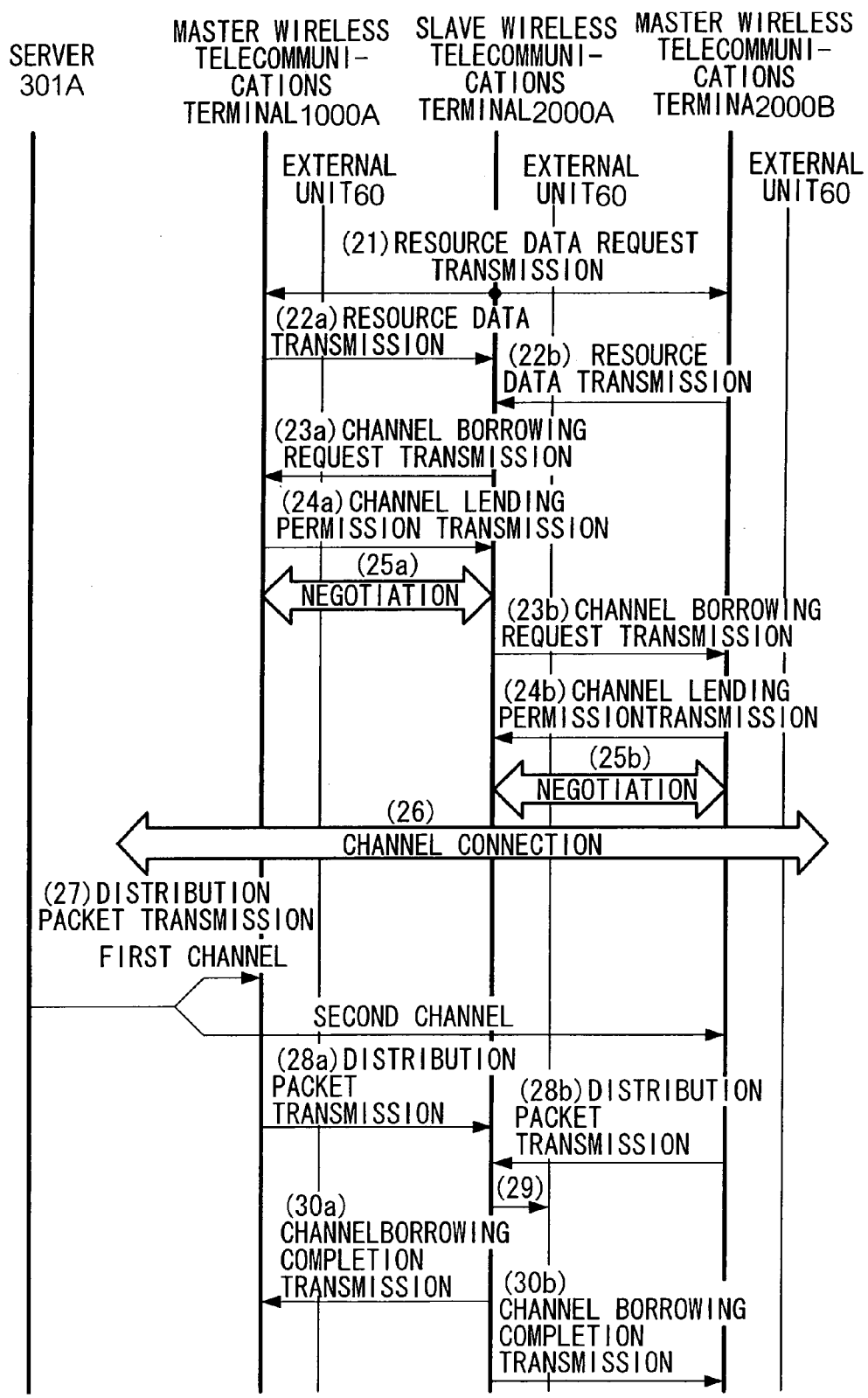
FIG. 33 is a sequence chart illustrating the operation of the second example of said data telecommunications system.

D-2. Second Example of a Data Communications System Using a Wireless Telecommunications Unit Relating to this Embodiment FIG. 33 is a sequence diagram illustrating the operation of the second example of a data communications system using a wireless telecommunications unit relating to this embodiment.

In this second example, the two master wireless data terminals 1000A and 1000B perform data telecommunications relay between a slave wireless data terminal 2000A and the server 301A.

(21) Transmission of Resource Data Request Using Short Distance Wireless Telecommunications First, the PC card 10S of the slave wireless data terminal 2000A must determine the use status of the wide-area telecommunications unit of the master wireless terminals 1000A–1000N, and sends packets that have in their payloads the resource data request, desired bandwidth, presence or absence of a bonus, and the bonus amount.

(22a, 22b) Transmission of Resource Data Using Short Distance Wireless Telecommunications When the various PC cards 10M of the master wireless data terminals 1000A–1000N receive packets containing the resource data request, packets that have in their payloads resource data such as the bandwidth (bit rate) and the requested bonus amount are transmitted to the slave wireless data terminal 2000A by short distance wireless telecommunications.

(23a, 23b) Transmission of Channel Borrowing Request Using Short Distance Wireless Telecommunications When the PC card 10S of the slave wireless data terminal 2000A receives packets containing the resource data, the bonus amount and bandwidth of the wide-area telecommunications that can be used in the master wireless data terminals 1000A–1000N are stored in the memory 23. The microcontroller 22 of the PC card 10S of the slave wireless data terminal 2000A selects which master wireless data terminal 1000A–1000N will be used for relay, based on the resource data and the bandwidth needed for content reception, in accordance with the master wireless terminals 1000A–1000N stored in the memory 23.

Here, the bandwidth that makes it possible to utilize the master wireless data terminal is less than the bandwidth needed for receiving any of the content. For example, if both master wireless data terminals 1000A and 1000B are used for relay, content reception can be made possible.

In such cases, the PC card 10S of the slave wireless data terminal 2000A selects the two master wireless data terminals 1000A and 1000B.

Also, the PC card 10S of the slave wireless data terminal 2000A transmits packets that have in the payload the channel borrowing request, command data, the bandwidth used, and the bonus amount paid for receiving the relay of the data transmission, to the master wireless data terminal 100A by short distance wireless telecommunications. Here, the command data includes the address IPA of the server 301A that serves as the destination address, the identification code of the requested data, the user ID, and the password. Furthermore, the PC card 10S of the slave wireless data terminal 2000A transmits the same type of content packets to the master wireless data terminal 1000B by short distance wireless telecommunications.

(24a, 24b) Transmission of Channel Lending Permission Using Short Distance Wireless Telecommunications When the PC card 10M of the master wireless data terminal 1000A receives packets containing this channel borrowing request data, packets that have channel lending permission in their payloads are transmitted to the slave wireless data terminal 2000A. Likewise, when the PC card 10M of the master wireless data terminal 1000B receives packets containing a channel borrowing request, packets with channel lending permission in their payloads are transmitted to the slave wireless data terminal 2000A.

(25a, 25b) Negotiating

The PC card 10S of the slave wireless data terminal 2000A determines that negotiation has taken place with the master wireless data terminal 1000A when it receives packets containing channel lending permission from the master wireless data terminal 1000A, and it determines that negotiation has taken place with the master wireless data terminal 1000B when it receives packets containing channel lending permission from the master wireless data terminal 1000B. At this time, the fact that the master wireless data terminals 1000A and 1000B were selected as intermediate terminals is displayed on the display unit 60DP of the slave wireless data terminal 2000A.

(26) Channel Connection

The microcontroller 22 of the PC card 10M of the master wireless data terminal 1000A transmits request packets with headers containing the address IPA of the server 301 as the destination address, and the identification number TIDa of the PC card 10M of the master wireless data terminal 1000A as the transmission source address, and containing in their payloads the content identification code requesting distribution, the user ID, and the password, that is, with the address IPA removed from the command data taken from the slave wireless data terminal 2000A, transmitting the packets via the wide-area wireless unit 1001. The microcontroller 22 of the PC card 10M of the master wireless data terminal 1000B transmits similar request packets using the wide-area wireless telecommunications unit 1001.

Accordingly, the first channel is connected between the master wireless data terminal 1000A and the base station 202, and the second channel is connected between the master wireless data terminal 1000B and the base station 202.

Furthermore, using the PC card 10M of the master wireless data terminal 1000A, the identification number PIDA of the PC card 10S of the slave wireless data terminal 2000A as the principal data request along with the command data are stored in the memory 23. Likewise, even using the PC card 10M of the master wireless data terminal 1000B, the identification number PIDA of the PC card 10S of the slave wireless data terminal 2000A as the principal data request along with the command data are stored in the memory 23.

The request packets transmitted from the master wireless data terminals 1000A and 1000B are transmitted to the gateway (not pictured) between the wireless telecommunications network 200 and the Internet 300 via the base station 202. This gateway selects one of the received request packets, converts the transmission source address of the header a gateway address, and transmits it to the mobile telecommunications network 200. At this time, the transmission source addresses TIDa and TIDb contained in the headers of the received request packets are stored in the packet data of the request packets.

When the control unit 303 of the server 301A receives the request packets, the data in the payloads of the request packets is read, and authenticated by the user ID and the password.

When authentication has taken place, the control unit 303 of the server 301A reads content corresponding to the request data (identification codes) from the data memory unit 304A, based on a control program stored in the program memory unit 304B, and generates a plurality of distribution packets with the divided data with the divided content contained in the payload, with the header having the gateway address as the destination address and the address IPA of the server 301A as the transmission source address. Also, the control unit 303 of the server 301A transmits the distribution packets to the gateway.

Furthermore, the control unit 303 charges data fees for this distribution data to the user ID of the slave wireless data terminal 2000A.

(27) Transmission of Distribution Packets Using Wide-Area Wireless Telecommunications The gateway separates the distribution packets received sequentially from the server 301A, distributing them to the master wireless data terminals 1000A and 1000B, and transmits them to the master wireless data terminals, using the first channel and the second channel.

(28a, 28b) Transmission of Distribution Packets Using Short Distance Wireless Telecommunications When the PC card 10M of the master wireless data terminal 1000A receives the distribution packets, the destination addresses of these distribution packets are converted to address PIDA (identification numbers of the PC card 10S of the slave wireless data terminal 2000A) of the data request recorded in the memory 23, and these distribution packets are transmitted to the slave wireless data terminal 2000A via the short distance wireless telecommunications unit 2002. Likewise, when the PC card 10M of the master wireless data terminal 1000B receives the distribution packets, the destination addresses of these distribution packets are converted to address PIDA (identification numbers of the PC card 10S of the slave wireless data terminal 2000A of the data request recorded in the memory 23, and these distribution packets are transmitted to the slave wireless data terminal 2000A via the short distance wireless telecommunications unit 2002.

(28) Transmission of Distribution Packets to the External Unit 60

The PC card 10S of the master wireless data terminal 1000B receives these distribution packets, and transmits them to the external unit 60. Also, the CPU of the external unit 60 acquires the content by taking the data from the payloads of these distribution packets.

(30a, 30b) Transmission of Notification that Channel Borrowing is Finished

The PC card 10S of the slave wireless data terminal 2000A transmits packets containing notification that channel borrowing is finished to the master wireless data terminals 1000A and 1000B, respectively.

In the example of the operation described above, since the data telecommunications between the slave wireless data terminal 2000A and the server 301A involves relay by the two master wireless data terminals 1000A and 1000B, the bandwidth for data telecommunications can be greatly increased more than in the case where relay is implemented with one master wireless data terminals.

For example, in cases where the bit rate of the first channel for wide-area data telecommunications is 32 kbps, the bit rate for data telecommunications can be raised to 64 kbps when data telecommunications relay is implemented using two master wireless data terminals.

It should be noted that even in this second example of operation, it is conceivable that changes can occur in the resources (bandwidth) of the master wireless data terminals during data telecommunications relay. In this case, processing can be carried out as discussed in the first example of operation described above.

Furthermore, in this second example of operation, when the master wireless data terminals 1000A and 1000B carry out data telecommunications relay between the slave wireless data terminal 2000A and the server 301A, the bandwidth for relay of the master wireless data terminal 1000A can decrease, depending on the condition of the master wireless data terminal 1000A, and processing can be carried out to increase the bandwidth for relay of the master wireless data terminal 1000B.

Figure 34:
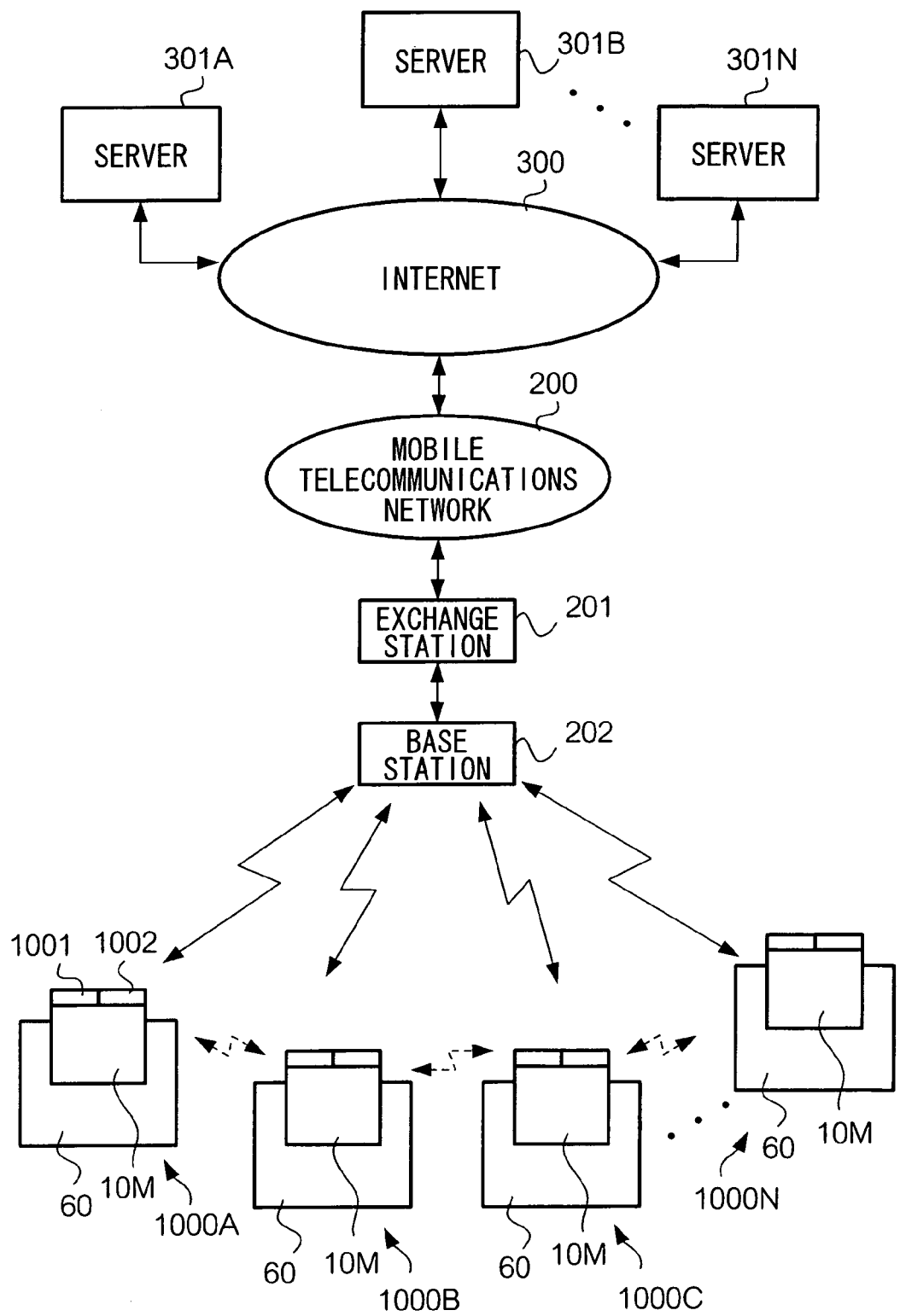
FIG. 34 is a diagram illustrating the third example of a data telecommunications system utilizing a wireless telecommunications unit relating to the fourth embodiment of this invention.

D-3. Third Example of a Data Communications System Using a Wireless Telecommunications Unit Relating to this Embodiment FIG. 34 illustrates the third example of a data telecommunications system using a wireless telecommunications unit relating to this embodiment. This data telecommunications system is provided with a plurality (e.g. N number of) master wireless data terminals 1000A–1000N to which is attached the PC card 10M that has the functions of wide-area wireless telecommunications and short distance wireless telecommunications. In this data telecommunications system, since all of the wireless data terminals are master wireless data terminals, they are simply referred to below as wireless data terminals.

Figure 35:
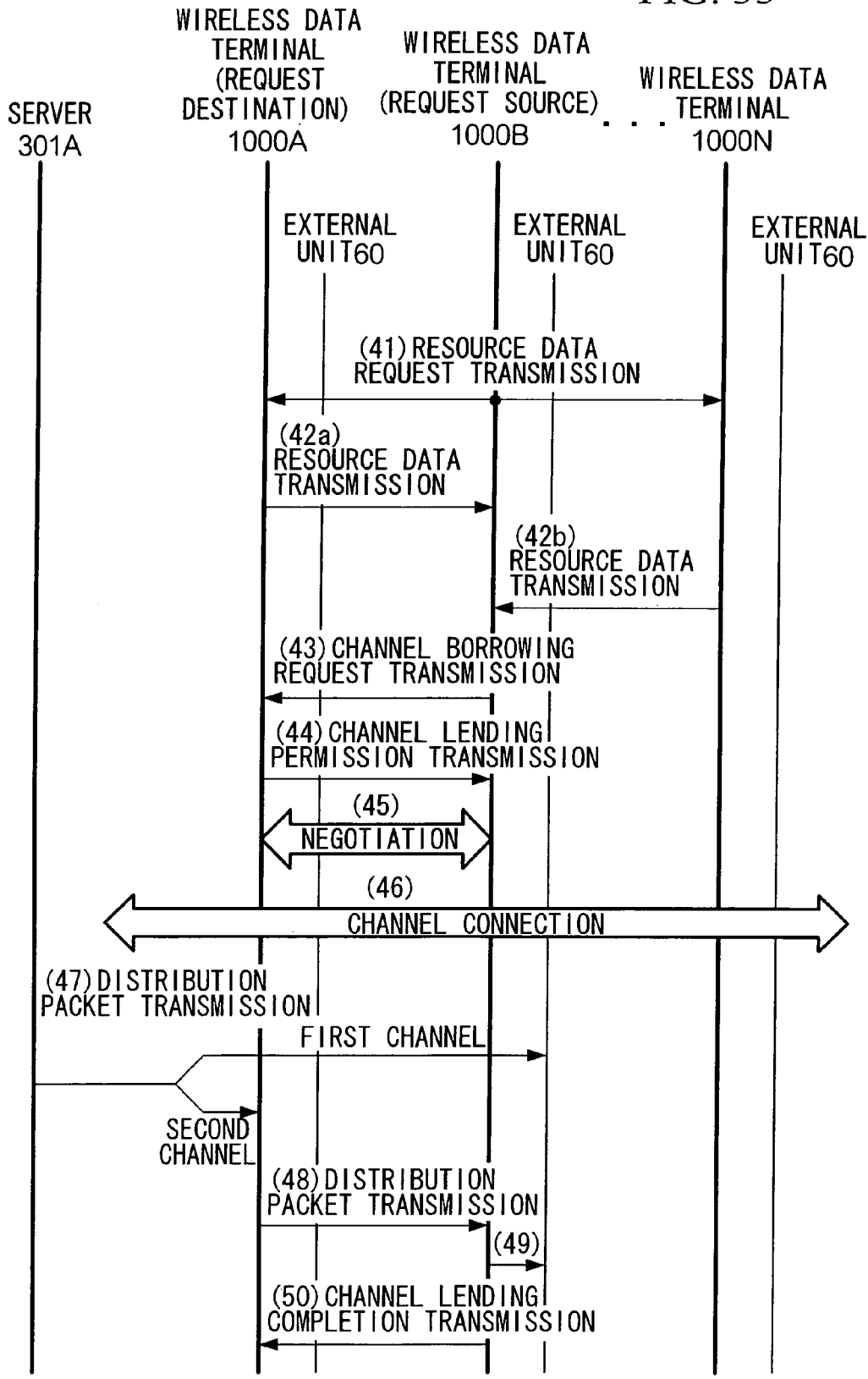
FIG. 35 is a sequence chart illustrating the operation of the first example of said data telecommunications system.

FIG. 35 is a sequence diagram illustrating an example of the operation of this data telecommunications system. In this example of operation, the wireless data terminal 1000B acquires from the server 301A data that cannot be transmitted in its entirety within the designated time, using the bandwidth of wide-area wireless telecommunications according to the PC card 10M of the wireless data terminal 1000B. The operation of this data telecommunications system is explained with reference to FIG. 34.

(41) Request for Resource Data Using Short Distance Wireless Telecommunications

First, wireless data terminal 1000B must determine the use status of the wide-area telecommunications unit of the other wireless terminals 1000A, 1000C–1000N, and sends packets that have in their payloads the resource data request, desired bandwidth, presence or absence of a bonus, and the bonus amount to the PC card 10M of the wireless terminals 1000A, 1000C–1000N, using short distance wireless telecommunications.

(42a, 42b) Transmission of Resource Data Using Short Distance Wireless Telecommunications When the PC cards 10M of the wireless data terminals 1000A, 1000C–1000N receive packets containing the resource data request, packets that have in their payloads resource data such as the bandwidth (bit rate) and the requested bonus amount are transmitted to the slave wireless data terminal 1000B by short distance wireless telecommunications.

(43) Transmission of Channel Borrowing Request Using Short Distance Wireless Telecommunications When the PC card 10M of the wireless data terminal 1000B (request source) receives packets containing the resource data, the bonus amount and bandwidth of the wide-area telecommunications that can be used in the master wireless data terminals 1000A, 1000C–1000N are stored in the memory 23. The microcontroller 22 of the PC card 10M of the slave wireless data terminal 2000A selects the bandwidth to be used for the wireless data terminals 1000A, 1000C–1000N and the wireless data terminal to borrow, based on the bandwidth needed for data telecommunications.

When the PC card 10M of the wireless data terminal 1000B selects the wireless data terminal 1000A, for example, packets having in their payloads the channel borrowing request, command data, the bandwidth used, and the bonus amount paid for channel use, are sent to the wireless data terminal 1000A using short distance wireless telecommunications. Here, the command data contains the address IPA of the server 101A that serves as the destination address, the identification number of the content requesting data distribution, the user ID, and the password.

(44) Transmission of Channel Lending Permission Using Short Distance Wireless Telecommunications When the PC card 10M of the wireless data terminal 1000A receives packets containing this channel borrowing request data, packets that have channel lending permission in their payloads are transmitted to the wireless data terminal 1000B.

(45) Negotiating

The PC card 10M of the wireless data terminal 2000A determines that negotiation has taken place with the wireless data terminal 1000A when it receives packets containing channel lending permission.

(46) Channel Connection

The PC card 10M of the wireless data terminal 1000B transmits request packets with headers containing address IPA of the server 301 at the destination address, and the identification number TIDb of the PC card 10M as the source address, and with the content identification code requesting distribution, user ID, and password in the payload, via the wide-area telecommunications unit 1001.

Furthermore, the PC card 10M of the wireless data terminal 1000A transmits request packets with headers containing the address IPA of the server 301 as the destination address, and the identification number TIDa of the PC card 10M as the transmission source address, and containing in their payloads the content identification code requesting distribution, the user ID, and the password, that is, with the address IPA removed from the command data taken from the wireless data terminal 1000B, transmitting the packets via the wide-area wireless unit 1001.

Accordingly, the first channel is connected between the wireless data terminal 1000B and the base station 202, and the second channel is connected between the wireless data terminal 1000A and the base station 202.

Here, the various request packets transmitted from the wireless data terminals 1000A and 1000B are transmitted to the gateway (not pictured) between the mobile telecommunications network 200 and the Internet 100 via the base station 202. This gateway selects one of the received request packets, converts the transmission source address of the header a gateway address, and transmits it to the mobile telecommunications network 200. At this time, the transmission source addresses TIDa and TIDb contained in the headers of the received request packets are stored in the packet data of the request packets.

When the control unit 303 of the server 301A receives the request packets, the data in the payloads of the request packets is read, and authenticated by the user ID and the password.

When authentication has taken place, the control unit 303 of the server 301A reads content corresponding to the request data (identification codes) from the data memory unit 304A, based on a control program stored in the program memory unit 304B, and generates a plurality of distribution packets with the divided data with the divided content contained in the payload, with the header having the gateway address as the destination address and the address IPA of the server 301A as the transmission source address. Also, the control unit 303 of the server 301A transmits the distribution packets to the gateway.

Furthermore, the control unit 303 charges data fees for this distribution data to the user ID of the wireless data terminal 1000A.

(47) Transmission of Distribution Packets Using Wide-Area Wireless Telecommunications The gateway separates the distribution packets received sequentially from the server 301A, distributing them to the wireless data terminals 1000A and 1000B, and transmits them to the wireless data terminals, using the first channel and the second channel.

(48) Transmission of Distribution Packets Using Short Distance Wireless Telecommunications When the PC card 10M of the wireless data terminal 1000A receives the distribution packets, the destination addresses of these distribution packets are converted to address PIDa (identification numbers of the PC card 10M of the wireless data terminal 1000B) of the data request recorded in the memory 23, and these distribution packets are transmitted to the wireless data terminal 1000B via the short distance wireless telecommunications unit 2002.

(49) Transmission of Distribution Packets to the External Unit 60

The PC card 10 of the wireless data terminal 1000B receives distribution packets from the base station 202 by the wide-area telecommunications unit 1001, as well as distribution packets relayed by the wireless data terminal 1000A by the short distance wireless telecommunications unit 1002, and transmits these distribution packets to the external unit 60. Also, the CPU of the external unit 60 acquires the content by taking the data from the payloads of these distribution packets.

(50) Transmission of Notification that Channel Borrowing is Finished

When transmission to the external unit 60 is finished, the PC card 10M of the wireless data terminal 1000B transmits packets containing notification that channel borrowing is finished.

For the cases given below, examples of the operation of this data telecommunications system are explained in further detail.

① The case where the distribution data transmitted from the server 301A becomes voluminous, when the wireless data terminal 1000B all by itself exchanges data with the server 301A.

② The case where the exchange of data from the wireless telecommunications data terminal 1000B is performed separately, when the wireless data terminal 1000B exchanges data with the server 301A.

③ The case where distribution data is exchanged that simply requires greater speed (the case where the bandwidth for processing with a single unit is insufficient, and transmission speed within the permitted range cannot be achieved)

Figure 36:
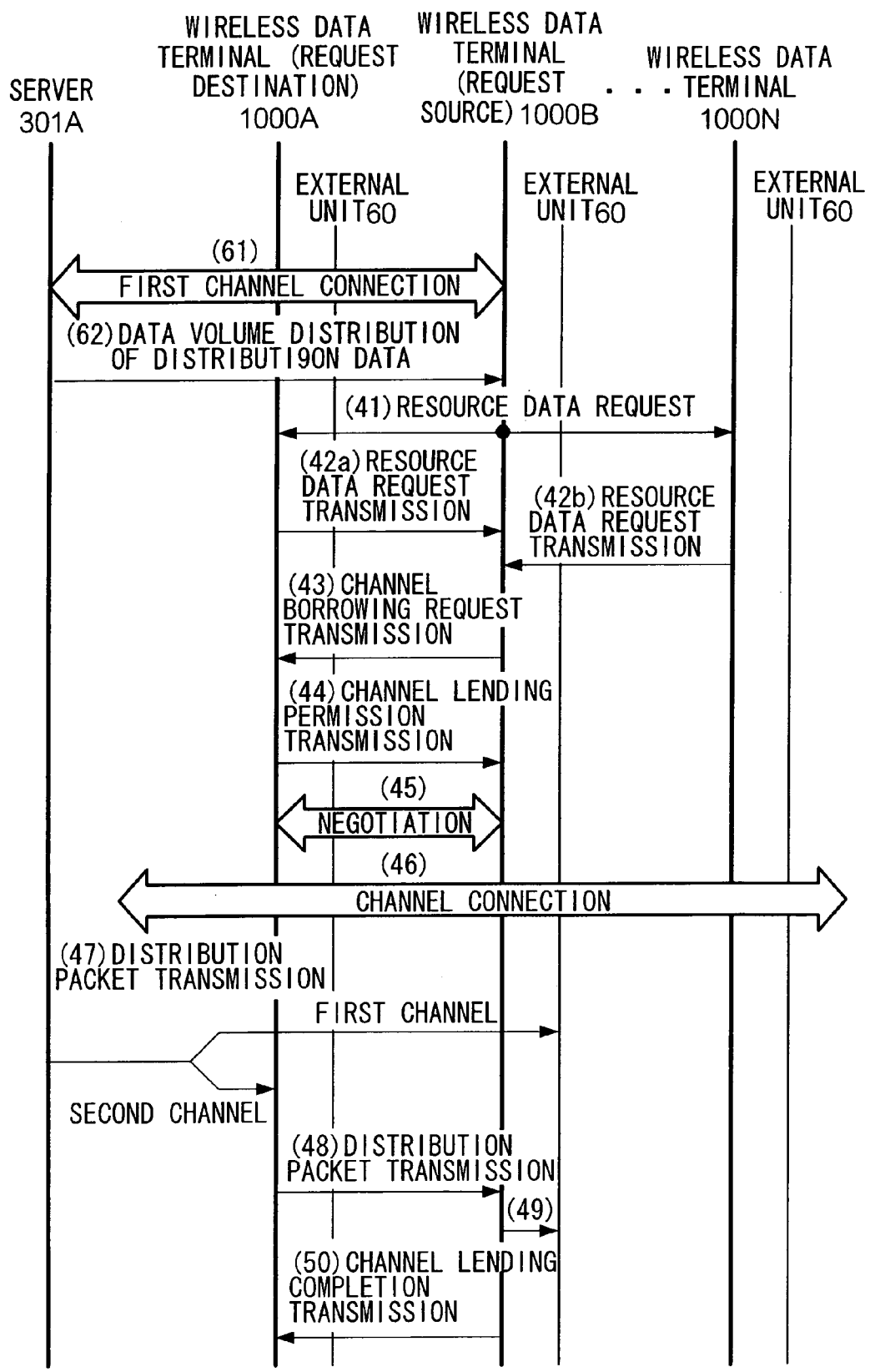
FIG. 36 is a sequence chart illustrating the operation of the first example of said data telecommunications system.

FIG. 36 is a sequence chart illustrating the operation in case ① above. This operation is explained in detail as follows.

(61) First Channel Connection

First, the wireless data terminal 1000B uses the first channel to carry out data telecommunications all by itself with the server 301A.

(62) Transmission of the Data Volume of the Distribution Data with Respect to the Request Data In cases where the control unit 303 of the server 301A, based on a request from the wireless data terminal 1000B, transmits a larger volume of distribution data than previously, using the first channel, prior to that, advance data indicating the volume of the data is to be transmitted.

When the PC card 10M of the wireless data terminal 1000B determines that content reception cannot be completed within the designated time using the bandwidth of wide-area wireless telecommunications according to the PC card 10M, the processing of (41)–(50) is performed in order to acquire the content from the server 301A, using another wireless data terminal as the relay terminal. This processing has already been explained with reference to FIG. 35, so a description will be omitted.

Accordingly, in cases where it is known in advance that the volume of data to be transmitted from the server 301A is large, the data can be transmitted in a short period of time by increasing the channels.

Following is an explanation of case ②.

First, the wireless data terminal 1000A exchanges data with the server 301A. In this state, the wireless data terminal 1000A transmits the data recorded in the memory (memory of the external unit 60, or the memory 23 of the PC card 10M) of said wireless data terminal 1000A, via the PC card 10M of another telecommunications data terminal 1000B–1000N.

At this time, while the data transfer between the wireless data terminal 1000A and the server 301A continues, a channel request is carried out between the wireless data terminal 1000B, for example, and channel connection is carried out between the wireless data terminal 10B and the server 101A, thereby resulting in a new data transfer using the wireless data terminal 10B as a relay.

The following (a)–(c) are given as specific operation examples of case ③ above.

(a) The case where one wishes to transmit at high speed a plurality of files made up of multimedia data (voice+ image) using the wireless data terminal 1000A.

It is predicted that the transmission time will exceed the designated time at a transmission speed (bit rate) according to wide-area wireless telecommunications of a single PC card 10M. Thus, the wireless data terminal 1000A transmits command data to other wireless data terminals 1000B–1000N, making a request. If, for example, the wireless data terminal 1000B receives and acknowledges this request, the PC card 10M of this wireless data terminal 1000B transmits a portion of the aforementioned files, while making a buffer in the internal memory for the data transmitted according to short distance wireless telecommunications.

(b) The case where the wireless data terminal 8000A downloads mail that contains voice data and image data It is generally known that image data has a relatively greater data volume than voice data. The idea is to transmit these data within a designated period of time, but if the same transmission speed is used, the voice data would be transmitted faster, making it impossible to replay image and voice in real time.

Accordingly, the wireless data terminal 1000A tests the bandwidth of the wide-area wireless telecommunications of the wireless data terminals 1000B–1000N, and will select a terminal with a transmission speed suitable for transmitting voice data, and a terminal with a transmission speed suitable for transmitting image data, and mail is obtained via data telecommunications relay to these respective wireless data terminals.

(c) The case where the time needed to receive exceeds the designated time, when the wireless telecommunications terminal receives multimedia mail made up of a plurality of files.

The details of the processing in this case are as explained with reference to FIG. 35. However, at this time, receipt of a portion of the data files transmitted from the server side is entrusted to another wireless data terminal.

D-4. Examples of Variations

The following variations of this embodiment are conceivable.

(1) In this embodiment, the various wireless data terminals communicate with the mobile telecommunications network 200 side, each using only the first channel, but the various wireless data terminals can communicate with the mobile telecommunications network 200 side, using a plurality of channels.

(2) In the third example of the data telecommunications system, the request source wireless data terminal 1000B itself also received data in conjunction with the server 301A, but the request source wireless data terminal 1000B can perform data telecommunications relying only on a relay using the wireless data terminal of the requesting party, and data telecommunications can also be carried out through relay to wireless data terminals of a plurality of requesting parties.

(3) The various wireless data terminals can also broadcast the various resource data periodically. In this case, the bandwidth can be changed even during transmission, according to changes in the resource data received.

In this case, the bandwidth can be changed using the BOD (Bandwidth on Demand) method, as long as the ISDN (Integrated Services Digital Network) and PIAFS (PHS Internet Access Forum Standard) version 2.1 are used.

In the case of the latter, the telecommunications speeds 64 kbps and 32 kbps can be switched. If the channel is open, 64 kbps is used, and when there is a request to use other channels, the other channels can be used, switching to 32 kbps. Moreover, in cases where high speed is required, bandwidth switching to lower levels can be inhibited.

Furthermore, other methods for increasing or decreasing the number of channels for bandwidth involve, for example, providing a router to the connecting points of the external network, and, as necessary, binding a plurality of channels. If this method is used, the type of channel can bePHS, PDC, or wired, nut it is necessary to provide a router that will be compatible. In this case, a wireless telecommunications terminal with wide-area wireless telecommunications functions possesses the router function.

(4) In the first example of the data telecommunications system, the slave wireless data terminal 2000A obtained data from the server 301A via only one master wireless data terminal 1000A, but the present invention is not limited thereto, and it is possible to relay a plurality of slave wireless data terminals and master wireless data terminals.

Figure 37:
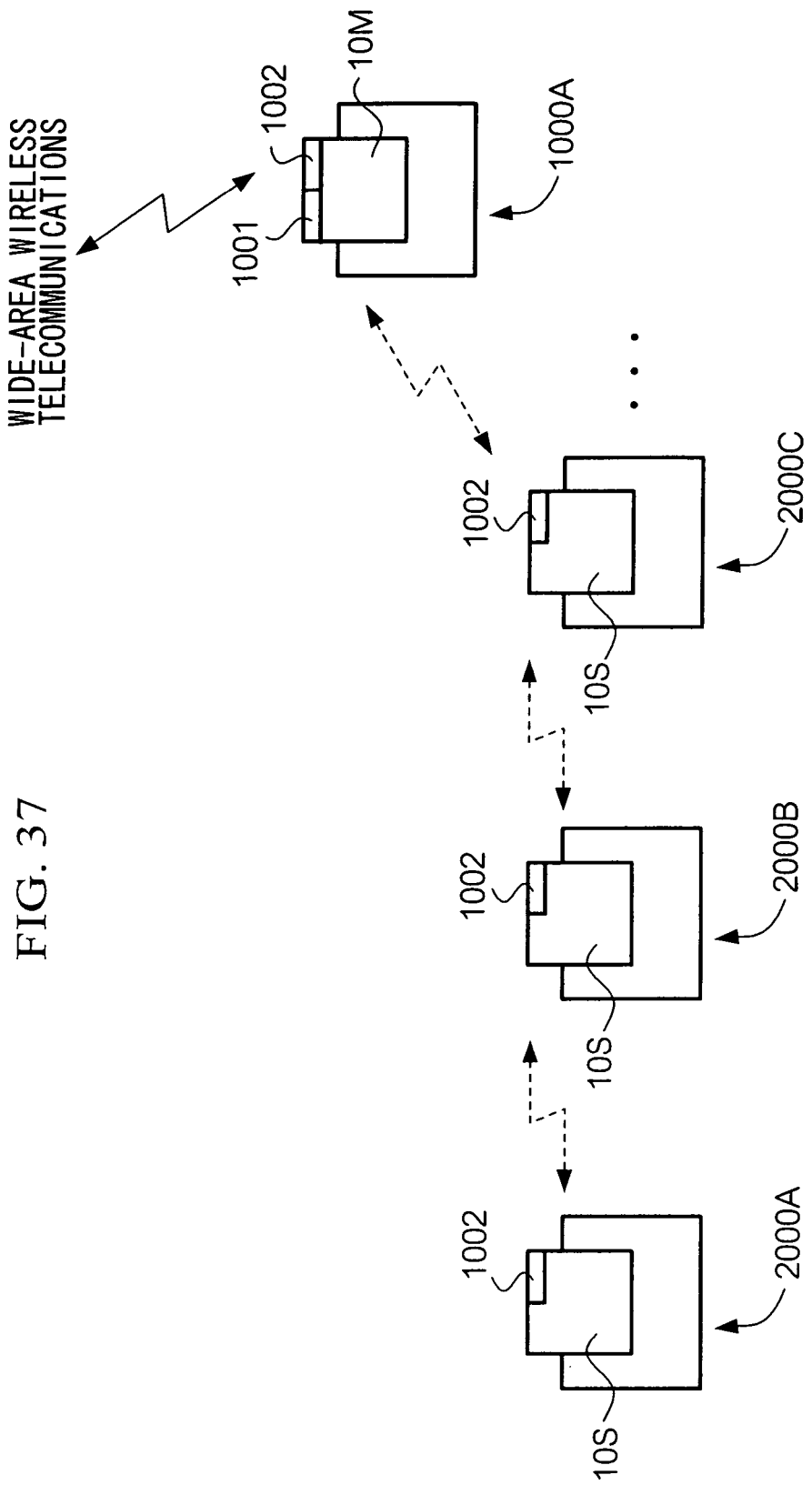
FIG. 37 is a sequence chart illustrating the operation of the first example of said data telecommunications system.

In FIG. 37, for example, the master wireless data terminal 1000A is not present within the communication range of the short distance wireless telecommunications unit of the slave wireless data terminal 2000A that requests data, but the slave wireless data terminal 2000B is present. The master wireless data terminal 1000A is not present within the communication range of the short distance wireless telecommunications unit of the slave wireless data terminal 2000B, but the slave wireless data terminal 2000C is present. Also, the master wireless data terminal 1000A is present within the communication range of the short distance wireless telecommunications unit of the slave wireless data terminal 2000C. In this case, the slave wireless data terminal 2000A uses the master wireless data terminal 1000A, the slave wireless data terminal 2000C, and the slave wireless data terminal 2000B as relay terminals to carry out wide-area wireless data telecommunications.

Accordingly, even in cases where the master wireless data terminal 1000A is not present in the vicinity of the slave wireless data terminal 2000A, the slave wireless data terminal 2000A is able to acquire data by employing other slave wireless data terminals as a multilevel repeater.

This multilevel repeater can also be applied to the second example of the data telecommunications system already described.

(5) The various wireless data terminals are formed by installing the PC card into the card slot of the external unit 60, but the present invention is not limited thereto, and Bluetooth (short distance wireless telecommunications) functions can be given to a mobile phone or to a PHS, and these mobile phones or PHS can be connected to the external unit 60.

(6) In cases where a plurality of data telecommunications systems have differing wide-area wireless network IDs, (e.g., telephone numbers), it is conceivable that the data requester data telecommunications system (System A below) will borrow the wide-area wireless channel of another data telecommunications system (System B below) in order to increase bandwidth. In this case, the fee for using the wide-area wireless channel is charged to System B.

Here, for the sake of fee management, there is a request to separate charges to System A and System B. Furthermore, even if System A and System B belong to the same user, there are cases in which it is desirable that the charges to System A be separated from the charges to System B, for the sake of fee management.

Accordingly, an example of means to avoid problems in fee management is to notify the wide-area telecommunications network from the wide-area data telecommunications system B to the effect that "This communication (from System B) is a request from System A that charges be made to System A." Thus, charges to a plurality of data telecommunications systems can be computed based on prior notification of "which system the request is from," so that charges are clearly separated. Of course, in order to avoid erroneous charges, it is necessary to build a system that can implement authentication reciprocally among the request source, the request destination, and the wide-area network.

(7) When the mechanism of the wireless telecommunications unit according to the present invention is further developed, it can temporarily borrow the wide-area telecommunications of a data telecommunications system of another person in the vicinity, or perform wireless telecommunications by renting. In this case, since the power source capacity of the wireless data terminal of the request destination and the PC card are used up, in order to make this arrangement function, a reliable user authentication mechanism and incentive money for the owner of the request source system are needed.

(8) Not only can the wireless data terminal be used when connected with other equipment, by having a wireless telecommunications unit capable of wide-area telecommunications and short distance wireless telecommunications installed in telephone equipment, and by having a battery power source installed in the wireless telecommunications unit, but it can also use the wireless telecommunications unit all by itself.

E. The Fifth Embodiment

E-1. Special Features of this Embodiment

This embodiment provides the following additional functions to the microcontroller 22 of the wireless telecommunications unit 10 relating to the first embodiment above, such as control functions pertaining to the memory mechanism 10*b*, and can be, for example, a PC card.

That is to say, the microcontroller 22 of the wireless telecommunications unit 10 relating to this embodiment has the functions of permitting or not permitting access to the memory mechanism 10*b* by the external unit 60, and managing the authentication status, involving the type of access.

First, at the time of connecting to the external unit 60, the microcontroller 22 gives the status of not ready for permission to the external unit 60 to write only to write-only files of the memory 10*b*.

Also, the data written from the external unit 60 side as a password for this write-only file is compared with the data registered in advance in the memory mechanism 10*b*, and only when these are in agreement is the authentication status changed to the not ready status that permits access to the general-use memory area from the external unit 60 side.

E-2. System Structure

Figure 38:
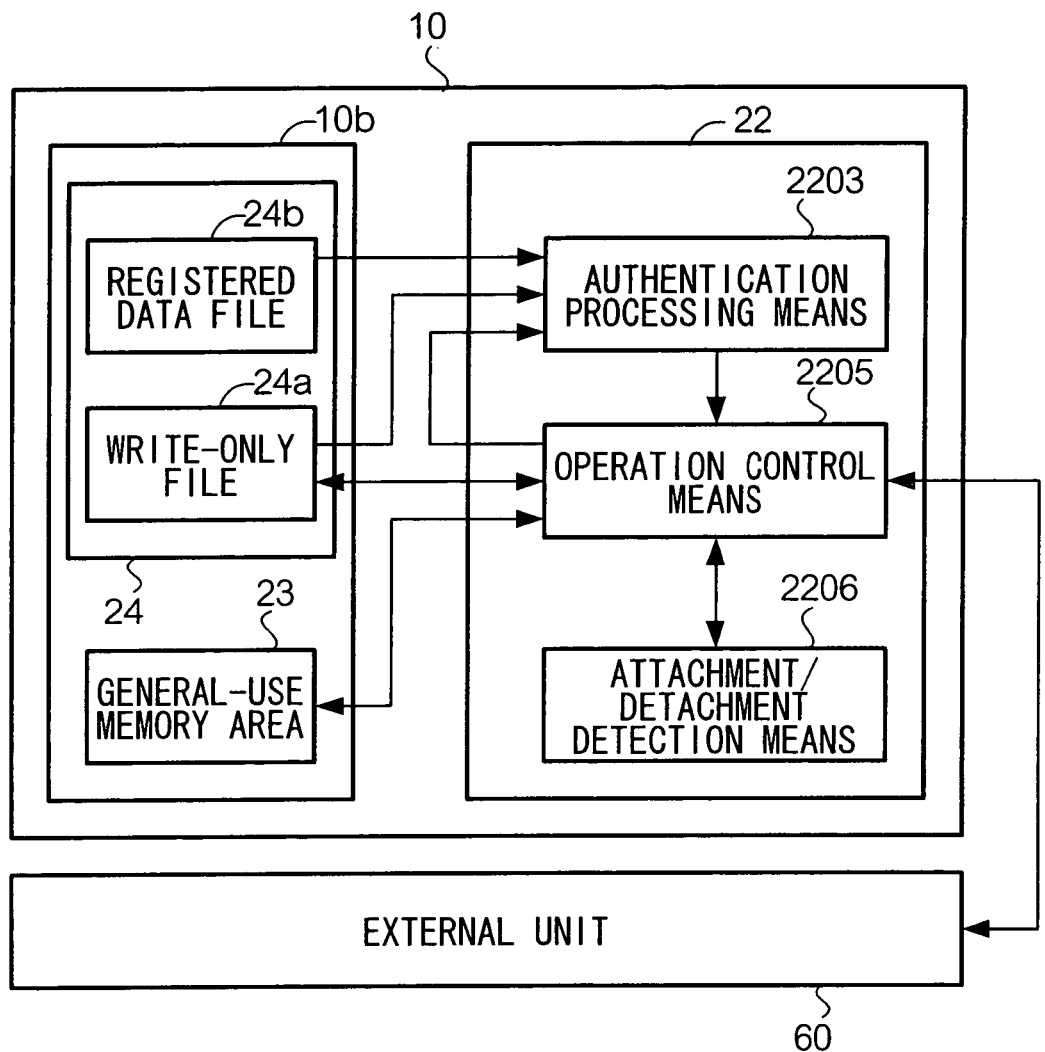
FIG. 38 is a block diagram illustrating the configuration of an authentication system using a wireless telecommunications unit relating to the fifth embodiment of this invention.

FIG. 38 is a block diagram illustrating the configuration of an authentication system using the wireless telecommunications unit 10 relating to this embodiment.

In FIG. 38, the memory mechanism 10*b* of the wireless telecommunications unit 10 is formed from non-volatile memory. Furthermore, the microcontroller 22 has an authentication processing means 2203, an attachment/detachment detection means (attachment means) 2204, and an operation control means 2205. It should be noted that the authentication processing means 2203 and the operation control means 2205 form an authentication control means.

The memory mechanism 10*b* is a means for recording data such as user data and the like, and is controlled by the operation control means 2205. As already explained in the first embodiment, the memory mechanism 10*b* is formed from the general-use memory (general use memory unit) 23 for storing user data, and the ID database 24 for storing authentication data for authentication of the user. The general-use memory 23 is configured to make access possible with an ordinary file access method from the external unit 60, and the ID database 24 is provided with a write-only file (write-only area) 24*a* for which the writing of data is permitted using said ordinary file access method, and an inaccessible registered data file (registration area) 24*b* from the external unit 60 side.

The write-only file 24*a* which can be written to using an ordinary file access method is a file into which input data such as passwords (referred to below as password input data or input data) are written from the external unit 60 side, and identified by the external unit 60 side as a file of the memory mechanism 10*b* (e.g., a file with a filename "PASSWORD.DAT" in the root directory of the memory mechanism 10*b*.)

The registered data file 24*b* is a file containing the registered password data (registered data) for comparison with the password input data, and it can be read out only by the operation control means 2205. It should be noted that since access to the registered data file 24*b* is impossible from the external unit 60 side, use of the registered data file 24*b* from the external unit 60 side cannot, of course, be recognized.

Following is an explanation of the various functions added to the microcontroller 22 in this embodiment.

First, the attachment/detachment detection means 2204 detects the attachment/detachment of the wireless telecommunications unit 10 to the external unit 60, and notifies the operation control means 2205. In detail, attachment and detachment are detected by monitoring the designated connection codes CD#1 and CD#2 (codes corresponding to the No. 35 pin and the No. 67 pin in the case of a standard PC card, and the No. 25 pin and No. 26 pin in the case of a compact flash card) with the external unit 60.

The authentication processing means 2203 compares passwords based on the Password input data entered in the wireless telecommunications unit 10 from the external unit 60 side and registered password data registered beforehand. In detail, when the authentication processing means 2203 receives a predetermined command from the operation control means 2205, it reads the newest password input data written to the write-only file 24*a* and compares it with the registered password data registered beforehand in the registered data file 24*b*.

The operation control means 2205 performs various types of control in response to the detection results of the attachment/detachment detection means 2204 (attachment/detachment of the PC card 1 with respect to the external unit 60), and in response to the results of comparison by the authentication processing means 2203 (password match/no match), and also returns the status character string that shows the current authentication status of the wireless telecommunications unit 10, in response to a request from the external unit 60 for a readout of the write-only file 24*a*. Following is an explanation of the various types of processing carried out by the operation control means 2205.

① Installation Processing

When the attachment/detachment detection means 2204 detects the installation of the wireless telecommunications unit 10 in the external unit 60, the operation control means 5 sets the authentication status of the wireless telecommunications unit 10 as the not ready status (status represented by the character string "NOT READY") that permits writing only to the write-only file 2*c* from the external unit 60, and starts counting the number of times (initial value is 0) the password input data is written to the write-only file 2*c* from the external unit 60 side. The process of counting is continued until the separation processing (or simulated separation processing) described below is carried out. It should be noted that changing the authentication status means creating a state in which all parts of the wireless telecommunications unit 10 are represented by the authentication status after the change.

② Authentication Processing

Furthermore, when the authentication status of the wireless telecommunications unit 10 is the not ready status, and the password input data written from the external unit 60 side to the wireless telecommunications unit 10 side, the count is increased by only 1, and a specified command is supplied to the authentication processing means 2203, commanding a comparison of passwords. When the result of this comparison indicates a "match" between the password input data and the registered password data, the operating control means 2205 sets the authentication status of the wireless telecommunications unit 10 to ready (status represented by the character string "READY"), making it possible to read and write from the external unit 60 side the various directories and files in the general-use memory area 2*a* of the memory mechanism 10*b*.

Conversely, in cases where the comparison results show "no match" between the password input data and the registered password data, the operation control means 2205 sets the authentication status of the wireless telecommunications unit 10 as the failure status (status represented by the character string "FAILED") which is a string of status characters differing from the not ready status, and moreover, it determines whether or not the number of times the password is input is less than the designated number (e.g. 3 times).

This determination is brought about by comparing the count of the number of times the password input data is input to the write-only file 2*c* from the external unit 60 with the designated number of times that is set beforehand, and in cases where the results of this determination show "less than 3 times," the operation control means 2250 returns the authentication status of the wireless telecommunications unit 10 to the not ready status, and repeats the above-described processing. In this repeated processing, the password input data is either written to the write-only file 2*c*, or added sequentially. On the other hand, if the results show "3 times or more," then the operation control means 2205 sets the authentication status of the wireless telecommunications unit 10 to the locked status (status represented by the character string "LOCKED") so that there can be no access from the external unit 60 side.

That is to say, the operation control means 2205 sets the authentication status of the wireless telecommunications unit 10 to the ready status with respect to the user who is able to enter the correct password with password input under a designated number of times, and conversely, the authentication status of the wireless telecommunications unit 10 is set to the locked status for users who were not able to enter the password.

③ Disconnection Processing

When the attachment/detachment detection means 2204 detects disconnection from the external unit 60 of the wireless telecommunications unit 10, the operation control means 2205 sets the authentication status of the wireless telecommunications unit 10 to the not ready status. Furthermore, the operation control means 2205 erases the data in the write-only file 2*c*, and preparing for re-installation of the wireless telecommunications unit 10 to the external unit 60, the count value of the number of times the password is entered to the write-only file 2*c* from the external unit 60 is reset. It should be noted that in this embodiment, when the simple terms "disconnection" and "installation" are used, they mean "actual physical disconnection" and "actual physical installation."

④ "Soft" Disconnection and Re-Installation Processing

When the external unit 60 side writes a special character string (e.g., "DISCONNECT") to the write-only file 24*a*, the operation control means 2205 performs a "soft" disconnection of the wireless telecommunications unit 10 with respect to the external unit 60 and re-installation. In detail, detection of disconnection is omitted and disconnection processing is executed, and also, installation detection is omitted and installation processing is executed. This "soft" disconnection and re-installation processing is carried out to assure security even when a multi-user environment or a wireless telecommunications unit 10 has to inform the external unit 60 for a long period of time. It should be noted that when the authentication status of the wireless telecommunications unit 10 is the locked status, the above processing cannot be executed, but even if the external unit 60 with the installed wireless telecommunications unit 10 in the locked status is used by another user, security is assured, since the wireless telecommunications unit 10 has not been accessed at all from the external unit 60 side.

⑤ Simulated Disconnection and Re-Installation Processing

Incidentally, in cases where an OS executed in the external unit 60 is an OS that carried out directory and file caching, when the directories and file names in the memory mechanism 10b are modified without disconnecting or re-installing the wireless telecommunications unit 10 with respect to the external unit 60, problems can arise in the external unit 60. Accordingly, in this embodiment, when the authentication status of the wireless telecommunications unit 10 is the ready status, the operation control means 2205 outputs signals to the external unit 60 side that simulate the disconnection/re-installation of the wireless telecommunications unit 10 (referred to below as simulated disconnection/re-installation signals), so as to prevent problems with the cache. In detail, the operation control means 2205 outputs simulated disconnection/re-installation signals by temporarily blocking specified connection signals CD#1 and CD#2.

It should be noted that the attachment/detachment detection means 2204 is set so that the actual attachment/detachment of the wireless telecommunications unit 10 is not detected with said simulated disconnection/re-installation signals. For example, if it is set so that actual attachment/detachment is determined only the blocking time of the specified connection signals CD#1 and CD#2 is significantly longer than the simulated disconnection/re-installation signals, then the attachment/detachment detection means 2204 is able to accurately detect only actual attachment and detachment.

E-3. Authentication Operation

Figure 39:
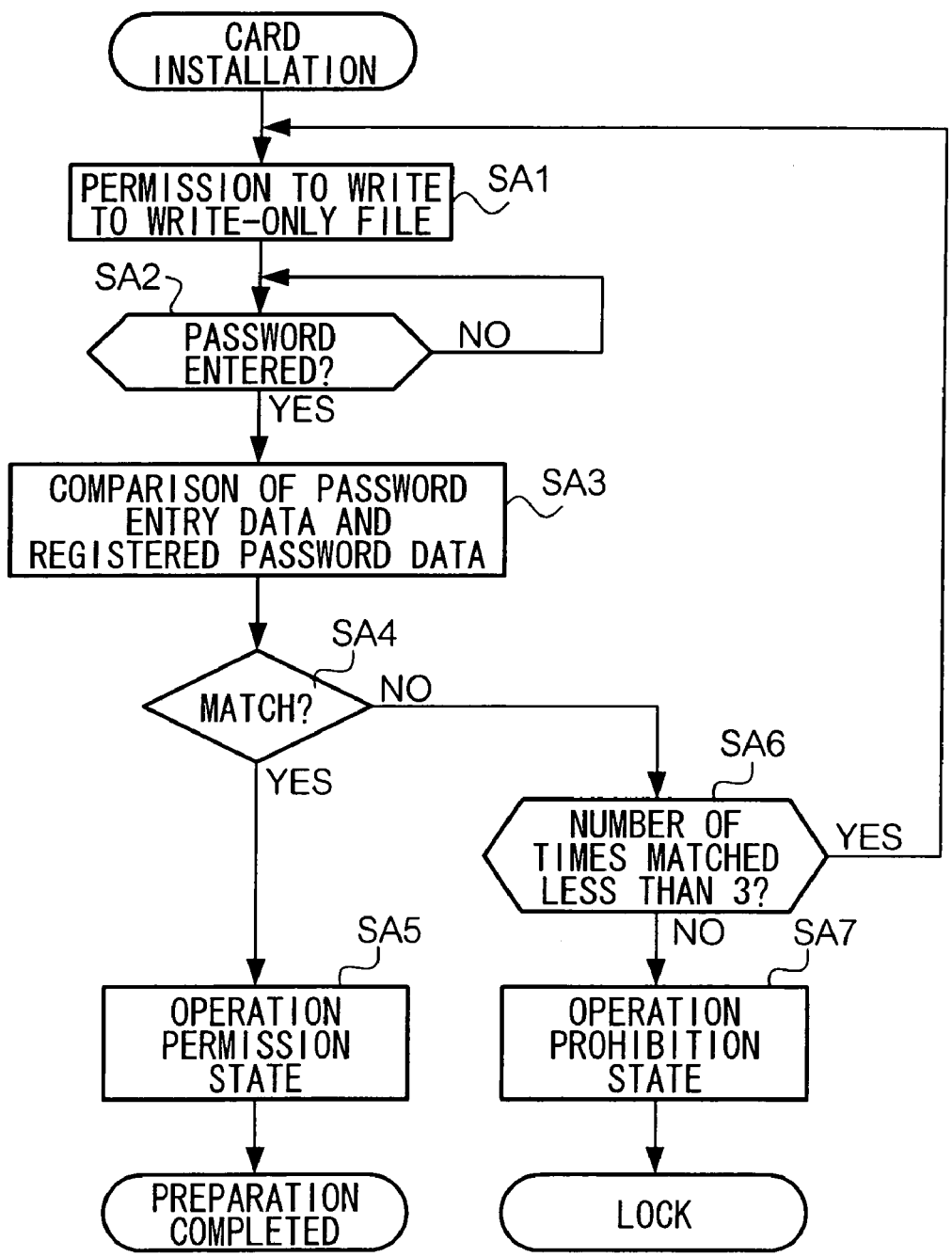
FIG. 39 is a flow chart illustrating a typical authentication operation of said authentication system.

Next, a typical authentication operation of the authentication system of the above configuration is explained with reference to FIG. 39. However, in the initial state, the wireless telecommunications unit 10 is disconnected from the external unit 60, and the data in the write-only file 24a is erased. Furthermore, the external unit 60 is one that executes the aforementioned ordinary OS.

First, when the wireless telecommunications unit 10 is connected to the external unit 60, the authentication status of the wireless telecommunications unit 10 is the not ready status, and writing is only permitted to the write-only file 24a (step SA1) with respect to the external unit 60. Next, when the user enters the password to the external unit 60, and when the password input data representing this password is written to the write-only file 24a using an ordinary file access method (step SA2), this password input data and the registration password registered beforehand in the registered data file 24b are compared (step SA3), and these are determined to match or not to match (step SA4).

If the two match ("YES" in FIG. 39), the authentication status of the wireless telecommunication unit 10 is in the ready status (step SA5). Accordingly, the various directories and files in the general-use memory 23 of the memory mechanism 10b can be read out and written from the external unit 60 side using an ordinary file access method. That is to say, in cases where the password input data and the registered password data match, a user who enters the password data input data is treated as a proper user of the wireless telecommunications unit 10.

Conversely, if the two do not match ("NO" in FIG. 39), the authentication status of the wireless telecommunications unit 10 is the failure status, and a determination is made as to whether or not the number of times the password is entered after installing the wireless telecommunications unit 10 is less than the designated number (e.g., 3 times; 2 times for re-entry) (step SA6). Also, If the result of this determination is "YES," then processing returns to the processing of step S1. After that, steps SA1–SA4, SA6 are repeated until either the correct password is entered, or the number of times the password is entered reaches the designated number.

In repeating the processing of steps SA1–SA4, and SA6, if the re-entered password entry data matches the registered password, the determination result of step SA4 is "YES" and a user who entered this password input data is determined to be a proper user, and the authentication status of the wireless telecommunications unit 10 is the ready status (step SA5). That is to say, a user who enters the password data input data is treated as a proper user of the wireless telecommunications unit 10.

On the other hand, in repeating the processing of steps SA1–SA4, and SA6, when the number of times the password is entered reaches the designated number (no match means that the designated number continues), the designation result of step SA6 is "NO." Accordingly, the authentication status of the wireless telecommunications unit 10 is locked status, and access to the wireless telecommunications unit 10 from the external unit 60 is prohibited (step SA7). That is to say, users who enter the password input data are treated as improper users of the wireless telecommunications unit 10.

It should be noted that during the above operation, when a user enters a command to the external unit 60 to read the write-only file 24a using an ordinary file access method, the result is that a status character string showing the authentication status of the wireless telecommunications unit 10 at that time is supplied to the external unit 60 from the wireless telecommunications unit 10. This status character string is made known to the user by general functions in the OS and by the external unit 60.

On the other hand, even if the authentication status is one of the above types of status, when the wireless telecommunications unit 10 is disconnected from the external unit 60, the data in the write-only file 24a is deleted by the operating control means 2205, and the password input count is reset after the wireless telecommunications unit 10 is installed. Furthermore, the authentication status of the wireless telecommunications unit 10 is set to the not ready status by the operating control means 2205.

As explained above, in this embodiment, as in the case of writing to ordinary memory, the password input data is written to a write-only file 2c from the external unit 60 side using an ordinary file access method of the specified OS, making it possible to authenticate an individual by simple processing involving only reading out and comparing internal data in the wireless telecommunications unit 10. That is to say, a user can be authenticated without modifying the external unit 60 at all.

Furthermore, in this embodiment, it is possible to implement a "soft" disconnection and reinstallation of the wireless telecommunications unit 10 with respect to the external unit 60 by writing a certain character string in the write-only file 24a. This means that the authentication status of the wireless telecommunications unit 10 can be set as the not ready status, without actually implementing the operation of attachment/detachment of the wireless telecommunications unit 10. It is thus possible to provide an authentication environment with excellent operability.

Moreover, in this embodiment, even if the specified OS that is executed by the external unit 60 is an OS that performs caching of directories and files, it is possible to eliminate cache problems since signals are output from the operation control means 2205 to the external unit 60, and even to attach and detach the wireless telecommunications unit 10 with respect to the external unit 60, after authentication has been successfully completed.

It should be noted that in this embodiment, a determination is made as to whether a user is a proper user or not, based on whether or not the password input data matches the registered password data, and if the password input data satisfies the designated conditions, a user who enters said data can be considered a proper user. For example, in cases where the password input data has a predetermined relationship to the data registered beforehand in the wireless telecommunications unit 10, the user is considered to be a proper user.

Furthermore, when the wireless telecommunications unit 10 is a PC card, the PC card can be an ATA (AT Attachment) PC card, and in this case, the media exchange bits (MC) of the ATA status/register in the microcontroller are monitored and attachment/detachment is detected in the attachment/detachment detection means 2204, and said media exchange bits are controlled, and simulated disconnection and re-installation signals of the wireless telecommunications unit 10 are output to the external unit 60 in the operation control means 2205. It should be noted that the attachment/detachment detection means 2204 can be a hardware switch.

The microcontroller of the PC card can receive a power supply from the external unit 60 via an external interface, and the power supply can be received from a backup power source of volatile semiconductor memory. However, in cases where said microcontroller is driven only by power supplied from the external unit 60, when the PC card is disconnected from the external unit 60, the microcontroller stops operation, so the configuration of the PC card must be modified. Below is an explanation of an example of such a modification (variation).

E-4. Variation

Figure 40:
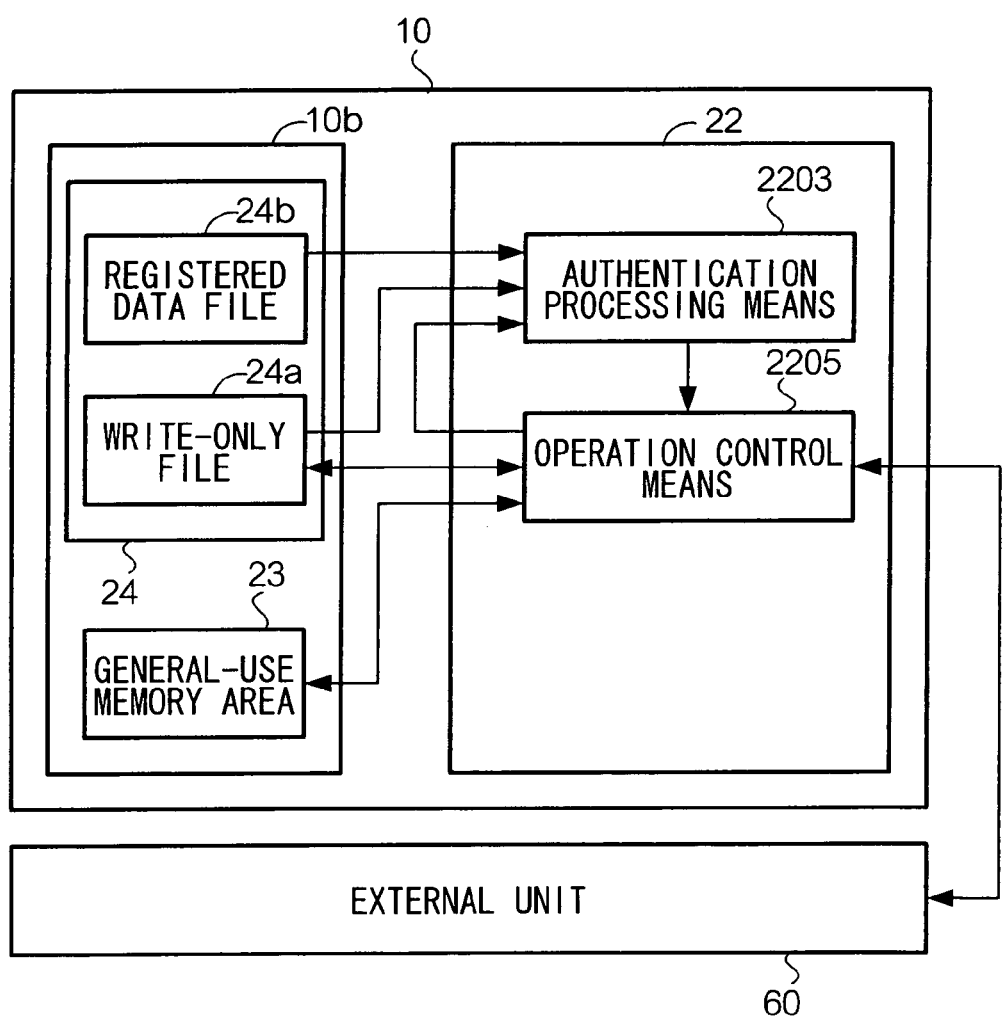
FIG. 40 is a block diagram illustrating the configuration of an authentication system using a wireless telecommunications unit relating to the fifth embodiment of this invention.

FIG. 40 is a block diagram illustrating the configuration of an authentication system using a wireless telecommunications unit 10 according to this variation. The difference in hardware between the wireless telecommunications unit 10 of this variation and the aforementioned case is that the microcontroller 22 is driven only by power supplied from the external unit 60, and that in addition to a non-volatile memory, there is also a volatile semiconductor memory that is not backed up.

Furthermore, the functional difference between the wireless telecommunications unit 10 of this variation and the aforementioned case is that it does not have the attachment/detachment detection means 2204, and that it is provided with an operating control means 2205A instead of the operating control means 2205. The reasons why it does not have an attachment/detachment detection means are as follows.

[Reason 1] Since the microcontroller 22 initiates operation when the wireless telecommunications unit 10 is connected to the external unit 60, if this is utilized, there is no need to detect if the wireless telecommunications unit 10 is attached.

[Reason 2] Since the content of the non-volatile memory is not maintained when the wireless telecommunications unit 10 is disconnected from the external unit 60, if this is utilized, there is no need to detect if the wireless telecommunications unit 10 is attached.

Furthermore, in this variation, the memory mechanism 10b has volatile memory, and in this volatile memory is stored the write-only file 24a. That is to say, the write-only file 24a is present only in cases where the wireless telecommunications unit 10 is installed in the external unit 60, and is deleted from the external unit 60 of the wireless telecommunications unit 10 at the time of disconnection.

The difference between the operation control means 2205A and the operation control means 2205 is not in the detection results of the attachment/detachment detection means 2204, but rather in the various processes carried out in accordance with the operation status of the microcontroller 22. The difference between these various processes and processing by the operation control means 2205 is that the starting point of operation of this means is judged as the point when the wireless telecommunication unit 10 is connected to the external unit 60, and the write-only file 24a is generated in the volatile memory and then the aforementioned installation processing is performed. It should be noted that when the wireless telecommunications unit 10 is disconnected from the external unit 60, since the operation control means 2205A ceases to operate, the operating control means 2205A does not have the aforementioned function of disconnection processing.

Figure 41:
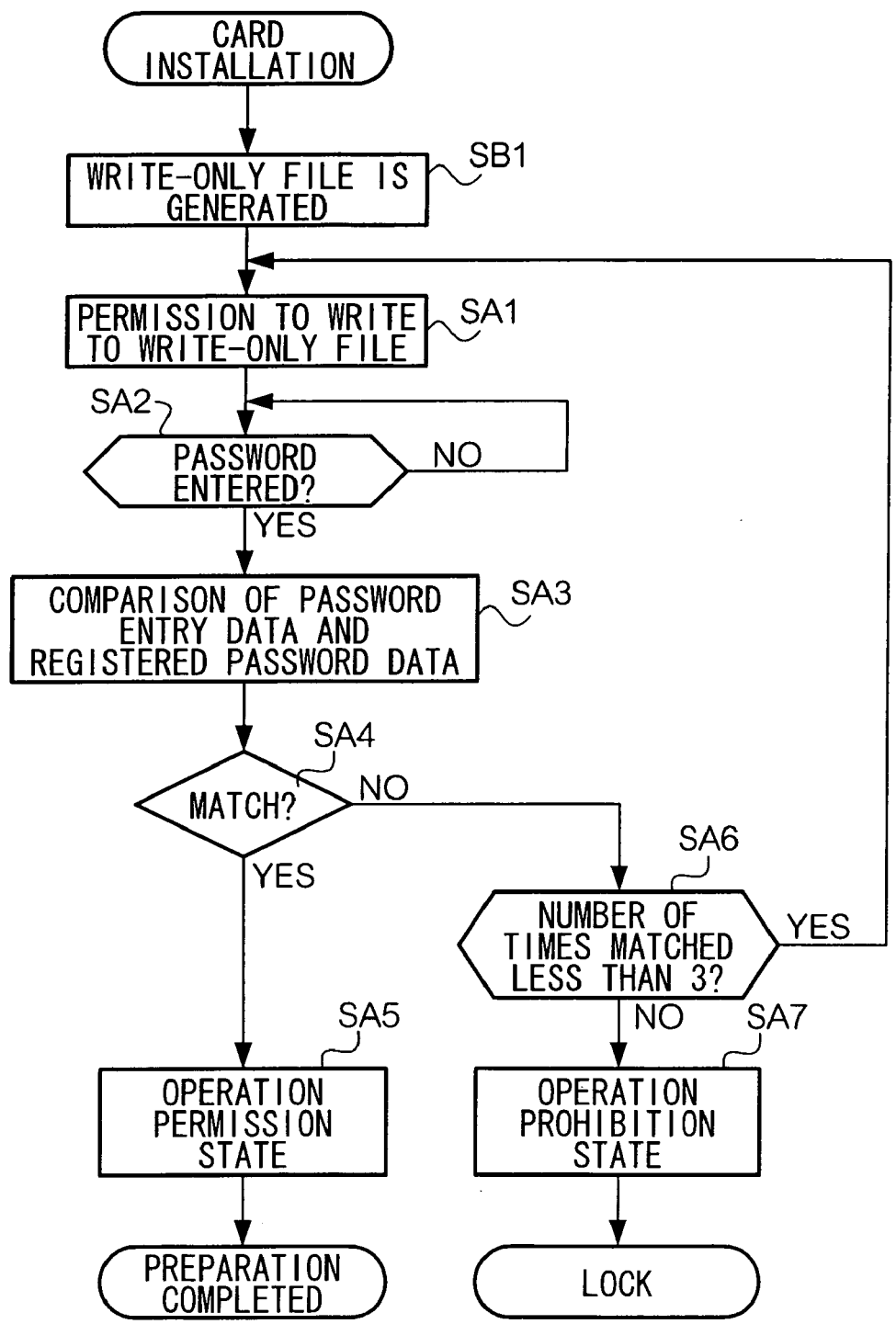
FIG. 41 is a flow chart illustrating the authentication operation of said authentication system.

A typical flow of the authentication process using the wireless telecommunications unit 10 with such a configuration is shown in FIG. 41. The same symbols are in the figure as in FIG. 39, so the explanation is omitted here. FIG. 41 clearly shows that at the time of installation of the wireless telecommunications unit 10 according to this variation (i.e., when the microcontroller starts operation), first, the write-only file 24a is generated in the volatile memory of the memory mechanism 10b (step SB1), and after that, processing is carried out as in FIG. 39. On the other hand, in the case of the wireless telecommunications unit 10 of this variation, when the wireless telecommunications unit 10 disconnects from the external unit 60, the supply of power to the volatile memory is blocked, and the write-only file 24a in the volatile memory is deleted.

Thus, in accordance with the wireless telecommunications unit 10 of this variation, the same effect is obtained as in the embodiment above, even though the attachment/detachment detection means 2204 is not provided.

Figure 42:
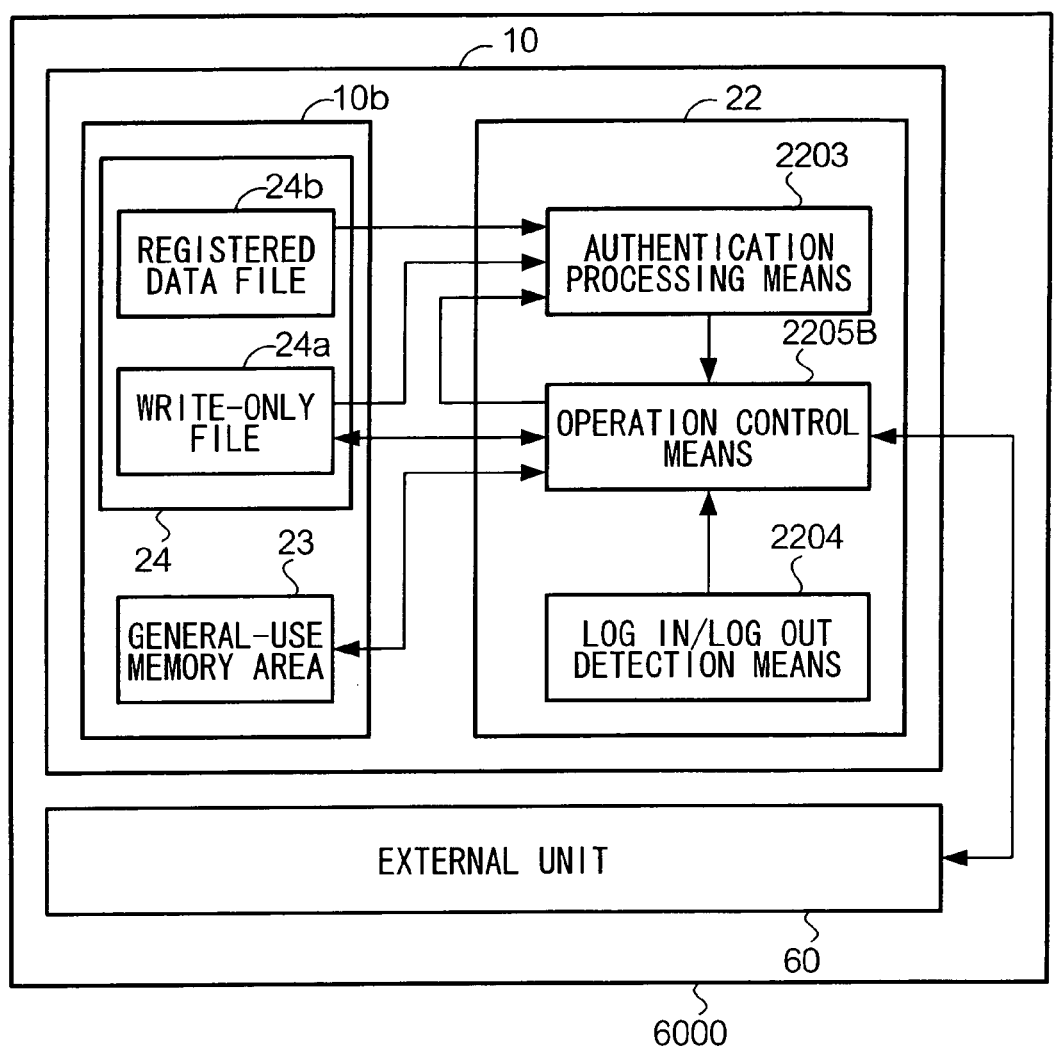
FIG. 42 is a block diagram illustrating the second variation on a wireless telecommunications unit relating to said embodiment.

E-5. Second Variation of the Wireless Telecommunications Unit Relating to this Embodiment FIG. 42 is a block diagram illustrating the second variation of the wireless telecommunications unit 10 relating to this embodiment. The microcontroller 22 in this wireless telecommunications unit 10 has the authentication processing means 2203, the log in/log out detection means (log in detection means) 2204, and the operation control means 2205. Also, in this embodiment, the wireless telecommunications unit 10 and the external unit 60 form a data processing device 6000 that operates according to a specified OS.

The log in/log out detection device 2204 detects log in/log out of the user with respect to the data processing device 6000m based on the log in/log out data sent to a device under the control of the wireless telecommunications unit to from the OS of the data processing device 6000, and supplies this information to the operating control means 2205 at the time of log in and at the time of log out.

An operation control means 2205B basically has the same function as the operation control means 2205 in FIG. 38, but it differs from the operation control means 2205 in that it performs "log in processing" and "log out processing" instead of "attachment processing" and "detachment processing," and does not have functions of "soft disconnection and re-installation processing" and "simulated disconnection/re-installation processing." It should be noted that the reason why functions for "soft disconnection and re-installation processing" are not provided is that the user can be assured of sufficiently high security by performing log out and re-log in operations. Furthermore, the reason why functions for and "simulated disconnection/re-installation processing" are not provided is that there is no need for them.

③ Log in Processing

The difference between the log in processing of the operation control means 2205B and the attachment processing of the operation control means 2205 is only situational, and when user log in is detected by the log in/log out detection means 2204, the operation control means 2205B sets the authentication status of the wireless telecommunication unit 10 as ready status. Furthermore, the operation control means 2205B erases the data in the write-only file 24a, and in preparation for the user log in, the count of the is number of times the password is entered to the write-only file 24a from the external unit 60 is reset.

In the configuration described above, when a user logs in to the data processing device 6000, this is detected by the log in/log out detection means 2024, and log in processing is carried out in the operation control means 2025B. As described above, since log in processing is the same as attachment processing of the wireless telecommunications unit 10 in the above embodiment, except for some situational differences, the explanation is omitted below.

On the other hand, when the user logs out with respect to the data processing device 6000, this is detected by the log in/log out detection means 2204, and log out processing is carried out in the operation control means 2205B. As described above, since log out processing is the same as detachment processing of the wireless telecommunications unit 10 in the above embodiment, except for some situational differences, the explanation is omitted below.

In accordance with this second variation, high security can be readily assured, as in the case of the wireless telecommunications unit in the above embodiment, pertaining to the fixed wireless telecommunications unit 10 in the data processing device 6000.

It should be noted that a large number of variations can be conceived for this embodiment. For example, in the wireless telecommunications unit relating to the above embodiment, authentication of the user at log in can be carried out. Moreover, data for identifying the user can be data that can specify the user completely, and is not limited to passwords. However the external unit 60 must be rebuilt and modified.

E-6. Advantageous Effects of this Embodiment

In accordance with this embodiment, authentication of individual users can be carried out without in any way modifying external units fir which file access is possible according to an ordinary file access method. That is to say, a high security wireless telecommunications unit can be easily achieved.

Furthermore, if user authentication is implemented at the time of attachment of the wireless telecommunications unit to the external unit and at the time of user log in to an external unit, it is possible to reliably eliminate improper access to memory in the wireless telecommunications unit.

Moreover, writing to the write-only area is permitted up to a designated number of times, and if authentication processing is carried out with each writing, it is possible to avoid the situation where access by a proper user is denied due to an entry error. Furthermore, a higher level of security can be assured if writing to the write-only area from the external unit side is prohibited in cases where the individual cannot be authenticated even if entries are made less than the designated number of times.

Furthermore, a higher level of security can be assured by setting the status of the device such that access other than writing to said write-only areas from the external unit 60 is prevented, when the device is re-installed to the external unit and when a user re-logs in to the external unit.

Moreover, problems due to attachment/detachment of the wireless telecommunications unit not being performed (e.g., problems that develop in the operating system for caching directories and file names in internal memory) can be avoided if dummy signals representing change in the attachment/detachment status of the device with respect to the external unit 60 are output to the external unit 60.

Furthermore, authentication processing can be initiated without actually disconnecting and re-installing the wireless telecommunications unit, if in response to a specified command, the status of the device is allowed to be written only to write-only areas from the external unit side, and attachment of the device (user log in) to the external unit is detected by the attachment detection means (log in detection means). That is to say, the burden on the user can be lightened.

In addition, data that expresses the status of the device can be returned when a request to read out the write-only area is received from the external unit, using an ordinary file access method. Accordingly, it is possible to know the status of the wireless telecommunications unit on the external unit side, by using an ordinary file access method.

F. The Sixth Embodiment

F-1. Configuration of the Embodiment

Figure 43:
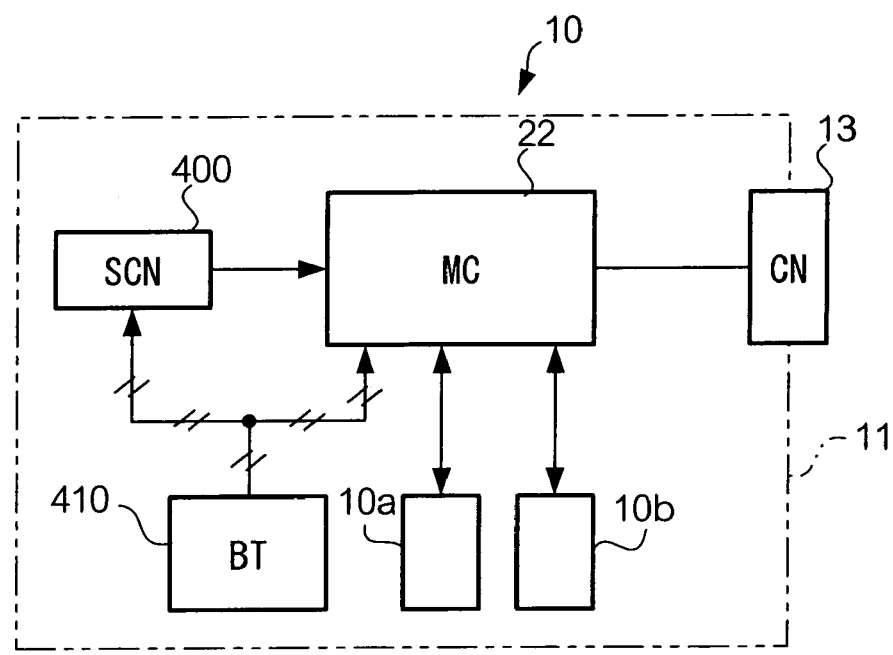
FIG. 43 is a block diagram illustrating the configuration of a wireless telecommunications unit which is the sixth embodiment of this invention.
Figure 44:
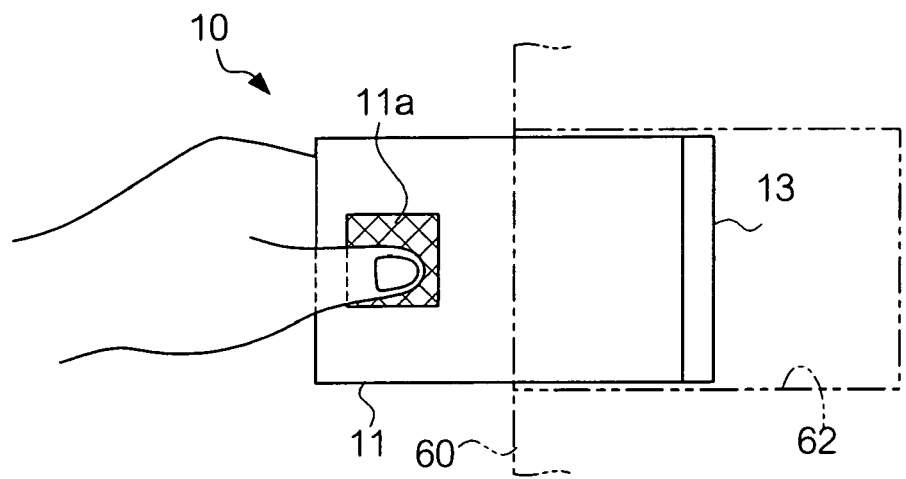
FIG. 44 is a diagram illustrating the appearance of a wireless telecommunications unit attached to an external unit in said embodiment.

FIG. 43 is a block diagram illustrating the configuration of the wireless telecommunications unit 10 which is the sixth embodiment of this invention. This wireless telecommunications unit 10 has a microcontroller 22 of the same type as in the first embodiment, a wireless telecommunications means 10a, a memory mechanism 10b, a connector 13, as well as a biodata detection means (SCN) 400. Furthermore, a battery 410 is installed within the housing 11 of this wireless telecommunications unit 10. Also, the wireless telecommunications unit 10 relating to this embodiment is a PC card, and, as shown in FIG. 44, it is inserted into the card slot 62 of the external unit 60 of a personal computer or the like.

Here, the user holds the holder 11a of the housing 11, and inserts the wireless telecommunications unit 10 into the card slot 62 of the external unit 60. The biodata detection means 400 detects biodata such as fingerprint data of the user who holds the holder 2a and extracts the special features thereof, and provides a means to output the resulting pattern data.

In cases where fingerprint data is detected as the biodata, a specified position on at least one side of the housing 11 (the positions can be different on the two sides) is provided with a holder 11a, and a publicly known CCD (Charge Coupled Device) is provided so as to make it possible to read only the fingerprint that adheres to the holder 11a.

The microcontroller 22 has the same function as the microcontroller 22 in the first embodiment above, and in addition, it has an authentication processing function that authenticates whether or not a user is a specified user, based on the fingerprint data. Furthermore, in specified areas of the memory mechanism 10b are recorded a control program for executing authentication processing, and previously recorded registered data (characteristic patterns of the fingerprints of certain users).

In detail, the microcontroller 22 reads out the previously recorded registered data (characteristic patterns of the fingerprints of certain users) from the specified areas of the memory mechanism 10b, and a comparison is made with the patterns of the fingerprints obtained from the fingerprint data read by the biodata detection means. In this case, the relationship between the reading range and the registered pattern range is such that the reading range is wide and the registered pattern range is narrow. Accordingly, in making the comparison using the microcontroller 22, the reading range is the search area, and the comparison is made by searching for the lengths, intervals, and shapes of fingerprints with similar registered fingerprint patterns within the search area.

As a result of this checking, if the characteristic patterns of two fingerprints are found to match, then a signal corresponding to an authentication result to the effect that this is the person in question is output from the connector 13, and after authentication is finished, the wireless telecommunication unit 10 is in a state that permits certain operations. In this state, this wireless telecommunications unit 10 is able to operate when it is connected to the external unit 60.

On the other hand, as a result of this checking, if the characteristic patterns of the two fingerprints do not match, then a signal corresponding to an authentication result to the effect that this is not the person in question is output from the connector 13, and the state is the same as that prior to authentication, so that certain operations are prohibited. In this operation prohibition state, either the wireless telecommunications unit 10 cannot operate, and does not respond at all to the external unit 60 even though it is connected to the external unit 60, or some of the functions are limited (e.g., the sending operation of the telecommunications device, or access to certain files and directories in the file system are no longer possible).

The operation prohibition state mentioned here is a state in which access is denied to the wireless telecommunications unit 10 from the external unit 60. Furthermore, even in cases where the wireless telecommunications unit 10 is installed in the external unit 60 in the operation prohibition state, when the user holds the holder 11a of the wireless telecommunications unit 10 and biodata is entered, the biodata (fingerprint data) is promptly read and authentication processing can be carried out.

It should be noted that the method of comparing fingerprint data has been disclosed in Japanese Patent Application Laid-Open Publication No. H10-312459, for example.

Furthermore, the microcontroller 22 has a timer mechanism that is not pictured. After the user holds the wireless telecommunications unit 10 and the microcontroller 22 completes authentication, in cases where the wireless telecommunications unit 10 is not inserted into the external unit 60 within a certain predetermined period of time (installation for a normal connection), the authentication results that were already obtained become invalid.

Moreover, in cases where authentication showing that the user is the owner of the card is completed, the microcontroller 22 outputs the designated user identification code or password that is codified by a specified formula to the external unit 60 side via the connector 13, making it possible for a user to be authenticated on the external unit 60 side as well.

F-2. Operation of the Embodiment

Figure 45:
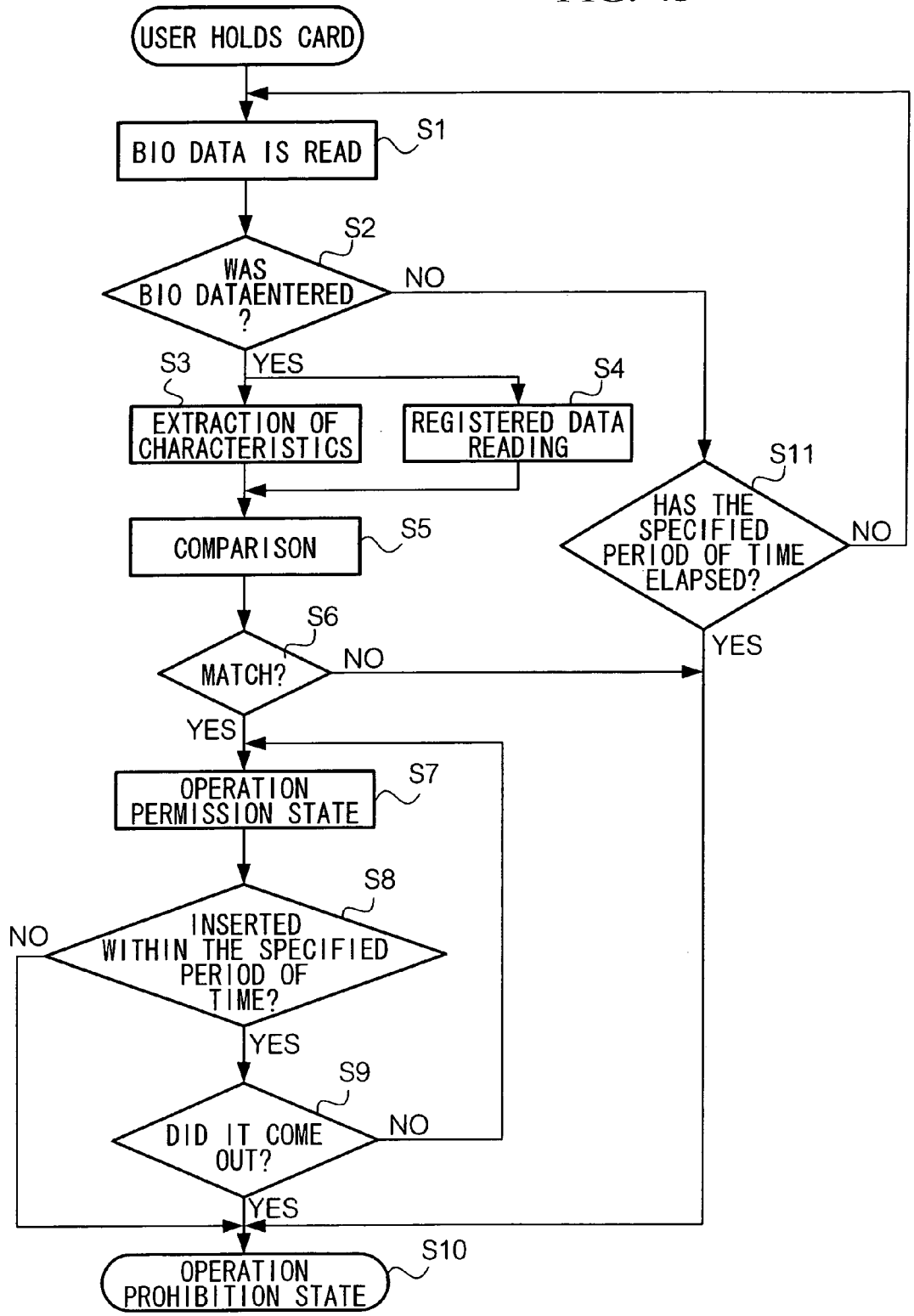
FIG. 45 is a flow chart illustrating the authentication operation of this embodiment.

Following is an explanation of the operation of authentication processing according to the wireless telecommunications unit 10, with reference to the flow chart of FIG. 45.

When a user holds the holder 11a of the housing 11 of the wireless telecommunications unit 10, the microcontroller 22 reads the user's fingerprint data using the biodata detection means 400 (step S1)

Next, the microcontroller 22 determines whether or not the biodata has been entered, that is to say, whether or not the fingerprint of the user adhering to the holder 11a of the housing 11 of the wireless telecommunications unit 10 has been entered or not (step S2). In cases where the biodata has not been entered (step S2; NO), a determination is made as to whether or not a specified time period has elapsed since the user held the card (step S11), and if the specified time period has not elapsed, the fingerprint data is re-entered, and the determination is repeated (steps S1 and S2).

In addition, when the fingerprint data is entered, and when the result of step S2 is "YES," then the microcontroller 22 executes extraction processing of the fingerprint characteristics, based on the fingerprint data (step S3). Furthermore, at the same time, or before this, the microcontroller 22 reads out the fingerprint characteristics data of the registered user from the memory mechanism 10b (step S4).

Next, the microcontroller 22 compares the characteristics of the newly input fingerprint with the characteristics of the user's fingerprints to see if they match (step S5), so as to determine whether or not the characteristics of the two match (step S6).

Also, in response to the processing results, the microcontroller 22 puts the wireless telecommunication unit 10 in a state that permits certain operations after it is connected to the external unit 60, in cases where the characteristics of the two fingerprints match (step S7), and in cases where the characteristics of the two fingerprints do not match (step S6; NO), the wireless telecommunication unit 10 is in a state that prohibits certain operations after it is connected to the external unit 60 (step S10).

It should be noted that in the operation prohibition state, notification signal output can be output to the external unit 60 side, to the effect that operation is prohibited due to the fact that there was no authentication.

Furthermore, in the operation permission state in step S7, the microcontroller 22 subsequently checks whether or not the wireless telecommunications unit 10 is inserted into the PC card slot 62 of the external unit 60 within the specified time period, and whether or not normal connection has taken place (step S8).

If the wireless telecommunications unit 10 has been inserted into the PC card slot 62 within the specified time period (step S8; YES), the microcontroller 22 determines whether or not the wireless telecommunications unit 10 has been removed from the PC card slot 62 of the external unit 60 (step S9), and steps S7–S9 are repeated until the determination result is "YES."

On the other hand, if the specified time elapses with the wireless telecommunications unit 10 not inserted normally into the PC card slot 62 of the external unit 60 (step S8; NO), or if the wireless telecommunications unit 10 is removed after normal insertion (step S9; YES), the microcontroller 22 then gives the wireless telecommunications unit 10 the operation prohibition status (step S10).

F-3. Advantageous Effects of this Embodiment

In such an embodiment as this, since authentication processing is carried out when a user holds the holder 11a of the wireless telecommunications unit 10, authentication of identity can be confirmed when the wireless telecommunications unit 10 is attached to the external unit 60, and there is no need to perform bothersome tasks like password input for authentication processing after attaching the wireless telecommunications unit to the external unit (e.g., a portable PC) as in the past.

That is to say, in this embodiment, authentication is carried out quickly, without the need for authentication processing after attachment, due to the fact that the user holds the wireless telecommunications unit 10 prior to installation of the card.

Therefore, the wireless telecommunications unit 10 is not limited to memory cards, and even if a PC card is used of another storage type, a protection function is added which protects the data stored in the wireless telecommunications unit 10, while making it possible to rapidly write/read data with respect to the wireless telecommunications unit 10.

Furthermore, in this embodiment, the microcontroller 22 is provided with a timer function, and after authentication if normal connection does not take place within a specified time period, the authentication results become invalid, making it possible to further increase the security of the wireless telecommunications unit 10.

In addition, after the wireless telecommunications unit 10 is installed in the external unit 60, this wireless telecommunications unit 10 is managed as a part of the external unit 60, and is used in response to the authentication processing of the user of the external unit 60. Of course, when a password is established for the wireless telecommunications unit 10 as an expanded device, password input is requested at the time of the first use after the power is turned on, and by extracting the special features of voice that was input with a microphone on the external unit 60 side or the wireless telecommunications unit 10 at the far end of the card (far end of the insertion direction), it becomes possible to carry out re-authentication.

F-4. Variations (1) Variation 1

Figure 46:
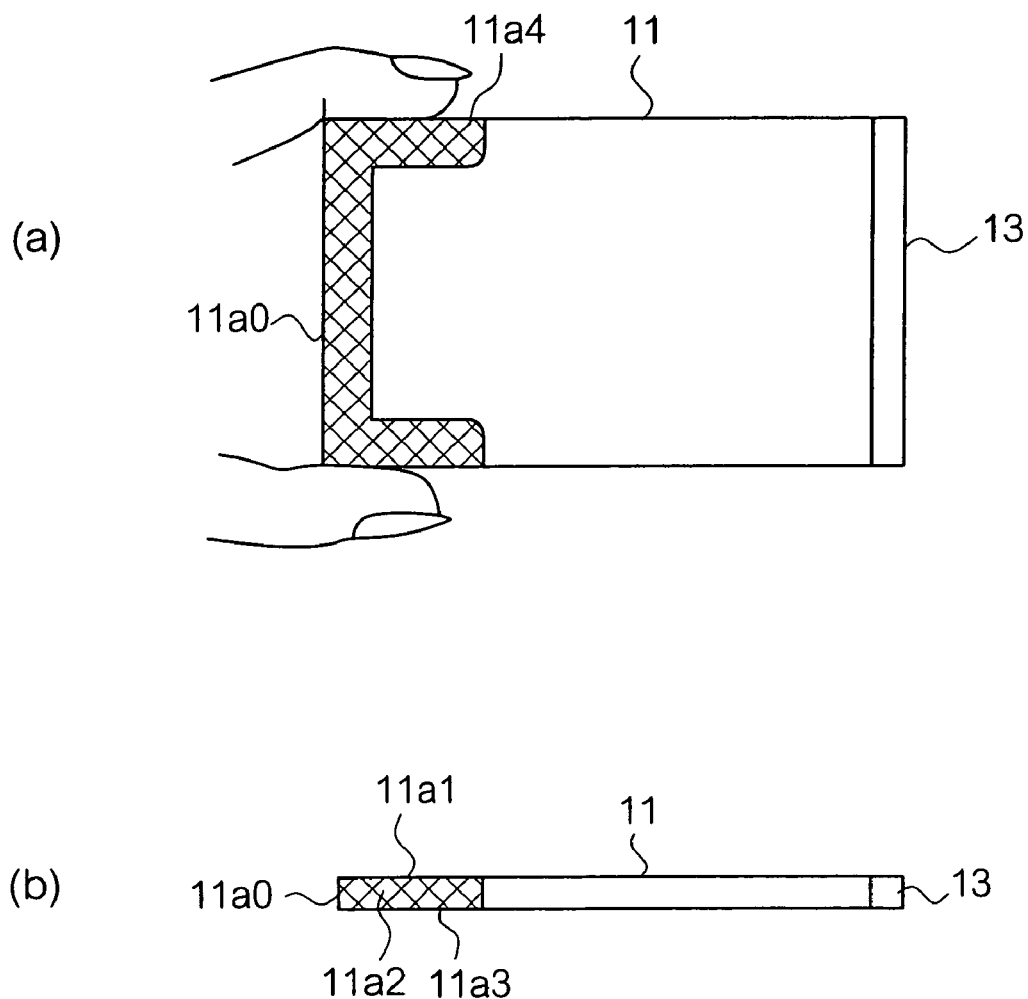
FIG. 46 are a plane view and a side view illustrating a variation on said embodiment.

Part (a) of FIG. 46 shows a plan view of the wireless telecommunications unit 10 according to variation 1 of this embodiment, and part (b) shows a side view of said unit. In this variation, a holder 11a formed with a reference window for detecting fingerprints covers the base end of the housing 11, forming parts 11a1–11a4 of the base end part vicinity of the base end side 11a0 and the 4 sides of the housing 11.

The base side 11a0 of the housing 11 is a part that is pressed mainly by the thumb at the time when insertion is completed. This part does not readily make contact all by itself with the fingers when holding the wireless telecommunications unit 10, but since it can be held simultaneously by sides other than the base end side 11a0, it can be said to form a part of the holder 11a. It goes without saying that any desired shape and number of fingerprint reference windows can be used in parts 11a0–11a4 of the holder 11a. Also, it is also possible to provide fingerprint reference windows of different sizes to both sides of the wireless telecommunications unit 10, and to provide other types of bio data input members (e.g., voice input) at the same time.

(2) Variation 2

The biodata detection means 400 can also detect biodata other than a user's fingerprints. For example, if a switch and microphone are provided to the holder 11a, when a user holds the holder 11a, the microphone can record the user's voice, and the voice can be analyzed and sent as biodata to the microcontroller 22. Sensors that detect users when they hold the apparatus are not limited to mechanical switches. For example, a pressure sensor can be provided to the holder 11a, and when this sensor detects the pressure when the user holds the wireless telecommunications unit 10, it detects the biodata. Also, instead of a pressure sensor, a touch sensor can be provided to the end of the housing 11, and when the shutter on the side of the card slot is opened, biodata can be detected.

G. The Seventh Embodiment

Figure 47:
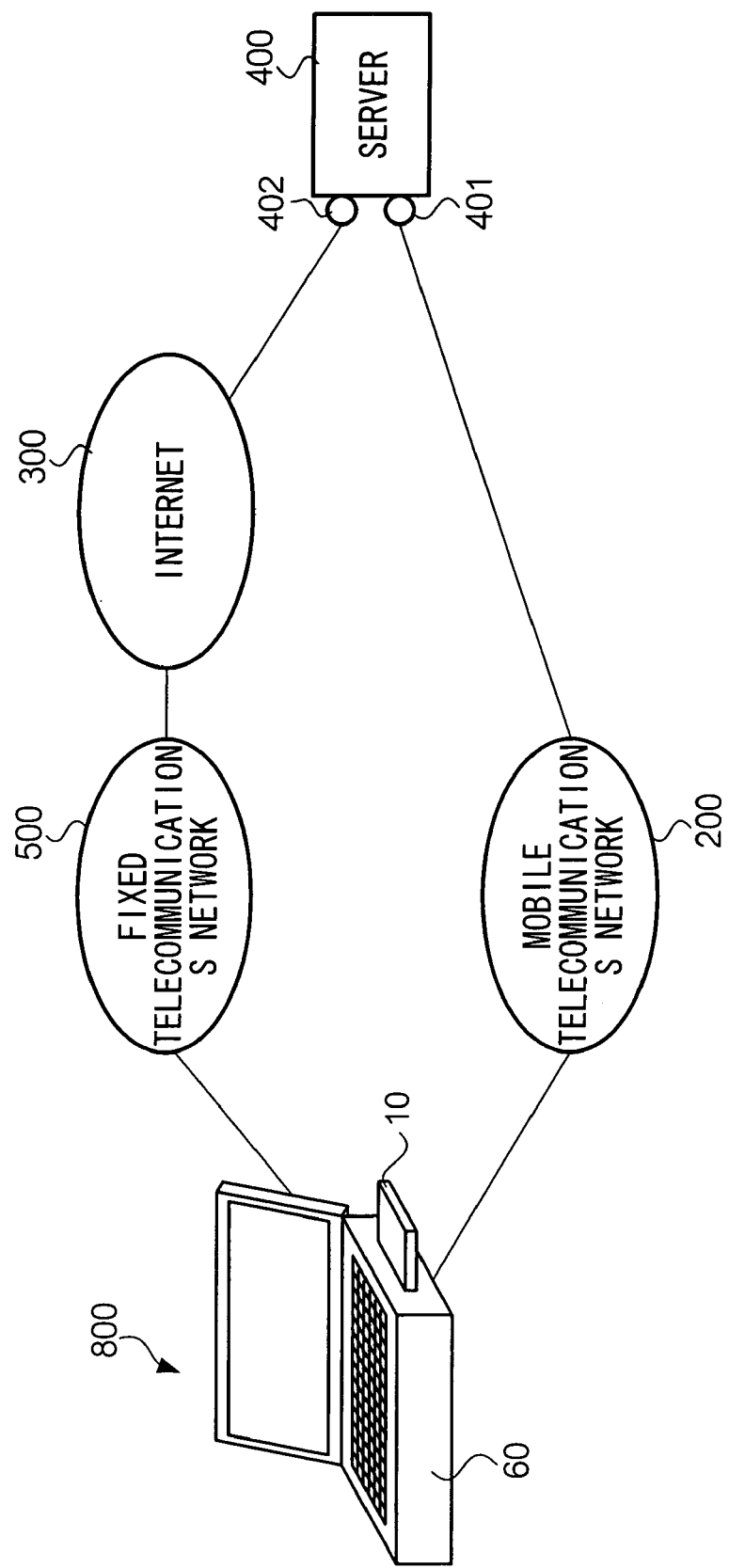
FIG. 47 is a diagram illustrating the first example of a telecommunications system using a wireless telecommunications unit relating to the seventh embodiment of this invention.

G-1. Telecommunications System Configuration Using a Wireless Telecommunications Unit Relating to this Embodiment FIG. 47 is a diagram illustrating the first example of a telecommunications system using a wireless telecommunications unit 10 relating to the seventh embodiment of this invention.

As shown in the figure, this telecommunications system is formed from a telecommunications terminal 800 consisting of a wireless telecommunications unit 10 relating to this embodiment and an external unit 60, a fixed telecommunications network 500, the Internet 300, a mobile telecommunications network 2000, and a server 400. In this telecommunications system, there is relatively little possibility that the fixed telecommunications network 500 and the mobile telecommunications network 200 can be stolen, so the security is great, and secrecy can be maintained on these networks. In contrast, in the case of the Internet, the possibility of theft is relatively high, so security is low, and secrecy cannot be maintained. Accordingly, in this embodiment, session key exchange is carried out between the telecommunications terminal 800 and the server 400, after which enciphered telecommunications is carried out using this session key between the telecommunications terminal 800 and the server 400, via the fixed telecommunications network 500 and the Internet 300.

In this embodiment, an open key coding system is used for enciphering and deciphering for enciphered telecommunications. An open key is used in this open key coding system as a session key.

Here, a session key is an open key that is used for each session (from channel connect until channel disconnect).

A secret key and an open key forming their respective plurality of pairs are recorded in the telecommunications terminal 800 and the server 400, and the telecommunications terminal 800 and the server 400 exchange their open keys as session keys prior to starting a session, and they each keep their secret keys corresponding to the session keys.

In the session, the telecommunications terminal 800 sends the code signals enciphered according to the session key received from the server 400, and the code signals received from the server 400 are deciphered by the secret key. On the other hand, the server 400 sends the code signals enciphered according to the session key received from the telecommunications terminal 800, and the code signals received from the telecommunications terminal 800 are decoded by the secret key.

When telecommunications are carried out between the telecommunications terminal 800 and the server 400 using such a session key, unfair use is prevented such as replay attack by an intruder invading the communication between the telecommunications terminal 800 and the server 400.

The telecommunications terminal 800 is formed by installing the wireless telecommunications unit 10 relating to this embodiment in the card slot of an external unit 60 such as a personal computer.

Figure 48:
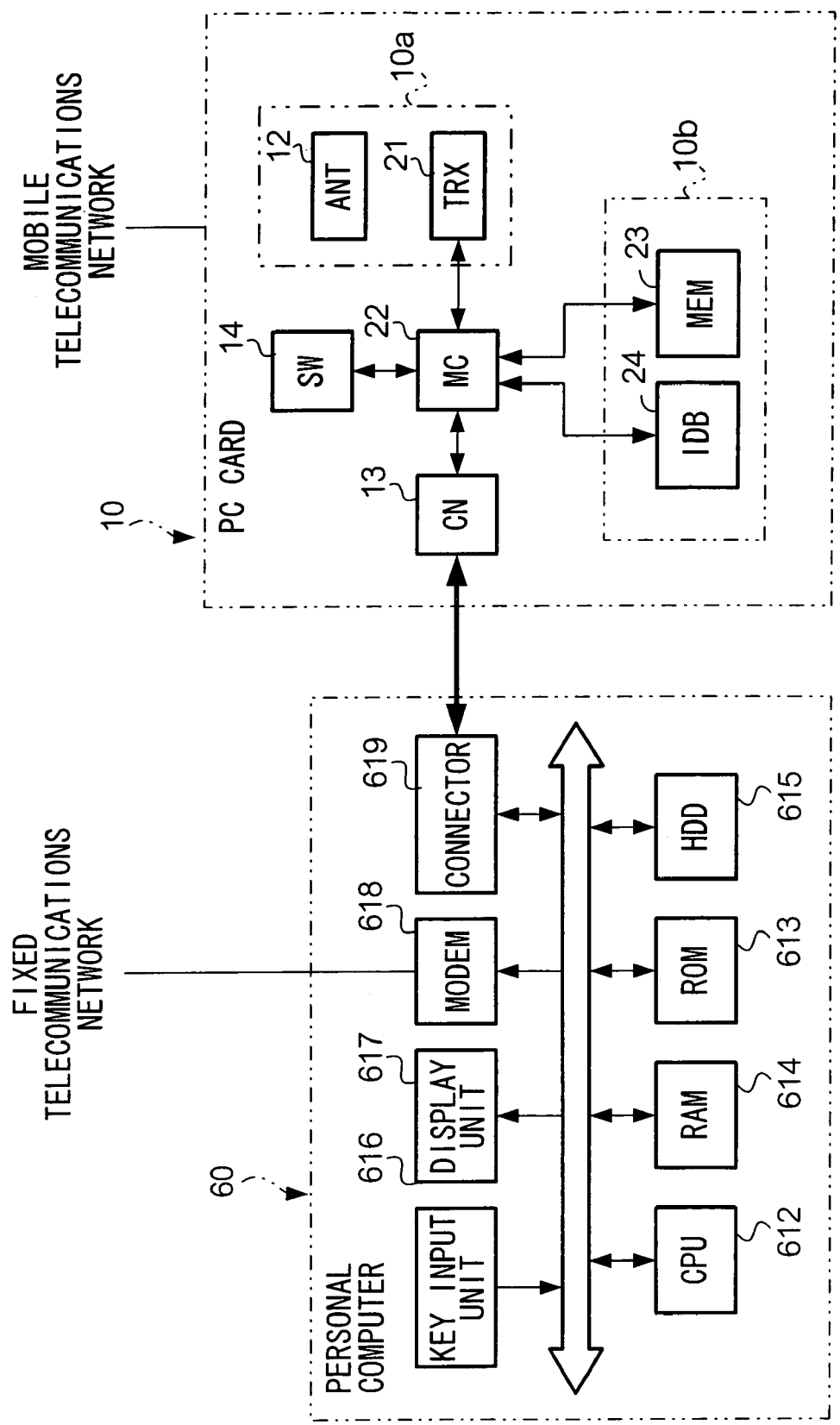
FIG. 48 is a block diagram illustrating the configuration of a telecommunications terminal formed from said wireless telecommunications unit and an external unit 60.

FIG. 48 is a block diagram illustrating the configuration of a telecommunications terminal 800 formed from the wireless telecommunications unit 10 relating to this embodiment and an external unit 60.

As shown in FIG. 48, the external unit 60 is formed from a CPU 612, a ROM (Read Only Memory) 613, a RAM (Random Access Memory) 614, a hard disk device 615, a key input unit 616, a display unit 617, a modem 618 connected to a fixed telecommunications network 500, and a connector 619 provided inside the card slot.

By executing the control programs within the ROM 613, the CPU 612 controls the various parts of the telecommunications terminal 800. The RAM 614 is used as a work area when the CPU 612 executes various types of control programs.

Various programs and various types of data used by the user are stored in the hard disk device 615.

Examples of programs stored in the hard disk device 615 include dial up programs for connecting the external unit 60 to the Internet 300 via the fixed telecommunications network 500, programs for connecting the wireless telecommunications unit 10 to the server 400 via the mobile telecommunications network 200, programs for connecting the modem 618 to the server 400 via the fixed telecommunications network 500 and the Internet 300, programs for enciphered telecommunications, and the like.

Here, dial up programs have the CPU 612 perform the operation of connecting the fixed telecommunications network 500 to the Internet. In detail, a user using the external unit 60 registers in advance with a provider (not pictured) connected to the fixed telecommunications network 500 and the Internet 300. When the fixed telecommunications network 500 and the Internet 300 are connected, the telecommunications terminal 800 inputs a transmission user ID (e.g., ○○○ΔΔ) and a password to the external unit 60. The CPU 612 of the external unit 60 transmits this transmission user ID and password to the provider via the modem 618. The provider carries out authentication processing based on this transmission user ID and the password, and connects the fixed telecommunications network 500 to the Internet 300.

An enciphered telecommunications program has the CPU 12 carry out a series of operations relating to enciphered telecommunications, such as sending a session key exchange request and an open key to the server 400, recording the secret key corresponding to the open key, recording the open key (session key) received from the server 400, enciphers the data using the session key, and deciphering the received code signals using the secret key.

Furthermore, in the hard disk device 615 are recorded the data table 15A (secret keys PSkey1–PSkeyn corresponding to open keys (session keys) POkey1–POkeyn) shown in part (a) of FIG. 50 and the IP address IPa of the external unit 60 IP address IPb of the server 400.

The wireless telecommunications unit 10 performs functions in addition to those in the first embodiment described above.

That is to say, in the wireless telecommunications unit 10 relating to this embodiment, the general-use memory 23 is able to record servers connected to one or more telecommunications networks that do not include the Internet 300 and the identification number of the server 400 in the example in FIG. 47. Also, the microcontroller 22 functions as a channel connection means for connecting channels via one or more telecommunications networks that do not include the Internet, between the servers using the identification number, by using the wireless telecommunications means 10$a$, and functions as a control means for communication of data requiring secrecy using this channel, and specifically the session key.

Figure 49:
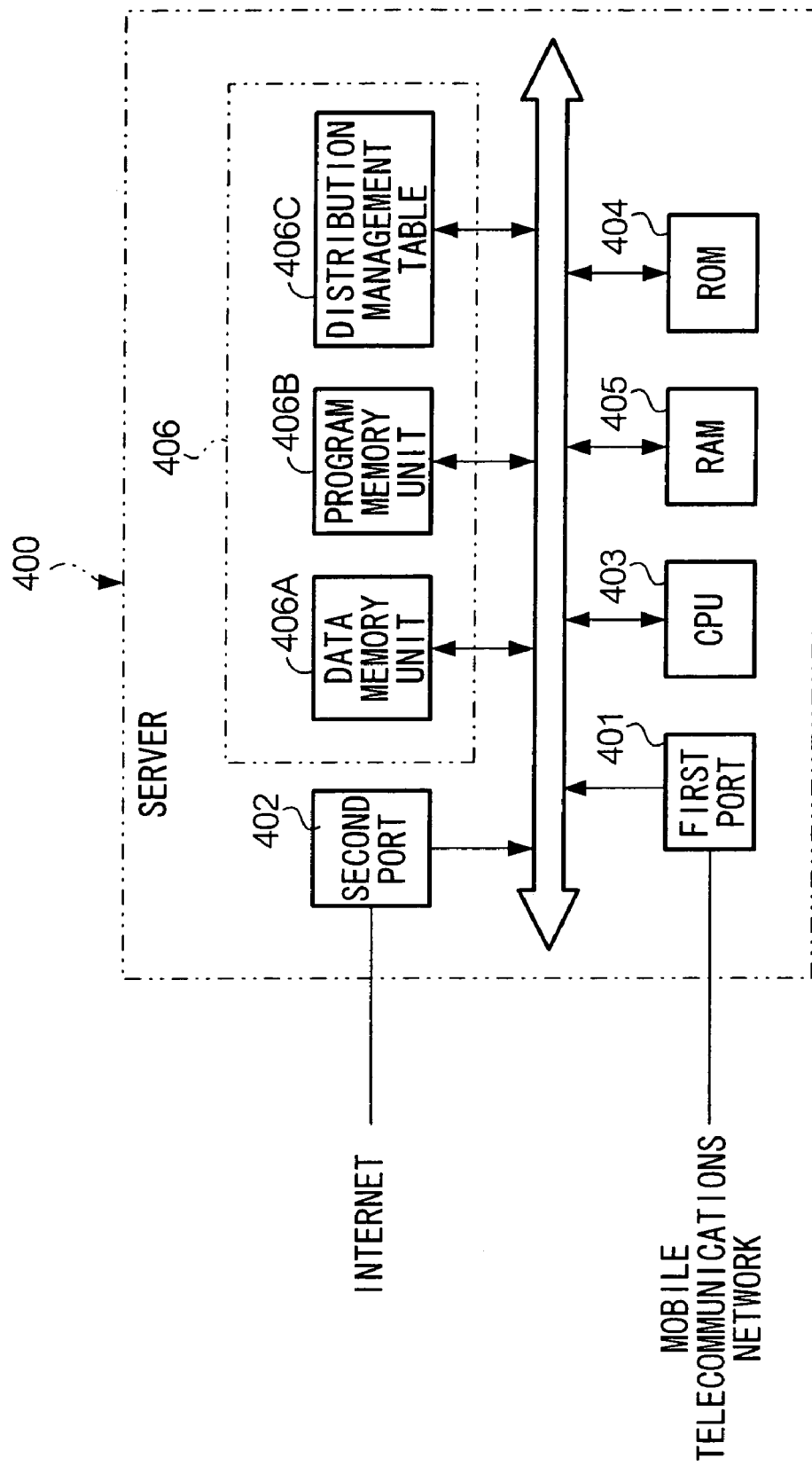
FIG. 49 is a block diagram illustrating a server in said telecommunications system.

FIG. 49 is a block diagram illustrating the configuration of the server 400. The server 400 is formed from a first port 401, a second port 402, a CPU 403, ROM 404, RAM 405, and a hard disk device 406.

The first port 401 is formed from an antenna that is not pictured and a telecommunications transceiver, and is connected to a mobile telecommunications network 200 via a base station. As shown in FIG. 1, this first port 401 is connected to the telecommunications terminal 800 via the mobile telecommunications network 200.

The second port 402 is formed from a modem that is not pictured and a telecommunications control circuit, and is connected to the Internet 300 via a router. As shown in FIG. 1, this second router 402 is connected to the Internet 300 and to the telecommunications terminal 800 via the fixed telecommunications network 500.

ROM 404 is program memory that stores control programs. The CPU 403 executes control programs read from the ROM 404, thereby controlling the server 400 as a whole. At this time, the RAM 405 is used as a work area of the CPU 403. Furthermore, in the ROM 404 are recorded the identification number IDb (e.g., telephone number) of the server 400 and the IP address IPb.

The hard disk device 406 has the memory areas known as data memory unit 406A, program memory unit 406B, and distribution management table 406C.

In the data memory unit 406A is recorded distribution data showing data to be distributed to the telecommunications terminal 800, as well as menu data for displaying the titles of these data on the display unit 617 of the telecommunications terminal 800.

The recorded data include text data with characters and symbols, music data with voice and music, image data with still image and movie image, computer programs such as game software and the like. Music data can be compressed according to the MP3 (MPEG Layer 3) format, image data can be compressed according to the GIF (Graphics Interchange Format) format, JPEG (Joint Photographic Experts Group) format, or the MPEG (Moving Photographic Experts Group) format.

The program memory unit 406B contains a data distribution program, an authentication program, a program that connects the first port 401 to the wireless telecommunications unit 10 of the telecommunications terminal 800 via the mobile telecommunications network 200, a program that connects the second port 402 to the modem 618 of the telecommunications terminal 800 via the fixed telecommunications network 500 and the Internet 300, and a program for codes telecommunications.

Here, the data distribution program has the CPU 403 carry out the creation and transmission of distribution data in response to request data transmitted from a telecommunications terminal 800. The authentication program has the CPU 403 carry out user authentication based on user IDs and passwords recorded in the distribution management table 406C.

The program for enciphered telecommunications has the CPU 403 perform a series of operations related to enciphered telecommunications, such as the transmission of open keys, recording the secret keys corresponding to the open keys, recording the open keys (session keys) received from the telecommunications network 800, enciphering the data using these session keys, and deciphering the received enciphered symbols using the secret keys.

Furthermore, the program memory unit 406B contains the table 406D (secret keys SSkey1–SSkeyn corresponding to the open keys (session keys) SOkey1–SOkeyn) shown in part (b) of FIG. 50.

The distribution management table 406C contains user IDs and passwords registered in advance. These data are compared with the received IDs and passwords, and are used to identify the telecommunications terminal 800 (user).

G-2. First Operational Example of the Telecommunications System

Figure 51:
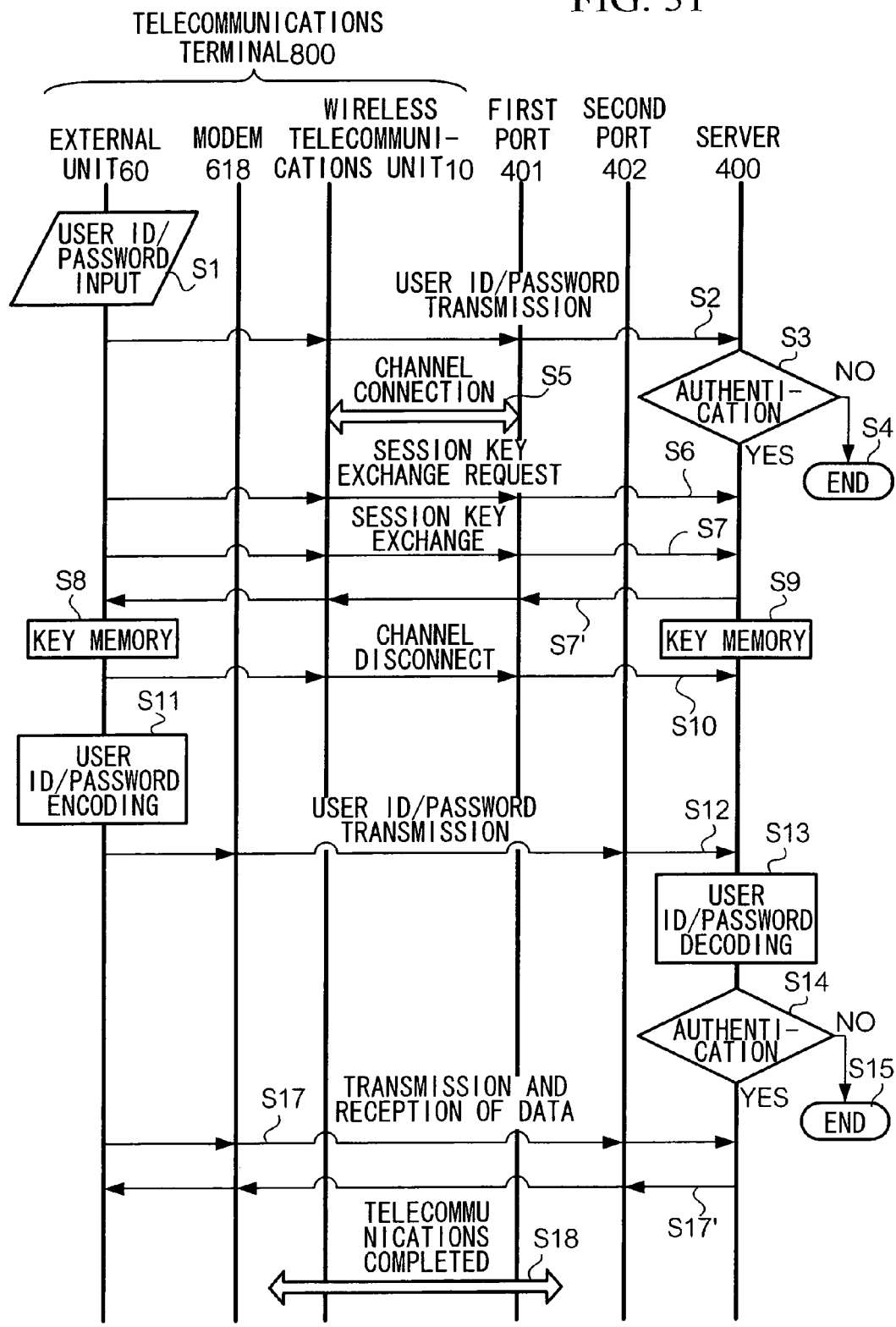
FIG. 51 is a sequence chart illustrating the first operational example of said telecommunications system.

Following is an explanation of the operation of this embodiment, with reference to the sequence chart given in FIG. 51.

First, in order to send and receive data to and from the server 400, the user enters the user ID and password (referred to below as authentication data) that were registered in advance with the server 400, to the key input unit 616 of the external unit 60 (step S1).

The CPU 612 of the external unit 60 records this authentication data in the RAM 614 and sends the authentication data to the wireless telecommunications unit 10, in accordance with a control program.

In accordance with a control program recorded in the general-use memory 23, the microcontroller 22 of the wireless telecommunications unit 10 adds to the authentication data the identification code IDb of the server 400 as the destination, and the identification code IDc of the wireless telecommunications unit 10 as the transmission source, and this data is sent to the base station of the mobile telecommunications network 200 by the wireless telecommunications means 10a. Accordingly, the data containing the user ID and the password is sent to the base station on the side of the server 400 via the mobile telecommunications network 200, and then sent from the base station to the first port 401 (server 400) (step S2).

The CPU 403 of the server 400 starts the authentication program stored in the program memory unit 406B when it receives the authentication data. The CPU 403 carries out authentication processing with respect to the user IDs and passwords of the authentication data received from the first port 401, based on this program (step S3).

Here, when the received user ID and password were not recorded beforehand in the distribution management table 406C (step S3; NO), the CPU 403 finishes the processing (step S4).

On the other hand, when the received user ID and password were recorded beforehand in the distribution management table 406C (step S3; YES), the CPU 403 sends a permission signal to the wireless telecommunications unit 10 (external unit 60). The external unit 60 and the server 400 start the programs to connect them. In accordance with this program, a channel is created between the wireless telecommunications unit 10 and the first port 401 of the server 400 (step S5), and the telecommunications terminal 800 is connected to the server 400.

Next, in accordance with the program for enciphered telecommunications recorded in the hard disk device 615, the CPU 612 of the external unit 60 sends the exchange request data of the session key to the wireless telecommunications unit 10.

In accordance with a control program, the microcontroller 22 of the wireless telecommunications unit 10 adds to the exchange request data the identification number IDb of the server 400 as the destination, and the identification number IDc of the wireless telecommunications unit 10 as the transmission source, and this data is sent to the base station of the mobile telecommunications network 200 via the wireless telecommunications means 10a. Accordingly, the exchange request data is sent to the server 400 via the mobile telecommunications network 200 (channel) (step S6).

In accordance with the program for enciphered telecommunications, the CPU 612 of the external unit 60 selects an open key POkey1 as a session key from the data table 15A stored in the hard disk device 615, and sends this session key POkey1 to the wireless telecommunications unit 10. The microcontroller 22 of the wireless telecommunications unit 10 adds to the session key POkey1 the identification number IDb as the destination and the identification number IDc of the wireless telecommunications unit 10 as the transmission source, and this data is sent to the server 400 via the channel (step S7).

Furthermore, when the CPU 403 of the server 400 takes the exchange request data, it selects as a session key the open key SOkey1 from the data table 406D stored in the program memory unit 406B, in accordance with a program for enciphered telecommunications stored in the program memory unit 406B, and adds to this session key SOkey1 the identification number IDc of the wireless telecommunications unit 10 as the destination and the identification number IDb of the server 400 as the transmission source, and sends this data to the wireless telecommunications unit 10 via the mobile telecommunications network 200 (channel) from the first port 401 (step S7). Also, the microcontroller 22 of the wireless telecommunications unit 10 sends the session key SOkey1, which was transmitted from the server 400, to the external unit 60.

In addition to recording in the RAM 614 the session key SOkey1 received from the server 400 via the channel and the wireless telecommunications unit 10, the CPU 612 of the external unit 60 also records in the RAM 614 the secret key PSkey1 corresponding to the transmitted session key POkey1 (step S8).

In addition to recording in the RAM 405 the session key POkey1 of the external unit received via the channel, the CPU 403 of the server 400 also records the secret key SSkey1 corresponding to the transmitted session key SOkey1 (step S9).

Also, when the exchange of session keys is finished, the CPU 612 of the external unit 60 sends to the server 400 a signal disconnecting the channel, so that the channel connection is disconnected (step S10).

Next, in accordance with a program for enciphered telecommunications, the CPU 612 of the external unit 60 reads the authentication data recorded in the RAM 614 (user ID and password) and the session key SOkey1, and enciphers this authentication data with the session key SOkey1 (step S11). Also, to this enciphered authentication data is added the IP address IPb of the server 400 as the destination, and the IP address IPa of the external unit 60 as the transmission source, and this data is sent to the fixed telecommunications network 500 via the modem 618. Accordingly, the enciphered authentication data is sent to the second port 402 of the server 400 via the fixed telecommunications network 500 and the Internet 300 (step S12).

When the CPU 403 of the server 400 receives the enciphered authentication data, it reads the secret key SSkey1 recorded in the RAM 405, in accordance with a program for enciphered telecommunications, and then deciphers the authentication data enciphered by this secret key SSkey1 (step S13).

Also, based on the authentication program, the CPU 403 carries out authentication processing with respect to the user ID and password of the decoded authentication data (step S14).

Here, when the decoded user ID and password were not recorded beforehand in the distribution management table 406C (step S14; NO), the CPU 403 finishes the processing (step S15).

On the other hand, when the decoded user ID and password were recorded beforehand in the distribution management table 406C (step S14; YES), a permission signal is sent to the modem 618 (external unit 60). The external unit 60 and the server 400 start the programs to connect them. In accordance with this program, the modem 618 and the second port 402 of the server 400 are connected via the fixed telecommunications network 500 and the Internet 300.

After that, data exchange is carried out between the telecommunications terminal 800 and the server 400 by enciphered telecommunications via the fixed telecommunications network 500 and the Internet 300.

That is to say, based on a program for enciphered telecommunications, the CPU 612 of the external unit 60 enciphers the data sent to the server 400 with the session key SOkey1 recorded in the RAM 614, and sends it to the server 400 (step S17). On the other hand, the CPU 612 deciphers the received data enciphered on the server 400 side, using the secret key PSkey1 recorded in the RAM 614.

On the other hand, based on a program for enciphered telecommunications, the CPU 403 of the server 400 enciphers the data sent to the external unit 60, using the session key POkey1 recorded in the RAM 405, and sends it to the telecommunications terminal 800 (step S17). And on the other hand, the CPU 403 deciphers the received data that was enciphered on the external unit 60 side, using the secret key SSkey1 recorded in the RAM 405.

Accordingly, the telecommunications terminal 800 receives the data recorded in the data memory unit 406A of the server 400, thereby enhancing the security.

Also, when data exchange is completed, the CPU 612 of the external unit 60 terminates the telecommunications (step S18). At the same time, the session keys and secret keys recorded in the external unit 60 and the server 400, respectively, are deleted, thereby invalidating the session keys and secret keys. It should be noted that by keeping the session keys and secret keys active, they can be automatically made invalid, and the keys can be deleted without fixed telecommunications network 500 and the Internet 300 getting disconnected.

G-3. Second Operational Example

Figure 52:
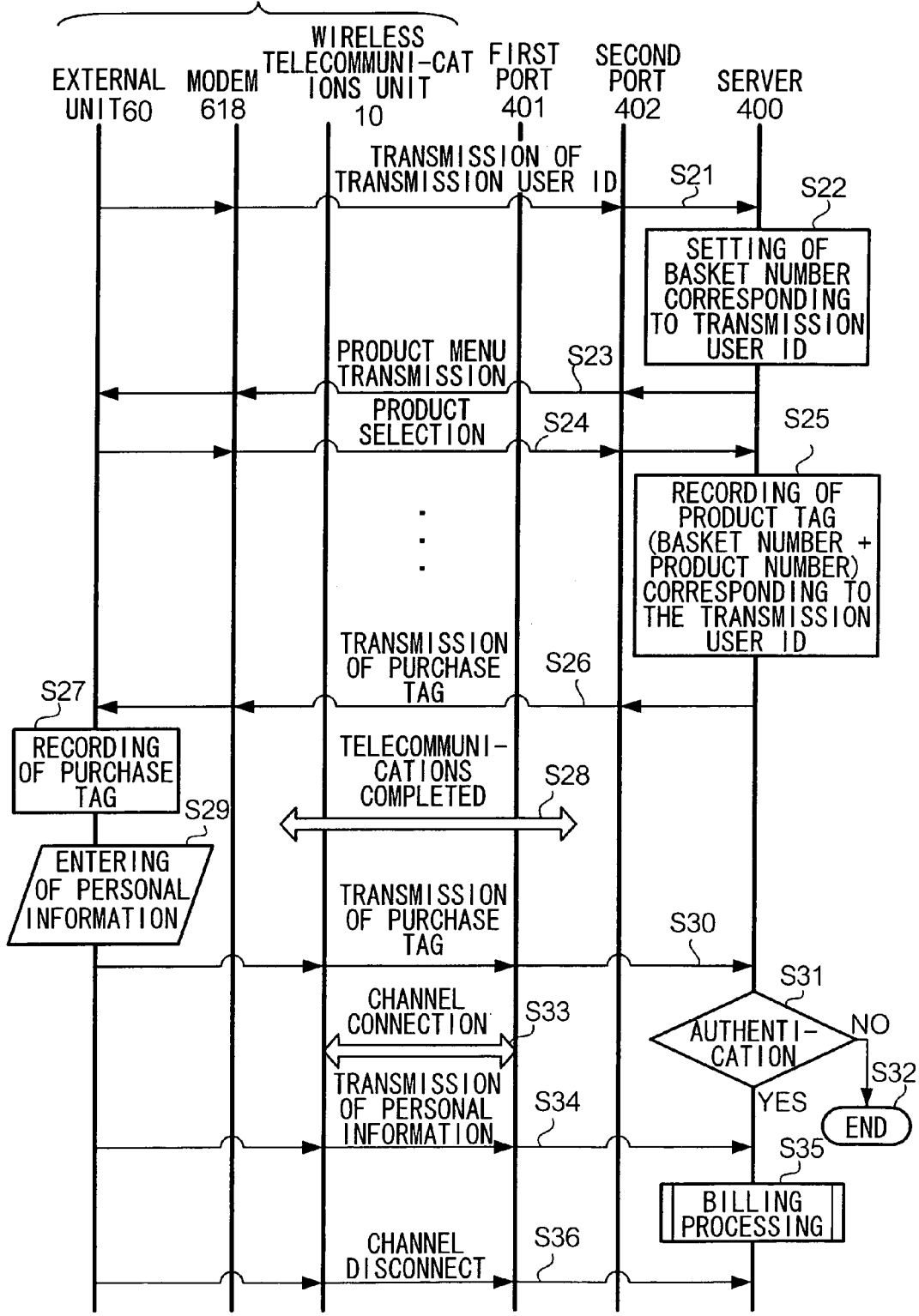
FIG. 52 is a sequence chart illustrating the second operational example of said telecommunications system.

FIG. 52 is a sequence chart illustrating an operational example where the telecommunications system is used for e-commerce.

In this operational example, the server 400 is an electronic shopping server for electronic commerce. The hard disk device 406 of this server 400 contains product information and programs for executing purchases.

In further detail, menu data for products sold to users, product information data, and the like are recorded in the data memory unit 406A. It should be noted that menu data can include product photographs and specifications, a variety of information and product numbers corresponding to products.

Furthermore, data distribution programs, authentication programs, as well as product purchasing programs and billing processing programs are stored in the program memory unit 406B.

Here, a product purchasing program has the CPU 403 allocate basket numbers B1–Bn for each user, and write the products the user wishes to purchase to each of these basket numbers.

A billing processing program has the CPU 403 carry out invoicing to credit card companies for the amount spent on the products written into the baskets when personal information such as credit card number and shipping destination for the products is sent by the user.

Following is an explanation of the second operational example of this embodiment, based on the sequence chart given in FIG. 52.

First, the user inputs the transmission user ID and password from the key input unit 616, so as to execute the aforementioned dial up program for the external unit 60. Accordingly, the CPU 612 of the external unit 60 sends this transmission user ID and password to the provider, and the fixed telecommunications network 500 is connected to the Internet 300.

Furthermore, in this operational example, since the transmission user ID is used for authentication on the server 400 side, the CPU 612 of the external unit 60 sends to this transmission user ID a connect request with the IP address IPb of the server 400 as the destination, and the IP address IPa of the external unit 60 as the transmission source, via the fixed telecommunications network 500 and the Internet 300 (step S21).

Here, the CPU 403 of the server 400 executes product purchasing programs stored in the program memory unit 406B. Based on this program, the CPU 403 allocates basket number B1 corresponding to the transmission user ID, and records it in the RAM 405 (step S22).

Moreover, the CPU 403 of the server 400 reads the menu data of the data memory unit 406A, and adds to this menu data the IP address IPa of the external unit 60 as the destination, and the IP address IPb of the server 400 as the transmission source, and this data is sent to the external unit 60 via the Internet 300 and the fixed telecommunications network 500 (step S23).

The CPU 612 of the external unit 60 displays the received menu data on the display unit 617. Accordingly, the user gains an understanding of the products sold by the server 400.

The user refers to the menu of the display unit 617 of the external unit 60 and selects the desired product. That is to say, the user executes a predetermined selection operation, so that the CPU 612 sends a product number (e.g., ddd), selected by the user, to the server 400 via the fixed telecommunications network 500 and the Internet 300 (step S24). The predetermined selection operation involves pointing with a mouse-driven arrow to the products displayed on the display unit 617 and clicking. Then, the CPU 403 of the server 400 writes the selected product number ddd to the corresponding basket B1.

When the user is finished selecting products, a predetermined signal is input by the user to the external unit 60, and the CPU 612 of the external unit 60 sends the selection complete signal to the server 400 via the fixed telecommunications network 500 and the Internet 300.

The CPU 403 of the server receives the selection complete signal, and records the purchase tag corresponding to the transmission user ID (the basket number B1+the product number ddd) in the RAM 405 (step S25). Moreover, the CPU 403 of the server 400 adds to this purchase tag the IP address IPa of the external unit 60 as the destination, and the IP address IPb of the server 400 as the transmission source, and this data is sent to the external unit 60 via the fixed telecommunications network 500 and the Internet 300 (step S26).

The CPU 612 of the external unit 60 records this purchase tag in the RAM 614 (step S27). Also, once the product purchasing process is completed, the CPU 612 of the external unit 60 ends the communication with the fixed telecommunications network 500 and the Internet 300 (step S28).

Next, in order to transmit the personal information such as the credit card number and shipping address to the server 400, the user enters the personal information to the key input unit 616 of the external unit 60. (step S29). This personal information is information that would cause a great deal of trouble to the user if stolen.

The CPU 612 of the external unit 60 reads the purchase tag from the RAM 614, and sends this purchase tag to the wireless telecommunications unit 10, in accordance with a control program.

In accordance with a control program stored in the general-use memory 23, the microcontroller 22 of the wireless telecommunications unit 10 adds to the purchase tag the identification number IDb of the server 400 as the destination, and the identification number IDc of the wireless telecommunications unit 10, and this data is sent to the base station via the wireless telecommunications means 10a. Accordingly, the purchase tag is sent to the base station on the side of the server 400 via the mobile telecommunications network 200, and then sent from this base station to the first port 401 (server 400) (step S30).

When the CPU 403 of the server 400 receives the purchase tag, the authentication program stored in the program memory unit 406B is started. Based on this program, the CPU 403 performs authentication processing on the purchase tag received from the first port 401 (step S31).

Here, when the received purchase tag is not recorded in the RAM 405 (step S31; NO), the CPU 403 completes the processing (step S32).

On the other hand, when the received purchase tag is recorded in the RAM 405 (step S30; YES), the permission signal is sent by the CPU 403 to the wireless telecommunications unit 10 (external unit 60). The program connecting the external unit 60 and the server 400 to each other is started. In accordance with this program, a channel is established between the wireless telecommunications unit 10 and the first port 401 of the server 400 (step S33), and the telecommunications terminal 800 is connected to the server 400.

Next, the CPU 612 of the external unit 60 sends the personal information to the wireless telecommunications unit 10 in accordance with a control program.

In accordance with a control program stored in the general-use memory 23, the microcontroller 22 of the wireless telecommunications unit 10 adds to the personal information the identification number IDb of the server 400 as the destination, and the identification number IDc of the wireless telecommunications unit 10, and this data is sent to the base station via the wireless telecommunications means 10a. Accordingly, the personal information is sent to the base station on the side of the server 400 via the mobile telecommunications network 200, and then sent from this base station to the first port 401 (server 400) (step S34).

When the CPU 403 of the server 400 receives this personal information, billing processing is carried out (step S35). In this case, the credit card company is invoiced for the amount spent on the product ddd, and the product ddd is sent to the shipping address.

Also, when transmission of the personal information is finished, the CPU 612 of the external unit 60 sends a signal to terminate the channel connection to the server 400, and the channel is disconnected (step S36).

G-4. Third Operational Example

The server 400 in this embodiment is an electronic shopping server. Thus, the hard disk device 406 of the server 400 contains programs for product information and sales.

That is to say, menu data for products sold to the user and product information is stored in the data memory unit 406A. It should be noted that menu data can include product photographs and specifications, a variety of information and product numbers corresponding to products.

Furthermore, data distribution programs, authentication programs, as well as product purchasing programs and billing processing programs are stored in the program memory unit 406B.

Here, a product purchasing program has the CPU 403 allocate basket numbers B1–Bn for each user, and write the products the user wishes to purchase to each of these basket numbers.

A billing processing program has the CPU 403 carry out invoicing to credit card companies for the amount spent on the products written into the baskets when personal information such as credit card number and shipping destination for the products is sent by the user.

Figure 53:
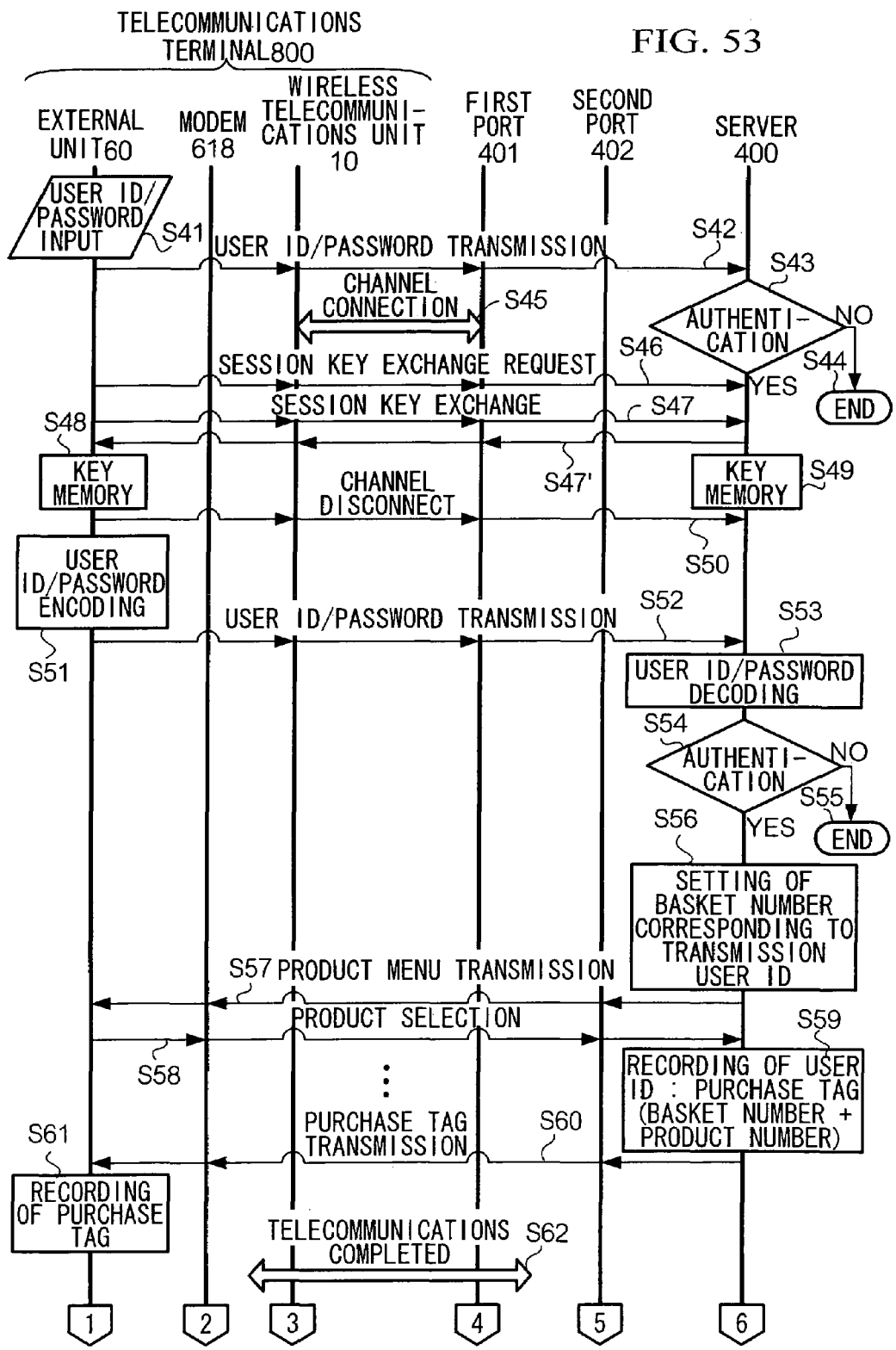
FIG. 53 is a sequence chart illustrating the third operational example of said telecommunications system.
Figure 54:
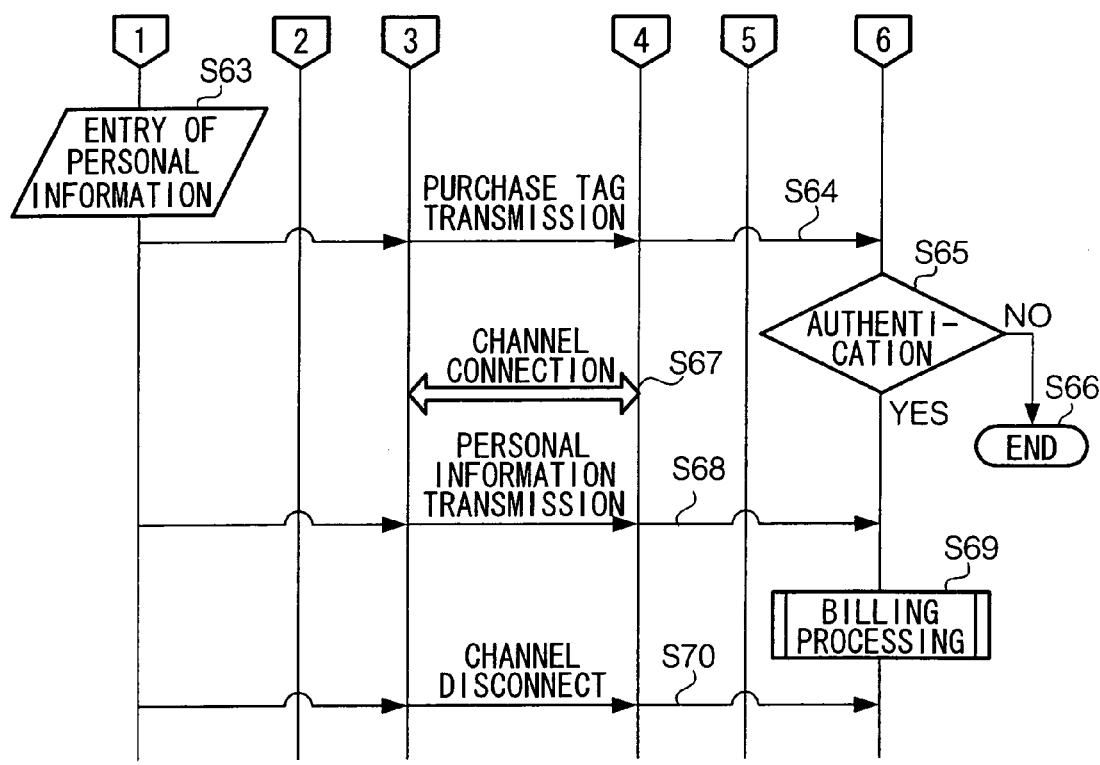
FIG. 54 is a sequence chart illustrating the third operational example of said telecommunications system.

The third operational example of this embodiment is explained with reference to the sequence charts given in FIG. 53 and FIG. 54.

First, the user inputs the user ID and password (referred to below as authentication data) previously registered with the server 400 to the key input unit 616 of the external unit 60 (step S41).

The CPU 612 of the external unit 60 records this authentication data in the RAM 614 and sends the authentication data to the wireless telecommunications unit 10, in accordance with a control program.

In accordance with a control program recorded in the general-use memory 23, the microcontroller 22 of the wireless telecommunications unit 10 adds to the authentication data the identification code IDb of the server 400 as the destination, and the identification code IDc of the wireless telecommunications unit 10 as the transmission source, and this data is sent to the base station of the mobile telecommunications network 200 by the wireless telecommunications means 10a. Accordingly, the data containing the user ID and the password is sent to the base station on the side of the server 400 via the mobile telecommunications network 200, and then sent from the base station to the first port 401 (server 400) (step S42).

The CPU 403 of the server 400 starts the authentication program stored in the program memory unit 406B when it receives the authentication data. The CPU 403 carries out authentication processing with respect to the user IDs and passwords of the authentication data received from the first port 401, based on this program (step S43).

Here, when the received user ID and password were not recorded beforehand in the distribution management table 406C (step S43; NO), the CPU 403 finishes the processing (step S44).

On the other hand, when the received user ID and password were recorded beforehand in the distribution management table 406C (step S43; YES), the CPU 403 sends a permission signal to the wireless telecommunications unit 10 (external unit 60). The external unit 60 and the server 400 start the programs to connect them. In accordance with this program, a channel is created between the wireless telecommunications unit 10 and the first port 401 of the server 400 (step S45), and the telecommunications terminal 800 is connected to the server 400.

Next, in accordance with the program for enciphered telecommunications recorded in the hard disk device 615, the CPU 612 of the external unit 60 sends the exchange request data of the session key to the wireless telecommunications unit 10.

In accordance with a control program, the microcontroller 22 of the wireless telecommunications unit 10 adds to the exchange request data the identification number IDb of the server 400 as the destination, and the identification number IDc of the wireless telecommunications unit 10 as the transmission source, and this data is sent to the base station of the mobile telecommunications network 200 via the wireless telecommunications means 10a. Accordingly, the exchange request data is sent to the server 400 via the mobile telecommunications network 200 (channel) (step S46).

In accordance with the program for enciphered telecommunications, the CPU 612 of the external unit 60 selects an open key POkey1 as a session key from the data table 15A stored in the hard disk device 615, and sends this session key POkey1 to the wireless telecommunications unit 10. The microcontroller 22 of the wireless telecommunications unit 10 adds to the session key POkey1 the identification number IDb as the destination and the identification number IDc of the wireless telecommunications unit 10 as the transmission source, and this data is sent to the server 400 via the channel (step S47).

Furthermore, the CPU 403 selects as a session key the open key SOkey1 from the data table 406D stored in the program memory unit 406B, in accordance with a program for enciphered telecommunications stored in the program memory unit 406B, and adds to this session key SOkey1 the identification number IDc of the wireless telecommunications unit 10 as the destination and the identification number IDb of the server 400 as the transmission source, and sends this data to the wireless telecommunications unit 10 via the mobile telecommunications network 200 (channel) from the first port 401 (step S47').

Also, the microcontroller 22 of the wireless telecommunications unit 10 sends the session key SOkey1, which was transmitted from the server 400, to the external unit 60.

In addition to recording in the RAM 614 the session key SOkey1 received from the server 400 via the channel and the wireless telecommunications unit 10, the CPU 612 of the external unit 60 also records in the RAM 614 the secret key PSkey1 corresponding to the transmitted session key POkey1 (step S48).

In addition to recording in the RAM 405 the session key POkey1 of the external unit received via the channel, the CPU 403 of the server 400 also records the secret key SSkey1 corresponding to the transmitted session key SOkey1 (step S49).

Also, when the exchange of session keys is finished, the CPU 612 of the external unit 60 sends to the server 400 a signal disconnecting the channel, so that the channel connection is disconnected (step S50).

Next, enciphered telecommunications using the session key obtained by the aforementioned processing is carried out via the fixed telecommunications network 500 and the Internet 200. Before starting this processing, the aforementioned dial up program is executed, and the fixed telecommunications network 500 is connected to the Internet 200.

Next, in accordance with a program for enciphered telecommunications, the CPU 612 of the external unit 60 reads the authentication data recorded in the RAM 614 (user ID and password) and the session key SOkey1, and enciphers this authentication data with the session key SOkey1 (step S51). Also, to this enciphered authentication data is added the IP address IPb of the server 400 as the destination, and the IP address IPa of the external unit 60 as the transmission source, and this data is sent to the fixed telecommunications network 500 via the modem 618. Accordingly, the enciphered authentication data is sent to the second port 402 of the server 400 via the fixed telecommunications network 500 and the Internet 300 (step S52).

When the CPU 403 of the server 400 receives the enciphered authentication data, it reads the secret key SSkey1 recorded in the RAM 405, in accordance with a program for enciphered telecommunications, and then deciphers the authentication data enciphered by this secret key SSkey1 (step S53).

Also, based on the authentication program, the CPU 403 carries out authentication processing with respect to the user ID and password of the decoded authentication data (step S54).

Here, when the decoded user ID and password were not recorded beforehand in the distribution management table 406C (step S54; NO), the CPU 403 finishes the processing (step S55).

On the other hand, when the decoded user ID and password were recorded beforehand in the distribution management table 406C (step S54; YES), a permission signal is sent to the modem 618 (external unit 60). The external unit 60 and the server 400 start the programs to connect them. In accordance with this program, the modem 618 and the second port 402 of the server 400 are connected via the fixed telecommunications network 500 and the Internet 300.

After that, enciphered telecommunications is carried out between the telecommunications terminal 800 and the server 400 via the fixed telecommunications network 500 and the Internet 300 (step S57, S58, S60).

Here, the CPU 403 of the server 400 executes product purchasing programs stored in the program memory unit 406B. Based on this program, the CPU 403 allocates basket number B1 corresponding to the transmission user ID, and records it in the RAM 405 (step S56).

Moreover, the CPU 403 of the server 400 reads the menu data of the data memory unit 406A, and enciphers this menu data with the session key POkey1, and adds the IP address IPa of the external unit 60 as the destination, and the IP address IPb of the server 400 as the transmission source, and this data is sent to the external unit 60 via the fixed telecommunications network 500 and the Internet 300 (step S57).

The CPU 612 of the external unit 60 decodes the received menu data using the secret key PSkey1, and displays the received menu data on the display unit 617. Accordingly, the user gains an understanding of the products sold by the server 400.

The user refers to the menu of the display unit 617 of the external unit 60 and selects the desired product. That is to say, when the user selects the product number (e.g., ddd) of the selected product, the CPU 612 of the external unit 60 enciphers the product number ddd with the session key SOkey1, and adds to this enciphered product number the IP address IPb of the server as the destination, and the IP address IPa of the external unit 60 as the transmission source, and sends this enciphered product number to the fixed telecommunications network 500 via the modem 618. Accordingly, the enciphered product number is sent to the second port 402 via the fixed telecommunications network 500 and the Internet 300 (step S58).

The predetermined selection operation involves pointing with a mouse-driven arrow to the products displayed on the display unit 617 and clicking.

Then, when the CPU 403 of the server 400 receives the enciphered product number, it reads out the secret key SSkey1 recorded in the RAM 405 in accordance with a program for enciphered telecommunications, and copies the enciphered product number with this secret key SSkey1. Then, the CPU 403 sequentially writes the selected product number ddd to the corresponding basket B1.

When the user is finished selecting products, a predetermined signal is input by the user to the external unit 60, and the CPU 612 of the external unit 60 sends the selection complete signal to the server 400 via the fixed telecommunications network 500 and the Internet 300.

The CPU 403 of the server receives the selection complete signal, and records the purchase tag corresponding to the transmission user ID (the basket number B1+the product number ddd) in the RAM 405 (step S59). Moreover, the CPU 403 of the server 400 enciphers using the session key POkey1, adds to this enciphered purchase tag the IP address IPa of the external unit 60 as the destination, and the IP address IPb of the server 400 as the transmission source, and this data is sent to the external unit 60 via the fixed telecommunications network 500 and the Internet 300 (step S60).

The CPU 612 of the external unit 60 deciphers the received purchase tag with the secret key PSkey1, and records the decoded purchase tag in the RAM 614. (step S61). Also, once the product purchasing process is completed, the CPU 612 of the external unit 60 ends the communication (step S62).

Next, in order to transmit the personal information such as the credit card number and shipping address to the server 400, the user enters the personal information to the key input unit 616 of the external unit 60. (step S63). This personal information is information that would cause a great deal of trouble to the user if stolen.

The CPU 612 of the external unit 60 reads the purchase tag from the RAM 614, and sends this purchase tag to the wireless telecommunications unit 10, in accordance with a control program.

In accordance with a control program stored in the general-use memory 23, the microcontroller 22 of the wireless telecommunications unit 10 adds to the purchase tag the identification number IDb of the server 400 as the destination, and the identification number IDc of the wireless telecommunications unit 10, and this data is sent to the base station via the wireless telecommunications means 10a. Accordingly, the purchase tag is sent to the base station on the side of the server 400 via the mobile telecommunications network 200, and then sent from this base station to the first port 401 (server 400) (step S64).

When the CPU 403 of the server 400 receives the purchase tag, the authentication program stored in the program memory unit 406B is started. Based on this program, the CPU 403 performs authentication processing on the purchase tag received from the first port 401 (step S65).

Here, when the received purchase tag is not recorded in the RAM 405 (step S65; NO), the CPU 403 completes the processing (step S66).

On the other hand, when the received purchase tag is recorded in the RAM 405 (step S65; YES), the permission signal is sent by the CPU 403 to the wireless telecommunications unit 10 (external unit 60). A dial channel is established via the mobile telecommunications network 200 between the external unit 60 and the server 400 (step S67), and the telecommunications terminal 800 is connected to the server 400.

Next, the CPU 612 of the external unit 60 sends the personal information to the wireless telecommunications unit 10 in accordance with a control program.

In accordance with a control program stored in the general-use memory 23, the microcontroller 22 of the wireless telecommunications unit 10 adds to the personal information the identification number IDb of the server 400 as the destination, and the identification number IDc of the wireless telecommunications unit 10, and this data is sent to the base station via the wireless telecommunications means 10a. Accordingly, the personal information is sent to the base station on the side of the server 400 via the mobile telecommunications network 200, and then sent from this base station to the first port 401 (server 400) (step S68).

When the CPU 403 of the server 400 receives this personal information, billing processing is carried out (step S69). In this case, the credit card company is invoiced for the amount spent on the product ddd, and the product ddd is sent to the shipping address.

Also, when transmission of the personal information is finished, the CPU 612 of the external unit 60 sends a signal to terminate the channel connection to the server 400, and the channel is disconnected (step S70).

In this operational example, when product selection is carried out via the fixed telecommunications network 500 and the Internet 300, session keys are exchanged in advance over the highly secure mobile telecommunications network 200, and using these keys, communication was carried out via the fixed telecommunications network 500 and the Internet 300. Accordingly, thieves can be prevented from stealing personal information, and the confidentiality of personal information can be enhanced.

Moreover, in this operational example, since communication over the fixed telecommunications network 500 and the Internet 300 is enciphered by means of the session keys, thieves are prevented from stealing the purchase tags, making it possible to prevent the same product from being purchased twice. Furthermore, this system is particularly effective in an auction where one product is purchased.

Figure 55:
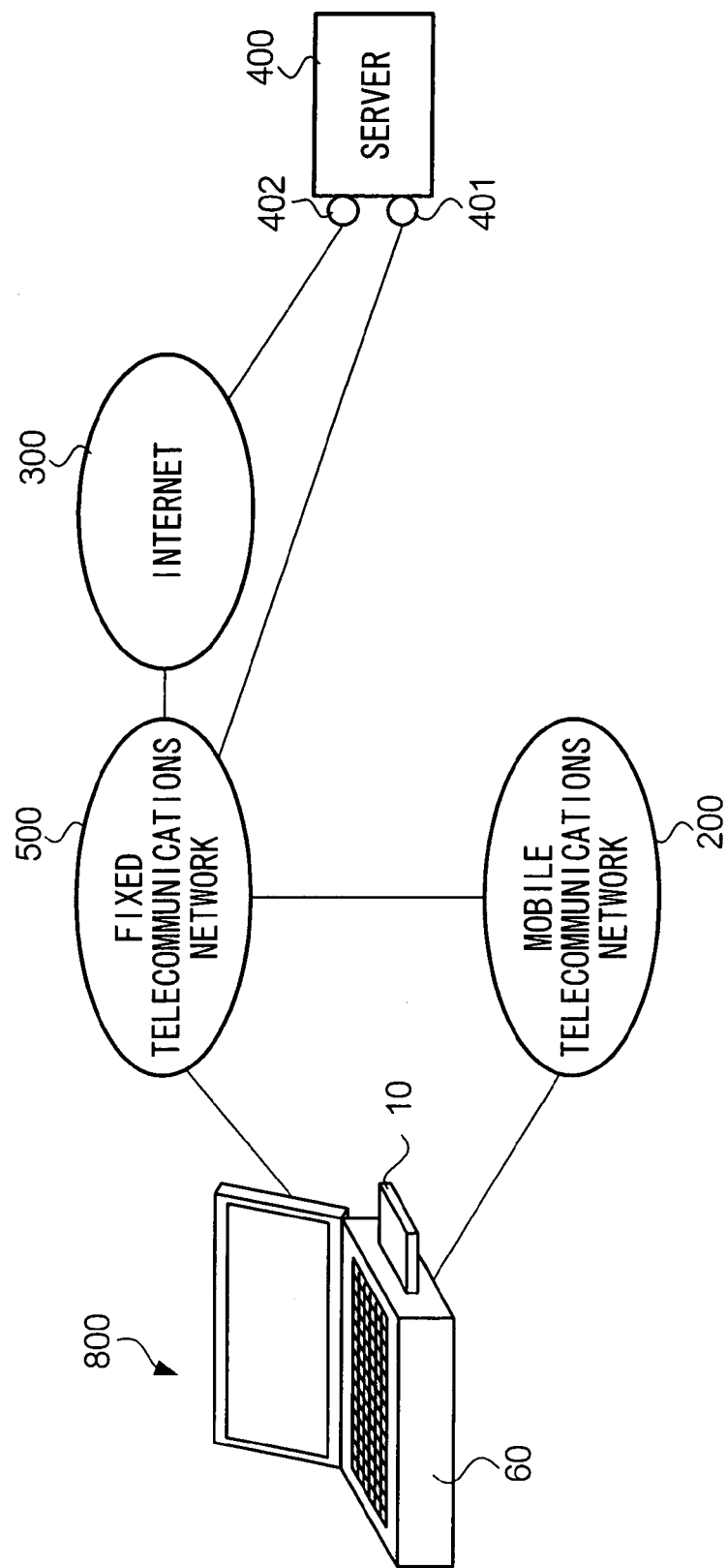
FIG. 55 is a diagram illustrating a variation on said telecommunications system.
Figure 56:
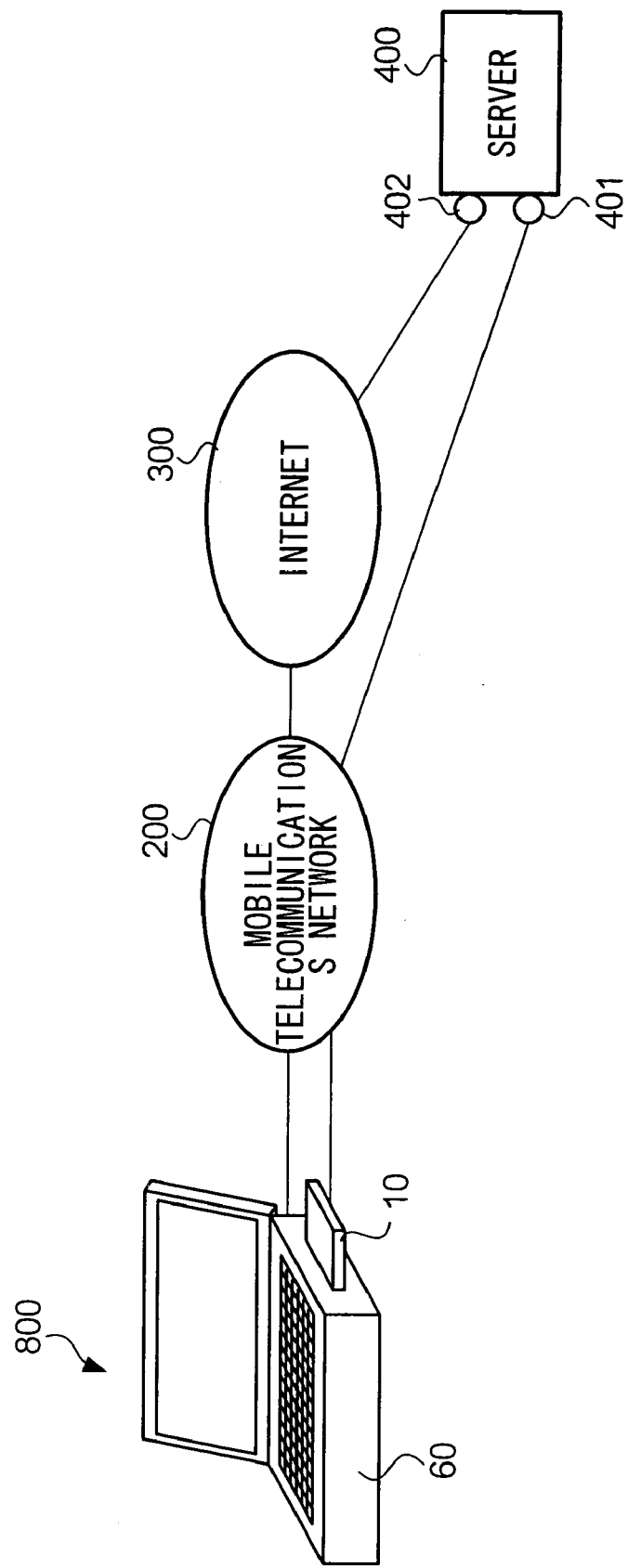
FIG. 56 is a diagram illustrating a variation on said telecommunications system.

G-5. Variations (1) As shown in FIG. 55, data telecommunications can be carried out that does not require confidentiality via the fixed telecommunications network 500 and the Internet 300, as well as data telecommunications that requires confidentiality. As shown in FIG. 56, data telecommunications can be carried out that does not require confidentiality via the fixed telecommunications network 500 and the Internet 300, as well as data telecommunications that requires confidentiality.

(2) Two or more session keys can be exchanged using a dial channel, and encoding can be carried out using these session keys.
(3) In the second or third operational examples, after the purchase tags are transmitted from the server 400 to the telecommunications terminal 800, communication was terminated between the fixed telecommunications network 500 and the Internet 300, but even after this termination, products can be added, deleted, or changed by transmitting the purchase tag from the telecommunications terminal 800 to the server 400 within a certain period of time. In this case, this processing can be carried out until the personal information is entered by the user, or this processing can also be carried out using a timer.
(4) Communication between the server and the telecommunications terminal can be carried out using a packet telecommunications system.

We claim:

1. A wireless telecommunications unit comprising:
   a wireless telecommunications means for wireless telecommunication with the outside, possessing an identification number for wireless telecommunications;
   a memory means; and
   a microcontroller to control said wireless telecommunications means and said memory means, said microcontroller comprising:
      a means for performing a control for an external unit to implement wireless telecommunications with the outside by said wireless telecommunications means when said microcontroller is connected to said external unit;
      a means for performing a control for said external unit to use said memory means as a file system of a specified operating system when said microcontroller is connected to said external unit;
      a means for performing a control for said wireless telecommunications means to carry out telecommunications using said memory means in accordance with instructions from said external unit or said microcontroller; and
      a processing means for executing data processing using data recorded in said memory means, and a delegation request means that requests at least a partial delegation of said data processing to said specified operating system of said external unit connected to said microcontroller.

2. The wireless telecommunications unit of claim 1, wherein said delegation request means requests at least a partial delegation of said data processing to said specified operating system of said external unit, only in cases where the data processing capacity of said external unit connected to said microcontroller is greater than a specified data processing capacity.

3. The wireless telecommunications unit of claim 1, wherein said delegation request means requests at least a partial delegation of said data processing to said specified operating system of said external unit, only in cases where the present data processing capacity of said external unit connected to said microcontroller is greater than a specified data processing capacity.

4. The wireless telecommunications unit of claim 1, wherein said delegation request means requests at least a partial delegation of said data processing to said specified operating system of said external unit, only in cases where the data processing to be executed by said data processing means is the specified data processing.

5. The wireless telecommunications unit of claim 1, wherein said delegation request means requests at least a partial delegation of said data processing to said specified operating system of said external unit, according to instructions contained in data used in data processing executed by said processing means.

6. The wireless telecommunications unit of claim 1, wherein said delegation request means requests at least a partial delegation of said data processing to said specified operating system of said external unit, only in cases where the present data processing capacity of said processing means is lower than a specified data processing capacity.

7. The wireless telecommunications unit of claim 1, wherein said delegation request means requests the delegation of processing in which all the data used is recorded in an area that can be accessed from said specified operating system, being processing that is at least a portion of said data processing, to said specified operating system of said external unit connected via said microcontroller.

8. The wireless telecommunications unit of claim 1, wherein said delegation request means determines the distribution ratio of processing based on the data processing capacity of said processing means and the load of data processing to be executed by said processing means, and requests the delegation of a load according to the distribution ratio in said data processing, to said specified operating system of said external unit connected via said microcontroller.

9. The wireless telecommunications unit of claim 1, wherein said delegation request means determines the distribution ratio of processing based on the data processing capacity of said processing means and the data processing means of said external unit connected via said microcontroller, and requests the delegation of a load according to the distribution ratio in said data processing, to said specified operating system of said external unit.

10. A wireless telecommunications unit comprising:
    a wireless telecommunications means for wireless telecommunication with the outside, possessing an identification number for wireless telecommunications;
    a memory means; and
    a microcontroller to control said wireless telecommunications means and said memory means, said microcontroller comprising:
       a means for performing a control for an external unit to implement wireless telecommunications with the outside by said wireless telecommunications means when said microcontroller is connected to said external unit;
       a means for performing a control for said external unit to use said memory means as a file system of a specified operating system when said microcontroller is connected to said external unit;
       a means for performing a control for said wireless telecommunications means to carry out telecommunications using said memory means in accordance with instructions from said external unit or said microcontroller; and
       a received data replay control means that controls the reception operation and the replay operation according to the type of received data and the connection status of said external unit, when data is received.

11. The wireless telecommunications unit of claim 10, wherein said received data replay control means writes the received data to said memory means when data is received and in cases where an external unit with received data replay functions is not connected to said microcontroller.

12. The wireless telecommunications unit of claim 10, wherein said microcontroller is provided with a conversion means for converting received data to data of another format.

13. The wireless telecommunications unit of claim 12, wherein said received data replay control means converts received data to alternative data in a format that is replayable by said external unit using said conversion means, when data has been received, and writing said alternative data instead of said received data to said memory means, in cases where an external unit connected to said microcontroller cannot replay the received data, and said conversion means can convert said received data to a format that is replayable by said external unit.

14. The wireless telecommunications unit of claim 12, wherein said received data replay control means converts said data to alternative data in a format that is replayable by said external unit using said conversion means, and writing said alternative data instead of said received data to said memory means, in cases where said external unit connected to said microcontroller cannot replay the received data and said conversion means can convert said data to a format that is replayable by said external unit, when replay of data in said memory means is directed.

15. The wireless telecommunications unit of claim 12, wherein there is provided a conversion announcement means that announces that conversion has been performed by said conversion means.

16. The wireless telecommunications unit of claim 12, wherein said received data replay control means sends to the telecommunications network a channel support request signal requesting support for the wireless telecommunications channel by the wireless telecommunications means for a specified period of time, in cases where an external unit possessing functions to replay received data is not connected to said microcontroller, and in the meantime, in cases where an external unit possessing functions to replay received data is connected to said microcontroller, said received data replay control means carries out automatic reception, and receives said data from said telecommunications network by said wireless telecommunications means, and supplies it to said external unit.

17. The wireless telecommunications unit of claim 12, wherein there is provided an announcement means for announcing the receipt of data, in cases where an external unit with the received data replay function is not connected to said microcontroller, when data is received.

18. The wireless telecommunications unit of claim 12, wherein said received data replay control means writes at least one of the following to a memory means: the transmission source of the received data, time of receipt, and the type of data, when an external unit with the received data replay function is not connected to said microcontroller, when data is received.

19. A wireless telecommunications unit comprising:
a wireless telecommunications means for wireless telecommunication with the outside, possessing an identification number for wireless telecommunications;
a memory means; and
a microcontroller to control said wireless telecommunications means and said memory means, said microcontroller comprising:
a means for performing a control for an external unit to implement wireless telecommunications with the outside by said wireless telecommunications means when said microcontroller is connected to said external unit;
a means for performing a control for said external unit to use said memory means as a file system of a specified operating system when said microcontroller is connected to said external unit;
a means for performing a control for said wireless telecommunications means to carry out telecommunications using said memory means in accordance with instructions from said external unit or said microcontroller; and
a short distance wireless telecommunications means for carrying out wireless telecommunications with another wireless telecommunications unit, and said microcontroller is provided with a relay control means for controlling the relay of data telecommunications between another wireless telecommunications unit and a remote station on the wide-area wireless telecommunications, using said wireless telecommunications means and said short distance wireless telecommunications means.

20. The wireless telecommunications unit of claim 19, wherein said relay control means broadcasts data relating to the telecommunications resources provided by said wireless telecommunications means, using said short distance wireless telecommunications means.

21. The wireless telecommunications unit of claim 19, provided with a short distance wireless telecommunications unit having said short distance wireless telecommunications means and a wide-area telecommunications unit having said wireless telecommunications means, and provided with at least a wide-area telecommunications unit, if not also a short distance wireless telecommunications unit the wide-area telecommunications unit and the short distance wireless telecommunications unit being attached to or detached from the housing of the wireless telecommunications unit.

22. A wireless telecommunications unit comprising:
a wireless telecommunications means for wireless telecommunication with the outside, possessing an identification number for wireless telecommunications;
a memory means, the said memory means possessing a general-use memory unit capable of reading or writing by said external unit, using an ordinary file access method, and a write-only area that can be written from said external unit side, using an ordinary file access method, and a registration area containing registered data that is the basis for user authentication and which is inaccessible from said external unit; and
a microcontroller to control said wireless telecommunications means and said memory means, said microcontroller comprising:
a means for performing a control for an external unit to implement wireless telecommunications with the outside by said wireless telecommunications means when said microcontroller is connected to said external unit;
a means for performing a control for said external unit to use said memory means as a file system of a specified operating system when said microcontroller is connected to said external unit;
a means for performing a control for said wireless telecommunications means to carry out telecommunications using said memory means in accordance with instructions from said external unit or said microcontroller; and
an authentication control mean so that when a user's input data is written to said write-only area from said external control unit, said input data and said registered data undergo authentication processing to determine whether or not they satisfy the predetermined relationship, said authentication control means allowing the access to said general-use memory unit from said external unit only in cases where they are determined to satisfy the predetermined relationship; and a log in detection means for detecting user log in to said external unit, wherein said authentication control means carries out authentication processing when user log in to said external unit is detected by said log in detection means and the user input data is written from the said external unit side to said write-only area.

23. The wireless telecommunications unit of claim 22, wherein said authentication control means permits writing only to said write-only area from said external unit when the user logs out with respect to said external unit.

24. The wireless telecommunications unit of claim 22, wherein said authentication control means, moreover, permits writing only to said write-only area from said external unit side, when it receives specific instructions from said external unit side, and user log in to said external unit is detected by said log in detection means.

* * * * *